(12) United States Patent
Wakita et al.

(10) Patent No.: US 11,487,981 B2
(45) Date of Patent: Nov. 1, 2022

(54) PACKING MATERIAL, METHOD FOR PRODUCING PACKING MATERIAL, READING DEVICE, STORED-ARTICLE MANAGEMENT SYSTEM, DISCONNECTION DETECTION DEVICE, UNSEALING DETECTION LABEL, AND UNSEALING DETECTION SYSTEM

(71) Applicant: TORAY INDUSTRIES, INC., Tokyo (JP)

(72) Inventors: Junji Wakita, Tokyo (JP); Seiichiro Murase, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 248 days.

(21) Appl. No.: 16/652,898

(22) PCT Filed: Sep. 27, 2018

(86) PCT No.: PCT/JP2018/035845
§ 371 (c)(1),
(2) Date: Apr. 1, 2020

(87) PCT Pub. No.: WO2019/069772
PCT Pub. Date: Apr. 11, 2019

(65) Prior Publication Data
US 2020/0293849 A1    Sep. 17, 2020

(30) Foreign Application Priority Data

Oct. 4, 2017   (JP) .............. JP2017-194595
Dec. 5, 2017   (JP) .............. JP2017-233836

(51) Int. Cl.
*G06K 19/07*     (2006.01)
*H01L 51/00*     (2006.01)
*H01L 51/05*     (2006.01)

(52) U.S. Cl.
CPC ...... *G06K 19/0723* (2013.01); *H01L 51/0048* (2013.01); *H01L 51/0545* (2013.01); *H01L 51/0558* (2013.01)

(58) Field of Classification Search
CPC .. G06K 19/0723; G06K 19/07; G06K 19/077; H01L 51/0048; H01L 51/0545;
(Continued)

(56) References Cited

U.S. PATENT DOCUMENTS 8,960,440 B1   2/2015   Kronberg
9,658,805 B2   5/2017   Otake et al.
(Continued)

FOREIGN PATENT DOCUMENTS

CN   1688946 A   10/2005
CN   1876509 A   12/2006
(Continued)

OTHER PUBLICATIONS

Chinese Office Action and Search Report for Chinese Application No. 201880063036.0, dated Oct. 27, 2021, with English translation of the Chinese Office Action.
(Continued)

*Primary Examiner* — Sonji N Johnson
(74) *Attorney, Agent, or Firm* — Birch, Stewart, Kolasch & Birch, LLP

(57) ABSTRACT

A package in an aspect of the present invention includes: a package body having a receiving cavity for receiving a cavity item; a sheet for sealing the receiving cavity; a conducting wire formed on the sheet so as to pass above the sealed opening portion of the receiving cavity; and a wireless communication device formed on the sheet so as to be connected to the conducting wire. The wireless communication device transmits a signal including information which differs between before and after the conducting wire
(Continued)

together with the sheet is cut as a result of opening the receiving cavity. The information transmitted from the wireless communication device is read by a reader. The package and the reader are used for a cavity item management system.

15 Claims, 44 Drawing Sheets

(58) Field of Classification Search
CPC ... H01L 51/0558; A61J 2200/30; A61J 1/035; A61J 7/04; A61J 1/03; A61J 7/0418; A61J 7/0427; A61J 2205/60; B65D 2203/10; B65D 75/327; B65D 65/38; B65D 77/20; B65D 79/02
See application file for complete search history.

(56) References Cited

U.S. PATENT DOCUMENTS

| | | | |
|---|---|---|---|
| 9,741,222 B1 | 8/2017 | Scharfeld et al. | |
| 10,896,301 B2* | 1/2021 | Forster | A61J 1/035 |
| 2002/0017996 A1 | 2/2002 | Niemiec | |
| 2003/0063524 A1 | 4/2003 | Niemiec et al. | |
| 2006/0283748 A1 | 12/2006 | Daio et al. | |
| 2007/0084746 A1 | 4/2007 | Udo et al. | |
| 2008/0002454 A1 | 1/2008 | Inoue et al. | |
| 2008/0061986 A1 | 3/2008 | Ficker et al. | |
| 2009/0237217 A1 | 9/2009 | Ohkubo | |
| 2009/0294521 A1* | 12/2009 | de la Huerga | A61J 1/035 235/375 |
| 2010/0066509 A1* | 3/2010 | Okuizumi | A61J 1/035 340/10.5 |
| 2011/0121273 A1 | 5/2011 | Jo et al. | |
| 2011/0134680 A1 | 6/2011 | Saito | |
| 2014/0288942 A1 | 9/2014 | Blochet | |
| 2016/0137380 A1 | 5/2016 | Kosaka | |
| 2016/0148084 A1 | 5/2016 | Okamoto et al. | |
| 2018/0197065 A1 | 7/2018 | Yamaoka et al. | |

FOREIGN PATENT DOCUMENTS

| | | | | |
|---|---|---|---|---|
| CN | 101052975 A | 10/2007 | | |
| CN | 101537903 A | 9/2009 | | |
| CN | 102027612 A | 4/2011 | | |
| CN | 106503778 A | 3/2017 | | |
| EP | 1737750 B1 | 10/2007 | | |
| EP | 3 009 967 A1 | 4/2016 | | |
| JP | 9-34365 A | 2/1997 | | |
| JP | 2004-266272 A | 9/2004 | | |
| JP | 2005-539300 A | 12/2005 | | |
| JP | 2006-308776 A | 11/2006 | | |
| JP | 3128634 U | 1/2007 | | |
| JP | 2007-250709 A | 9/2007 | | |
| JP | 2008-34083 A | 2/2008 | | |
| JP | 2010-35789 A | 2/2010 | | |
| JP | 2010-75227 A | 4/2010 | | |
| JP | 4920218 B2 | 4/2012 | | |
| JP | 2014-176597 A | 9/2014 | | |
| JP | 2017-78984 A | 4/2017 | | |
| TW | I410872 B | 10/2013 | | |
| WO | WO 2005/072676 A1 | 8/2005 | | |
| WO | WO-2011161299 A1 * | 12/2011 | ............ | B65D 25/00 |
| WO | WO 2012/103564 A1 | 8/2012 | | |
| WO | WO 2015/008528 A1 | 1/2015 | | |

OTHER PUBLICATIONS

Extended European Search Report, dated Oct. 12, 2020, for European Application No. 18864565.9.
International Search Report, issued in PCT/JP2018/035845, PCT/ISA/210, dated Nov. 27, 2018.
Written Opinion of the International Searching Authority, issued in PCT/JP2018/035845, PCT/ISA/237, dated Nov. 27, 2018.
Chinese Office Action and Search Report for Chinese Application No. 201880063036.0, dated May 21, 2021, with English translation of the Office Action.
Chinese Notice of Allowance and Search Report for Chinese Application No. 201880063036.0, dated Mar. 9, 2022, with English translation.
Taiwanese Office Action and Search Report for Taiwanese Application No. 107134653, dated Mar. 3, 2022, with English translation.

* cited by examiner

Fig. 33

PACKING MATERIAL, METHOD FOR PRODUCING PACKING MATERIAL, READING DEVICE, STORED-ARTICLE MANAGEMENT SYSTEM, DISCONNECTION DETECTION DEVICE, UNSEALING DETECTION LABEL, AND UNSEALING DETECTION SYSTEM

TECHNICAL FIELD

The present invention relates to packages, methods of producing a package, readers, cavity item management systems, sense-of-disconnection devices, sense-of-opening labels, and sense-of-opening systems.

BACKGROUND ART

Mechanisms proposed in recent years are: ones for sensing that an item is taken out of a cavity of a package such as a blister pack or a PTP (Press Through Package); and ones for sensing that a bottle, a bag, or the like is opened. It is hoped that these mechanisms are used, for example, for: supervised administration devices for collecting information on whether a patient has taken a prescribed pharmaceutical in a suitable amount at a suitable time; and sense-of-opening labels that make it possible to check whether a container containing an item such as an expensive liquor or a pharmaceutical is opened.

For example, Patent Literature 1 to 3 proposes a technique in which wires are each attached separately to a receiving cavity for receiving a cavity item, and sensing a wire disconnection caused by taking a cavity item out of the receiving cavity results in sensing the opening of the receiving cavity. In addition, Patent Literature 4 proposes a technique in which the opening of a receiving cavity is sensed by varying the subcarrier frequency of an RFID (Radio Frequency Identification) tag at each time of wire disconnection caused by the opening of the receiving cavity. Furthermore, Patent Literature 5 and 6 proposes a technique in which RFID circuits are each attached separately to a receiving cavity, and an RFID circuit breaking caused by taking a cavity item out of the receiving cavity results in sensing the opening of the receiving cavity. In addition, Patent Literature 7 proposes a sense-of-opening label with an RFID tag used therein.

CITATION LIST

Patent Literature

Patent Literature 1: JP2005-539300A
Patent Literature 2: JP2014-176597A
Patent Literature 3: WO2015/008528
Patent Literature 4: JP2010-75227A
Patent Literature 5: JP2010-035789A
Patent Literature 6: JP3128634U
Patent Literature 7: JP2017-078984A

SUMMARY OF INVENTION

Technical Problem

However, the techniques disclosed in Patent Literature 1 to 4 adopt a configuration in which the opening of a receiving cavity is sensed on the basis of information from a wireless communication device such as one RFID tag provided in a package, and if the receiving cavities are individually separated, connection is lost between this wireless communication device and the wire for each receiving cavity. This makes it difficult to sense the opening of each receiving cavity. In particular, if a package is one for packaging a pharmaceutical such as a tablet, such a package is often separated into individual pharmaceutical receiving cavities, which are carried easily. Thus, there is an increasing demand for improvement of the above-mentioned problem. Furthermore, a larger number of receiving cavities in a package require a larger number of wires in the package. A larger number of wires in a package require each wire to be made thinner, and thus, are more likely to cause the wire to be disconnected by manipulating (handling) the package, such as bending the package, except for taking a cavity item out of the package. This results in increasing the possibility that the wire is unintentionally disconnected except when a cavity item is taken out of the package, and thus, there is a problem in that reliability is decreased in sensing that a cavity item is taken out of a package. In addition, the techniques disclosed in Patent Literature 1 to 3 require that a package has a wireless communication device attached thereto, and accordingly increase the cost, making it difficult for the package to be employed as a disposable article. Thus, there is also an increasing demand for cost reduction.

In addition, the techniques disclosed in Patent Literature 5 to 6 adopt a configuration in which a breaking in an RFID circuit provided in each receiving cavity results in sensing the opening of the receiving cavity corresponding to the RFID circuit which no longer responses. However, these techniques pose the possibility of wrongly recognizing the open state of the receiving cavity, in cases where an RFID circuit is broken through handling a package except taking out a cavity item, or in cases where an RFID circuit has failed, even when the cavity item is not taken out of the receiving cavity.

In addition, the technique disclosed in Patent Literature 7 involves use of an RFID having a conventional IC chip used therein, and accordingly increases the cost, making it difficult for the package to be employed as a disposable item. Thus, there is also an increasing demand for cost reduction. Furthermore, Patent Literature 7 describes no sense-of-opening method, and has no clear details on, for example, whether any communication can be carried out after the opening.

The present invention has been made in view of the above-mentioned situation. A first object of the present invention is to provide a package which achieves enhanced reliability in sensing that a cavity item is taken out of a receiving cavity, and which can sense the opening of a receiving cavity even though the receiving cavities are individually separated. A second object is to provide a package production method, a reader, and a cavity item management system which achieve enhanced reliability in sensing the takeout of a cavity item as above-mentioned and which can sense the opening of a receiving cavity even though a package is separated into individual receiving cavities. A third object is to provide an inexpensive package with a sense-of-opening sensor. A fourth object is to provide an inexpensive sense-of-opening label.

Solution to Problem

The present inventors have reached the present invention through the discovery that the above-mentioned problems can be solved by transmitting a signal from a wireless communication device provided in each of the receiving cavities of a package, wherein the signal differs according to whether the receiving cavity is opened.

That is, to solve the above-mentioned problems and achieve the objects, a package according to the present invention is characterized by including: a package body having a receiving cavity for receiving a cavity item; a sheet sealing the receiving cavity; a conducting wire formed on the sheet so as to pass above an opening portion of the receiving cavity, the opening portion being sealed; and a wireless communication device formed on the sheet so as to be connected to the conducting wire, wherein the wireless communication device transmits a signal including information which differs between before and after the conducting wire together with the sheet is cut as a result of opening the receiving cavity.

In addition, the package according to the present invention is characterized in that, in the above-mentioned invention, the package body has a plurality of the receiving cavities, wherein the conducting wire is formed on the sheet so as to correspond to each of the plurality of the receiving cavities, and wherein at least one the wireless communication device is formed on the sheet.

In addition, the package according to the present invention is characterized in that, in the above-mentioned invention, the package body has a plurality of the receiving cavities, wherein the conducting wires and the wireless communication devices are each formed on the sheet so as to correspond to each of the plurality of the receiving cavities.

In addition, the package according to the present invention is characterized in that, in the above-mentioned invention, the wireless communication device has a memorizing method, wherein the memorizing method has at least one memory element, wherein the conducting wire is connected to the memory element, and wherein the information is read out of the memory element in such a manner that the information differs between before and after the conducting wire is cut.

In addition, the package according to the present invention is characterized in that, in the above-mentioned invention, the wireless communication device has a memorizing method, wherein the memorizing method has a memory array formed by arranging a plurality of memory elements, wherein the conducting wire is connected to at least one of the plurality of memory elements, and wherein the information is read out of the memory array in such a manner that the information differs between before and after the conducting wire is cut.

In addition, the package according to the present invention is characterized in that, in the above-mentioned invention, the memory array has: a plurality of first wires; at least one second wire intersecting the plurality of first wires; and the plurality of memory elements which are each provided so as to correspond to each of the intersections between the plurality of first wires and the at least one second wire and which each have: a first electrode and a second electrode which are spaced from each other; a third electrode connected to one of the at least one second wire; and an insulating layer electrically insulating the first electrode and the second electrode from the third electrode, wherein one of the first electrode and the second electrode is connected to one of the plurality of first wires; wherein at least one of the plurality of memory elements has a semiconductor layer in a region between the first electrode and the second electrode; wherein the plurality of memory elements are composed of memory elements of two different kinds having different inter-electrode electrical characteristics of the first electrode and the second electrode; and wherein information recorded in the memory array is determined by an arrangement obtained by arbitrary combination of the memory elements of two kinds.

In addition, the package according to the present invention is characterized in that, in the above-mentioned invention, the memory element(s) of one kind, of the memory elements of two kinds, has/have the semiconductor layer, and the memory element(s) of the other kind does/do not have the semiconductor layer; and wherein the memory element(s) of one kind and the memory element(s) of the other kind each record information which differs between each other according to whether the memory elements of two kinds each have the semiconductor layer.

In addition, the package according to the present invention is characterized in that, in the above-mentioned invention, the semiconductor layer contains one or more selected from the group consisting of carbon nanotubes, graphene, and fullerene.

In addition, the package according to the present invention is characterized in that, in the above-mentioned invention, the semiconductor layer contains a carbon nanotube composite in which a conjugated polymer is adhered to at least a part of the surface of a carbon nanotube.

In addition, the package according to the present invention is characterized in that, in the above-mentioned invention, the memory array in each of a plurality of the wireless communication devices records information which differs between/among the plurality of the receiving cavities.

In addition, the package according to the present invention is characterized in that, in the above-mentioned invention, the conducting wire includes a bit line connected to at least one the memory element.

In addition, the package according to the present invention is characterized in that, in the above-mentioned invention, the wireless communication device has a memorizing method, wherein the memorizing method has at least one flip flop circuit, and wherein the conducting wire is connected to the flip flop circuit.

In addition, the package according to the present invention is characterized in that, in the above-mentioned invention, the flip flop circuit includes a transistor having a semiconductor layer, wherein the semiconductor layer contains a carbon nanotube composite in which a conjugated polymer is adhered to at least a part of the surface of a carbon nanotube.

In addition, the package according to the present invention is characterized in that, in the above-mentioned invention, the wireless communication device has a modulation circuit, wherein the conducting wire is connected to the modulation circuit, and wherein the signal including information is modulated by the modulation circuit in such a manner that the information differs between before and after the conducting wire is cut.

In addition, the package according to the present invention is characterized in that, in the above-mentioned invention, the modulation circuit includes: a switch circuit, and a plurality of resistance elements connected to the switch circuit, wherein the conducting wire is connected to at least one of the plurality of resistance elements.

In addition, the package according to the present invention is characterized in that, in the above-mentioned invention, the switch circuit includes a transistor having a semiconductor layer, wherein the semiconductor layer contains a carbon nanotube composite in which a conjugated polymer is adhered to at least a part of the surface of a carbon nanotube.

In addition, the package according to the present invention is characterized in that, in the above-mentioned invention, the cavity item is a pharmaceutical.

In addition, a method of producing a package according to the present invention is characterized by being a method of producing a package having: a package body having at least one receiving cavity for receiving a cavity item; and a sheet sealing the at least one receiving cavity; the method including: a functional portion formation step wherein a conductive wire and at least one wireless communication device are formed on a substrate constituting the sheet, wherein the conducting wire passes above an opening portion of the receiving cavity, the opening portion being sealed, and wherein the wireless communication device is connected to the conducting wire and transmits a signal including information which differs between before and after the conducting wire together with the sheet is cut as a result of opening the receiving cavity; and an adhering step wherein the sheet is adhered to the package body in such a manner that the receiving cavity of the package body is sealed by the adhered sheet, wherein the package body has the cavity item received in the receiving cavity, and wherein the sheet has at least one the conducting wire and the at least one wireless communication device formed on the substrate.

In addition, the method of producing a package according to the present invention is characterized in that, in the above-mentioned invention, the wireless communication device has a memorizing method, wherein, in the functional portion formation step, at least one of the constituents of the memorizing method is formed by a coating method.

In addition, the method of producing a package according to the present invention is characterized in that, in the above-mentioned invention, the wireless communication device has a memory array including, on the substrate, a plurality of first wires, at least one second wire intersecting the plurality of first wires, and a plurality of memory elements which are each provided to correspond to each of the intersections between the plurality of first wires and the at least one second wire; wherein the plurality of memory elements each have: a first electrode and a second electrode which are spaced from each other; a third electrode connected to one of the at least one second wire; and an insulating layer electrically insulating the first electrode and the second electrode from the third electrode; wherein, in the functional portion formation step, a coating layer is formed, by a coating method, in a region between the first electrode and the second electrode in at least one of the plurality of memory elements, and the memory arrays having recorded information which differs between/among the plurality of the receiving cavities are each produced for each of the plurality of the wireless communication devices; and wherein the coating method is one selected from the group consisting of an inkjet method, a dispenser method, and a spray method.

In addition, a reader according to the present invention is characterized by including: an antenna unit for receiving information transmitted by the wireless communication device included in the package according to any one of the above-mentioned inventions; and a sensing unit for sensing whether the receiving cavity for receiving a cavity item in the package is opened; wherein the antenna unit receives the information from the wireless communication device, the information differing between before and after the receiving cavity is opened, and wherein the sensing unit senses whether the receiving cavity is opened, in accordance with a difference in the information received by the antenna unit.

In addition, a cavity item management system according to the present invention is characterized by including: the package according to any one of the above-mentioned inventions; a reader for receiving information which is transmitted by the wireless communication device included in the package and which differs between before and after the receiving cavity for receiving a cavity item in the package is opened, wherein the reader reads and senses whether the receiving cavity is opened, in accordance with a difference in the received information; a management device communicably connected to the reader via a line; and a terminal device communicably connected to the management device via a line; wherein the management device receives, from the reader, the sensed information sensed by the reader and indicating whether the receiving cavity is opened, and notifies the terminal device of the received sensed information.

In addition, the cavity item management system according to the present invention is characterized in that, in the above-mentioned invention, the wireless communication device has a memorizing method; and wherein the difference in the information is made by a variation in information read out of the memorizing method, the variation being caused between before and after the receiving cavity is opened.

In addition, the cavity item management system according to the present invention is characterized in that, in the above-mentioned invention, the difference in the information is made by a difference in the degree of modulation of a signal transmitted by the wireless communication device, the difference being caused between before and after the receiving cavity is opened.

In addition, a sense-of-disconnection device according to the present invention is characterized by including: a conducting wire formed on a substrate: and a wireless communication device formed on the substrate so as to be connected to the conducting wire, wherein the wireless communication device transmits a signal including information which differs between before and after the conducting wire is cut; wherein the wireless communication device has a memorizing method; wherein the memorizing method has at least one memory element; wherein the conducting wire is connected to the memory element; and wherein the information is read out of the memory element in such a manner that the information differs between before and after the conducting wire is cut.

In addition, a sense-of-disconnection device according to the present invention is characterized by including: a conducting wire formed on a substrate: and a wireless communication device formed on the substrate so as to be connected to the conducting wire, wherein the wireless communication device transmits a signal including information which differs between before and after the conducting wire is cut; wherein the wireless communication device has a memorizing method; wherein the memorizing method has at least one flip flop circuit; and wherein the conducting wire is connected to the flip flop circuit; and wherein the information is read out of the flip flop circuit in such a manner that the information differs between before and after the conducting wire is cut.

In addition, the sense-of-disconnection device according to the present invention is characterized by including: a conducting wire formed on a substrate: and a wireless communication device formed on the substrate so as to be connected to the conducting wire, wherein the wireless communication device transmits a signal including information which differs between before and after the conducting wire is cut; wherein the wireless communication device has a modulation circuit; wherein the conducting wire is connected to the modulation circuit; and wherein the signal including the information is modulated by the modulation circuit in such a manner that the information differs between before and after the conducting wire is cut.

In addition, a sense-of-opening label according to the present invention is characterized by including a sense-of-disconnection device having: a conducting wire formed on the substrate; and a wireless communication device formed on the substrate so as to be connected to the conducting wire, wherein the wireless communication device transmits a signal including information which differs between before and after the conducting wire is cut; wherein the sense-of-disconnection device is configured to be attached to an openable article; and wherein the conducting wire together with the substrate is cut as a result of opening the openable article.

In addition, the sense-of-opening label according to the present invention is characterized in that, in the above-mentioned invention, the wireless communication device has a memorizing method; wherein the memorizing method has at least one memory element; wherein the conducting wire is connected to the memory element; and wherein the information is read out of the memory element in such a manner that the information differs between before and after the conducting wire is cut.

In addition, the sense-of-opening label according to the present invention is characterized in that, in the above-mentioned invention, the wireless communication device has a memorizing method; wherein the memorizing method has at least one flip flop circuit; wherein the conducting wire is connected to the flip flop circuit; and wherein the information is read out of the flip flop circuit in such a manner that the information differs between before and after the conducting wire is cut.

In addition, the sense-of-opening label according to the present invention is characterized in that, in the above-mentioned invention, the wireless communication device has a modulation circuit; wherein the conducting wire is connected to the modulation circuit; and wherein the signal including the information is modulated by the modulation circuit in such a manner that the information differs between before and after the conducting wire is cut.

In addition, a sense-of-opening system according to the present invention is characterized by including: the sense-of-opening label according to the above-mentioned invention; a reader for receiving information which is transmitted by the wireless communication device included in the sense-of-opening label and which differs between before and after an openable article is opened, wherein the reader reads and senses whether the openable article is opened, in accordance with a difference in the received information; a management device communicably connected to the reader via a line; and a terminal device communicably connected to the management device via a line; wherein the management device receives, from the reader, the sensed information sensed by the reader and indicating whether the openable article is opened, and notifies the terminal device of the received sensed information.

Advantageous Effects of Invention

The present invention achieves the effect of making it possible to enhance reliability in sensing that a cavity item is taken out of a receiving cavity, and to sense the opening of the receiving cavity even though the package is separated into individual receiving cavities.

BRIEF DESCRIPTION OF DRAWINGS

FIG. 33 is a view depicting a specific example of a reader of a sense-of-opening system according to an embodiment of the present invention.

DESCRIPTION OF EMBODIMENTS

Figure 1A:
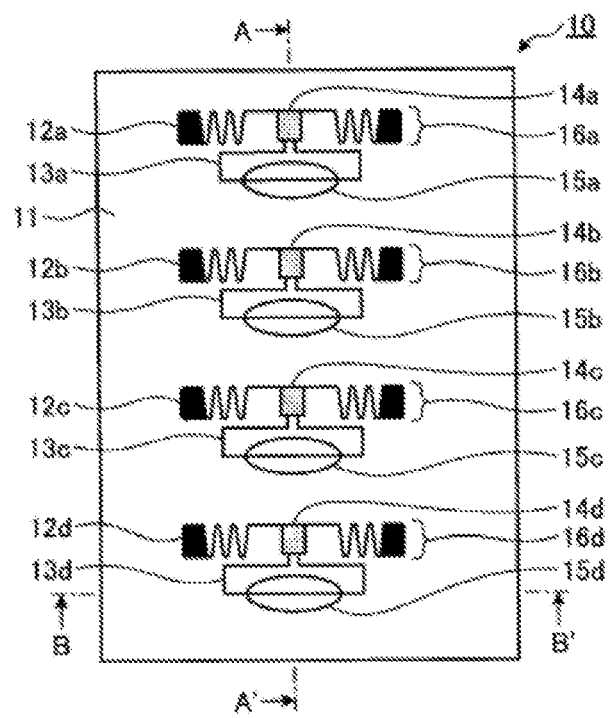
FIG. 1A is a top view depicting a configuration example of a package according to a first embodiment of the present invention.

Below, preferred embodiments of packages, methods of producing a package, readers, cavity item management systems, sense-of-disconnection devices, sense-of-opening labels, and sense-of-opening systems according to the present invention will be described with reference to the drawings. However, any person skilled in the art will easily understand that the present invention can be carried out in many different forms (for example, in the circuit configuration), and that the forms and details of the invention can be varied without departing from the spirit and scope of the present invention. Accordingly, the present invention should not be construed as limited to the description of the present embodiments. It should be noted that the same reference sign is employed for the same or corresponding constituents in the drawings.

First Embodiment (Configuration of Package)

Figure 1B:
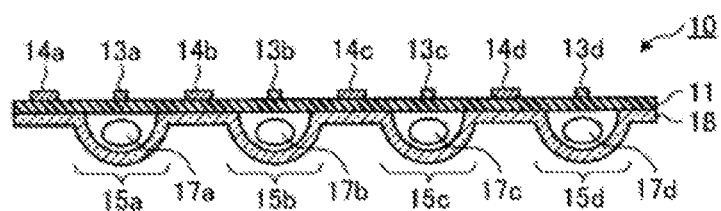
FIG. 1B is a cross-sectional view taken along line A-A' in the view of the package depicted in FIG. 1A.
Figure 1C:
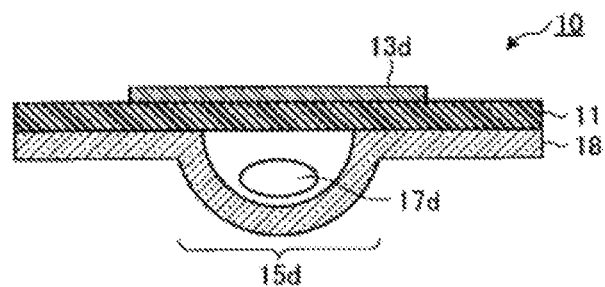
FIG. 1C is a cross-sectional view taken along line B-B' in the view of the package depicted in FIG. 1A.

FIGS. 1A to 1C are views describing a configuration of a package according to a first embodiment of the present invention. FIG. 1A is a top view depicting a configuration example of this package according to the first embodiment. FIG. 1B is a cross-sectional view taken along line A-A' in the view of the package depicted in FIG. 1A. FIG. 1C is a cross-sectional view taken along line B-B' in the view of the package depicted in FIG. 1A.

As depicted in FIGS. 1A to 1C, this package 10 includes a package body 18 and a sheet 11. The package body 18 has a plurality of receiving cavities, for example, four receiving cavities 15a to 15d, as depicted in FIG. 1B. In the package body 18, the receiving cavities 15a to 15d are each a portion for receiving a cavity item. For example, as depicted in FIG. 1B, the receiving cavity 15a has a cavity item 17a received therein, the receiving cavity 15b has a cavity item 17b received therein, the receiving cavity 15c has a cavity item 17c received therein, and the receiving cavity 15d has a cavity item 17d received therein. The sheet 11 seals the opening portions of these receiving cavities 15a to 15d.

In addition, the package 10 includes a plurality of connecting lines (for example, four connecting lines 13a to 13d depicted in FIGS. 1A and 1B) and a plurality of wireless communication devices (for example, four wireless communication devices 16a to 16d depicted in FIG. 1A). Each of the plurality of connecting lines and each of the plurality of wireless communication devices are formed on the sheet 11 so as to correspond to each of the plurality of receiving cavities 15a to 15d. Specifically, as depicted in FIGS. 1A and 1B, the connecting line 13a is a conducting wire corresponding to the receiving cavity 15a and is formed on the sheet 11 so as to pass above the sealed opening portion of the receiving cavity 15a having the cavity item 17a received therein. The connecting line 13b is a conducting wire corresponding to the receiving cavity 15b and is formed on the sheet 11 so as to pass above the sealed opening portion of the receiving cavity 15b having the cavity item 17b received therein. The connecting line 13c is a conducting wire corresponding to the receiving cavity 15c and is formed on the sheet 11 so as to pass above the sealed opening portion of the receiving cavity 15c having the cavity item 17c received therein. The connecting line 13d is a conducting wire corresponding to the receiving cavity 15d and is formed on the sheet 11 so as to pass above the sealed opening portion of the receiving cavity 15d having the cavity item 17d received therein.

As depicted in FIG. 1A, the wireless communication device 16a corresponds to the receiving cavity 15a, and is formed on the sheet 11 so as to be connected to the connecting line 13a. Specifically, the wireless communication device 16a includes at least an antenna 12a for wireless communication and a circuit unit 14a having a function of wireless communication or the like. The connecting line 13a is, for example, connected to the circuit unit 14a so as to form a loop pattern, extending from the circuit 14a and passing so as to traverse above the receiving cavity 15a. The wireless communication device 16a transmits information (a signal including the information) that differs between before and after the connecting line 13a together with the sheet 11 is cut as a result of opening the receiving cavity 15a.

As depicted in FIG. 1A, the wireless communication device 16b corresponds to the receiving cavity 15b, and is formed on the sheet 11 so as to be connected to the connecting line 13b. As with the above-mentioned wireless communication device 16a, the wireless communication device 16b includes at least an antenna 12b and a circuit unit 14b. To this circuit unit 14b, for example, the connecting line 13b is connected, wherein the connecting line 13b forms a loop pattern, passing so as to traverse above the receiving cavity 15b. The wireless communication device 16b transmits information (a signal including the information) that differs between before and after the connecting line 13b together with the sheet 11 is cut as a result of opening the receiving cavity 15b.

As depicted in FIG. 1A, the wireless communication device 16c corresponds to the receiving cavity 15c, and is formed on the sheet 11 so as to be connected to the connecting line 13c. As with the above-mentioned wireless communication devices 16a and 16b, the wireless communication device 16c includes at least an antenna 12c and a circuit unit 14c. To this circuit unit 14c, for example, the connecting line 13c is connected, wherein the connecting line 13c forms a loop pattern, passing so as to traverse above the receiving cavity 15c. The wireless communication device 16c transmits information (a signal including the information) that differs between before and after the connecting line 13c together with the sheet 11 is cut as a result of opening the receiving cavity 15c.

As depicted in FIG. 1A, the wireless communication device 16d corresponds to the receiving cavity 15d, and is formed on the sheet 11 so as to be connected to the connecting line 13d. As with the above-mentioned wireless communication devices 16a to 16c, the wireless communication device 16d includes at least an antenna 12d and a circuit unit 14d. To this circuit unit 14d, for example, the connecting line 13d is connected, wherein the connecting line 13d forms a loop pattern, passing so as to traverse above the receiving cavity 15d. The wireless communication device 16d transmits information (a signal including the information) that differs between before and after the connecting line 13d together with the sheet 11 is cut as a result of opening the receiving cavity 15d.

Below, the receiving cavities 15a to 15d are suitably referred to collectively as "the receiving cavity 15". The receiving cavity 15 means all or any of the receiving cavities 15a to 15d. Similarly, the cavity items 17a to 17d are suitably referred to collectively as "the cavity item 17". The cavity item 17 means all or any of the cavity items 17a to 17d. The connecting lines 13a to 13d are suitably referred to collectively as "the connecting line 13". The connecting line 13 means all or any of the connecting lines 13a to 13d. The wireless communication devices 16a to 16d are suitably referred to collectively as "the wireless communication device 16". The wireless communication device 16 means all or any of the wireless communication devices 16a to 16d. The antennas 12a to 12d are suitably referred to collectively as "the antenna 12". The antenna 12 means all or any of the antennas 12a to 12d. The circuit units 14a to 14d are suitably referred to collectively as "the circuit unit 14". The circuit unit 14 means all or any of the circuit units 14a to 14d.

In this regard, FIGS. 1A and 1B illustrate the package 10 having four receiving cavities 15, but the number of receiving cavities 15 included in the package 10 is not limited to four as above-mentioned, but may be one or more. In addition, the number of cavity items 17 to be received in the receiving cavities 15 of the package 10 is not limited to four as above-mentioned, but may be one or more per receiving cavity 15. For example, a plurality of cavity items 17 may be received in one receiving cavity 15. In addition, the number of connecting lines 13 and the number of wireless communication devices 16 provided for each receiving cavity 15 and disposed on the sheet 11 are each not limited to four as mentioned, but may be one or more per receiving cavity 15. For example, a plurality of connecting lines 13 may be formed per receiving cavity 15.

Figure 2A:
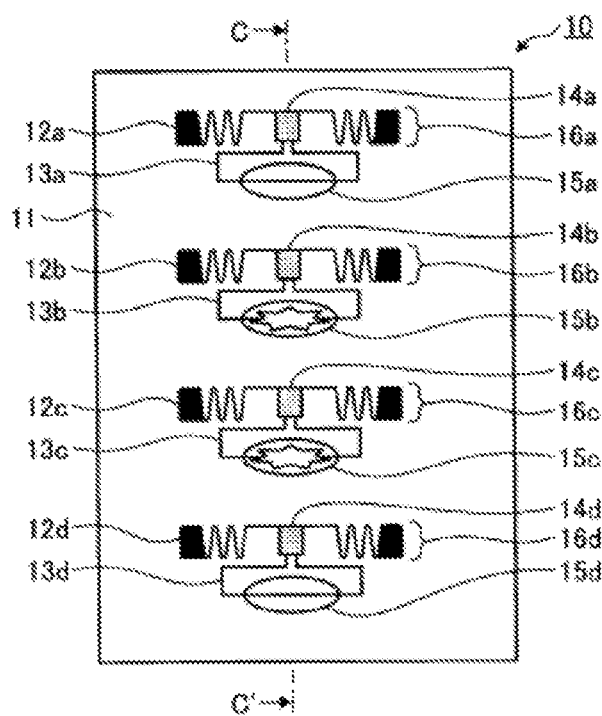
FIG. 2A is a view depicting a specific example of the package according to the first embodiment of the present invention, wherein, in the specific example, cavity items have been taken out of receiving cavities.
Figure 2B:
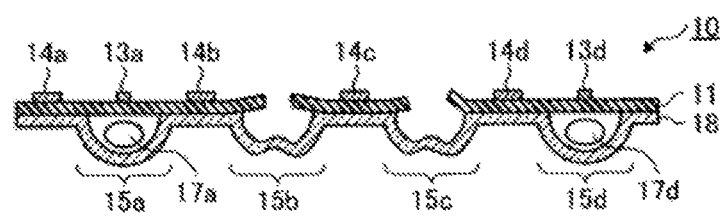
FIG. 2B is a cross-sectional view taken along line C-C' in the view of the package depicted in FIG. 2A.

FIG. 2A is a view depicting a specific example of the package 10 according to an embodiment of the present invention, wherein, in the specific example, the cavity item 17 has been taken out of the receiving cavity 15. FIG. 2B is a cross-sectional view taken along line C-C' in the view of the package depicted in FIG. 2A. As a specific example of the package 10 in which the cavity item 17 has been taken out of the receiving cavity 15, FIGS. 2A and 2B illustrate the package 10 in a state where the cavity items 17b and 17c have been taken out of the receiving cavities 15b and 15c respectively.

As depicted in FIGS. 2A and 2B, in cases where the cavity items 17b and 17c (see FIG. 1B) are taken out of the receiving cavities 15b and 15c of the package 10, those portions of the sheet 11 which seal the opening portions of these receiving cavities 15b and 15c are broken, and the receiving cavities 15b and 15c are each opened. As a result of this, the connecting lines 13b and 13c are cut together with the corresponding breakage portions of this sheet 11.

Here, in cases where the connecting line 13b remains to be cut (see FIG. 1A), the wireless communication device 16b operates in such a manner that a wireless signal including information previously recorded in the circuit unit 14b is transmitted from the antenna 12b in response to a request signal from an external device (not shown). On the other hand, in cases where the connecting line 13b is already cut as above-mentioned, the wireless communication device 16b operates in such a manner that a wireless signal including information different from the information that was transmitted before the connecting line 13b was cut is transmitted from the antenna 12b in response to a request signal from an external device. In cases where the connecting line 13c remains to be cut (see FIG. 1A), the wireless communication device 16c operates, independent of the operation of this wireless communication device 16b, in such a manner that a wireless signal including information previously recorded in the circuit unit 14c is transmitted from the antenna 12c in response to a request signal from an external device. On the other hand, in cases where the connecting line 13c is already cut as above-mentioned, the wireless communication device 16c operates in such a manner that a wireless signal including information different from the information that was transmitted before the connecting line 13c was cut is transmitted from the antenna 12c in response to a request signal from an external device.

Also as depicted in FIGS. 2A and 2B, none of the connecting lines 13a and 13d are cut, in cases where none of the cavity items 17a and 17d have been taken out of the receiving cavities 15a and 15d. In this case, the wireless communication device 16a operates in such a manner that a wireless signal including information previously recorded in the circuit unit 14a is transmitted from the antenna 12a in response to a request signal from an external device. In the same manner as this, the wireless communication device 16d operates in such a manner that a wireless signal including information previously recorded in the circuit unit 14d is transmitted from the antenna 12d in response to a request signal from an external device. Such operation of each of the wireless communication devices 16a and 16d is carried out independent of whether the receiving cavities 15b and 15c have been opened as depicted in FIGS. 2A and 2B, that is, independent of the operation of each of the wireless communication devices 16b and 16c, wherein this operation differs between before and after the connecting lines 13b and 13c are cut.

Configuring the package 10 as above-mentioned makes it possible that information capable of sensing whether one receiving cavity 15 is opened is transmitted from the corresponding wireless communication device 16, independent of the other receiving cavities 15. In addition, whether any of the wireless communication devices 16 is broken-down can be sensed in accordance with whether the wireless communication device 16 responses to a response request from an external device. As a result of the above-mentioned, it is possible to prevent any unopened one of the receiving cavities 15 from being wrongly recognized to be opened, wherein the unopened one is unopened, for example, owing to the breakdown of the wireless communication device 16. Thus, it is possible to enhance reliability in sensing whether the cavity item 17 has been taken out of the receiving cavity 15. For example, if any of the wireless communication devices 16 is broken-down, the broken-down one of the wireless communication devices 16 does not respond to an external device, and thus, no unopened receiving cavity 15 is wrongly recognized to be opened, making it possible that this responseless wireless communication device 16 is found broken-down.

Further, the package 10 has sets of a connecting line 13 and a wireless communication device 16, one set per receiving cavity 15, on the sheet 11. Because of this, one set of a connecting line 13 and a wireless communication device 16, together with the sheet 11 and the package body 18, can be separated from another, each set corresponding to one receiving cavity 15, without breaking any of the connecting line 13 and the wireless communication device 16. In this manner, the package 10 can be separated into pieces each corresponding to one receiving cavity 15 (corresponding to one received cavity item 17) so that each piece can be hand-carried, and also, the wireless communication devices 16 on the separated pieces of the sheet 11 can individually transmit information that makes it possible to sense whether the receiving cavity 15 is opened. As a result of this, even if one wireless communication device 16, which corresponds to one receiving cavity 15, is separated from another, the information from each wireless communication device 16 can be read out, making it possible to sense whether the individually separated receiving cavities 15 are opened.

Figure 3A:
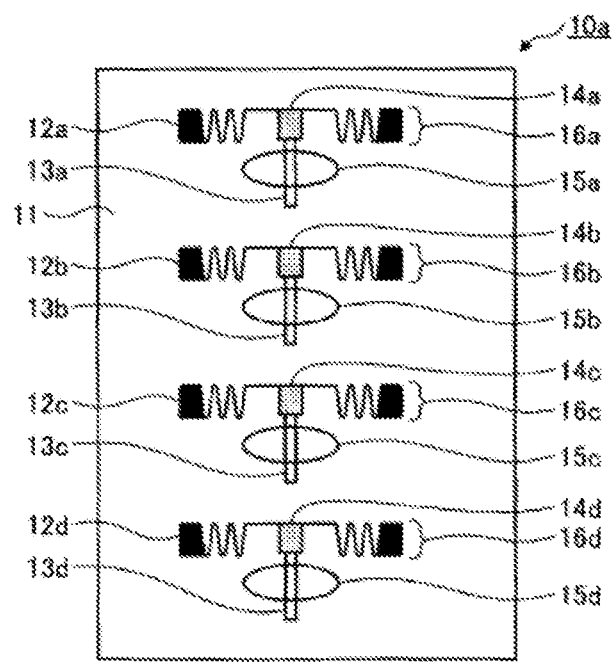
FIG. 3A is a view depicting a first variation of connecting lines formed on the sheet of the package according to the first embodiment of the present invention.
Figure 3B:
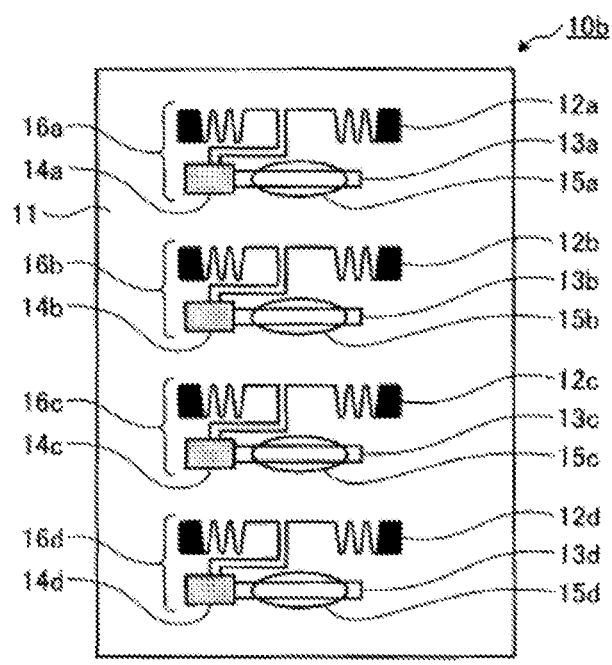
FIG. 3B is a view depicting a second variation of the connecting lines formed on the sheet of the package according to the first embodiment of the present invention.

In this regard, the package 10 according to the present embodiment is illustrated such that the connecting line 13 having a loop pattern traverses on the sealed opening portion of the receiving cavity 15 (see FIG. 1A), but the connecting line 13 is not limited to any aspect as long as the connecting line 13 is formed so as to pass above the sealed opening portion of the receiving cavity 15. FIG. 3A is a view depicting a first variation of connecting lines 13 formed on the sheet of the package. FIG. 3B is a view depicting a second variation of connecting lines 13 formed on the sheet of the package. For example, as in the packages 10a and 10b depicted in FIGS. 3A and 3B, the connecting lines 13a to 13d may each be formed into a loop pattern which passes so as to traverse longitudinally or crosswise above the opening portion of each of the receiving cavities 15a to 15d, wherein the opening is sealed by the sheet 11.

Second Embodiment

Figure 4A:
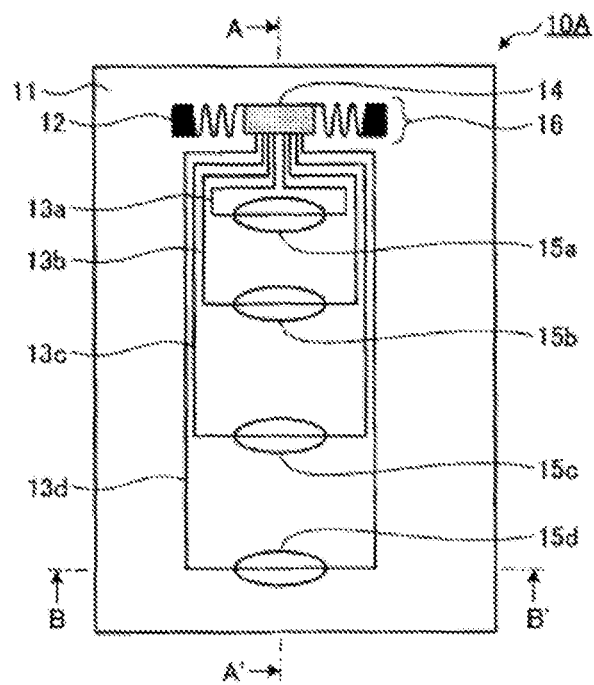
FIG. 4A is a top view depicting a configuration example of a package according to a second embodiment of the present invention.
Figure 4B:
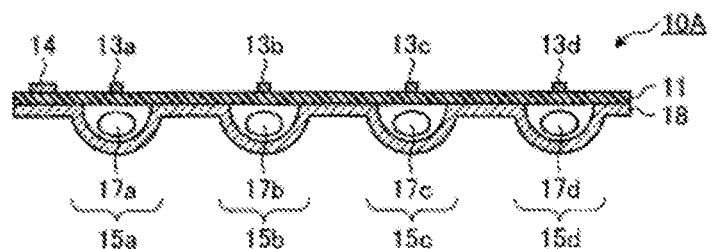
FIG. 4B is a cross-sectional view taken along line A-A' in the view of the package depicted in FIG. 4A.
Figure 4C:
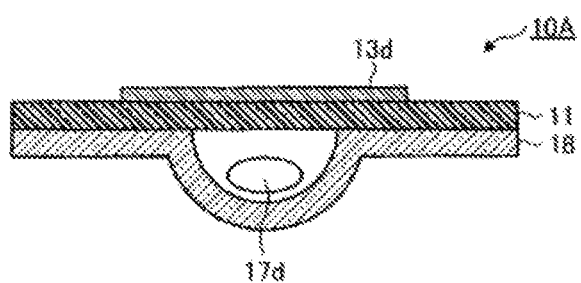
FIG. 4C is a cross-sectional view taken along line B-B' in the view of the package depicted in FIG. 4A.

FIGS. 4A to 4C are views describing a configuration of a package according to a second embodiment of the present invention. FIG. 4A is a top view depicting a configuration example of this package according to the second embodiment. FIG. 4B is a cross-sectional view taken along line A-A' in the view of the package depicted in FIG. 4A. FIG. 4C is a cross-sectional view taken along line B-B' in the view of the package depicted in FIG. 4A.

As depicted in FIGS. 4A to 4C, this package 10A includes a package body 18 and a sheet 11. The package body 18 has a plurality of receiving cavities 15, for example, four receiving cavities 15a to 15d, as depicted in FIG. 4B. In the package body 18, the receiving cavities 15a to 15d are each a portion for receiving a cavity item 17. For example, as depicted in FIG. 4B, the receiving cavity 15a has a cavity item 17a received therein, the receiving cavity 15b has a cavity item 17b received therein, the receiving cavity 15c has a cavity item 17c received therein, and the receiving cavity 15d has a cavity item 17d received therein. The sheet 11 seals the opening portion of each of these receiving cavities 15a to 15d.

The package 10A includes a plurality of connecting lines 13 (for example, four connecting lines 13a to 13d depicted in FIGS. 4A and 4B) and one wireless communication device 16 (for example, a wireless communication device 16 depicted in FIG. 4A). Each of the plurality of connecting lines 13a to 13d is formed on the sheet 11 so as to correspond to each of the plurality of receiving cavities 15. Specifically, as depicted in FIGS. 4A and 4B, the connecting line 13a is a conducting wire corresponding to the receiving cavity 15a and is formed on the sheet 11 so as to pass above the sealed opening portion of the receiving cavity 15a having the cavity item 17a received therein. The connecting line 13b is a conducting wire corresponding to the receiving cavity 15b and is formed on the sheet 11 so as to pass above the sealed opening portion of the receiving cavity 15b having the cavity item 17b received therein. The connecting line 13c is a conducting wire corresponding to the receiving cavity 15c and is formed on the sheet 11 so as to pass above the sealed opening portion of the receiving cavity 15c having the cavity item 17c received therein. The connecting line 13d is a conducting wire corresponding to the receiving cavity 15d and is formed on the sheet 11 so as to pass above the sealed opening portion of the receiving cavity 15d having the cavity item 17d received therein.

As depicted in FIG. 4A, the wireless communication device 16 is formed on the sheet 11 so as to be connected to the connecting lines 13a to 13d. Specifically, the wireless communication device 16 includes at least an antenna 12 for wireless communication and a circuit unit 14 having a function such as of wireless communication. The connecting lines 13a to 13d are, for example, connected to the circuit unit 14 so as to form a loop pattern, extending from the circuit unit 14 and passing so as to traverse above the receiving cavities 15a to 15d. The wireless communication device 16 transmits information (a signal including the information) which differs between before and after each of the connecting lines 13a to 13d together with the sheet 11 is cut as a result of opening the receiving cavities 15a to 15d.

In this regard, FIGS. 4A and 4B illustrate the package 10A having four receiving cavities 15, but the number of receiving cavities 15 included in the package 10A is not limited to four as mentioned, but may be one or more. In addition, the number of cavity items 17 to be received in the receiving cavities 15 of the package 10A is not limited to four as mentioned, but may be one or more per receiving cavity 15. For example, a plurality of cavity items 17 may be received in one receiving cavity 15. In addition, the number of connecting lines 13 provided for each receiving cavity 15 and disposed on the sheet 11 is not limited to four as mentioned, but may be one or more per receiving cavity 15. For example, a plurality of connecting lines 13 may be provided per receiving cavity 15.

Figure 5A:
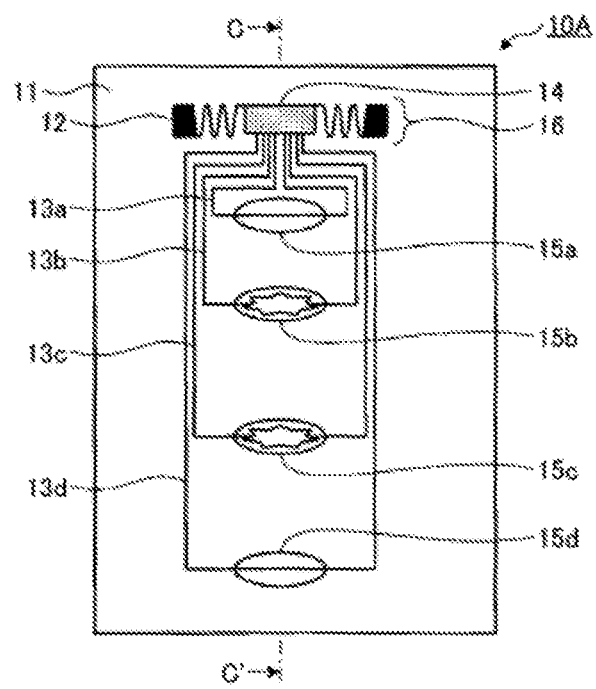
FIG. 5A is a view depicting a specific example of the package according to the second embodiment of the present invention, wherein, in the specific example, cavity items have been taken out of receiving cavities.
Figure 5B:
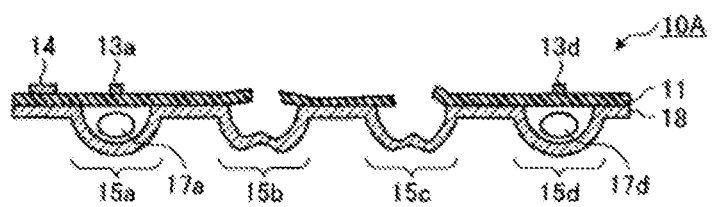
FIG. 5B is a cross-sectional view taken along line C-C' in the view of the package depicted in FIG. 5A.

FIG. 5 is a view depicting a specific example of the package according to the second embodiment of the present invention, wherein, in the specific example, cavity items 17 have been taken out of receiving cavities 15. FIG. 5B is a cross-sectional view taken along line C-C' in the view of the package depicted in FIG. 5A. As a specific example of the package 10A in which the cavity item 17 has been taken out of the receiving cavity 15, FIGS. 5A and 5B illustrate the package 10A in a state where the cavity items 17b and 17c have been taken out of the receiving cavities 15b and 15c respectively.

As depicted in FIGS. 5A and 5B, in cases where the cavity items 17b and 17c (see FIG. 5B) are taken out of the receiving cavities 15b and 15c of the package 10A, those portions of the sheet 11 which seal the opening portions of these receiving cavities 15b and 15c are broken, and the receiving cavities 15b and 15c are each opened. As a result of this, the connecting lines 13b and 13c are cut together with the corresponding breakage portions of this sheet 11.

Here, in cases where the connecting line 13b remains to be cut (see FIG. 4A), the wireless communication device 16 operates in such a manner that a wireless signal including information previously recorded in the circuit unit 14 is transmitted from the antenna 12 in response to a request signal from an external device (not shown). On the other hand, in cases where the connecting line 13b is already cut as above-mentioned, the wireless communication device 16 operates in such a manner that a wireless signal including information different from the information that was transmitted before the connecting line 13b was cut is transmitted from the antenna 12 in response to a request signal from an external device. Here, in cases where the connecting line 13c remains to be cut (see FIG. 4A), the wireless communication device 16 operates, independent of this connecting line 13b, in such a manner that a wireless signal including information previously recorded in the circuit unit 14 is transmitted from the antenna 12 in response to a request signal from an external device. On the other hand, in cases where the connecting line 13c is already cut as above-mentioned, the wireless communication device 16 operates in such a manner that a wireless signal including information different from the information that was transmitted before the connecting line 13c was cut is transmitted from the antenna 12 in response to a request signal from an external device.

Also as depicted in FIGS. 5A and 5B, none of the connecting lines 13a and 13d are cut, in cases where none of the cavity items 17a and 17d have been taken out of the receiving cavities 15a and 15d. In this case, the wireless communication device 16 operates in such a manner that a wireless signal including information previously recorded in the circuit unit 14 is transmitted from the antenna 12 in response to a request signal from an external device.

Configuring the package 10A as above-mentioned makes it possible that information capable of sensing whether one receiving cavity 15 is opened is transmitted from the corresponding wireless communication device 16, independent of the other receiving cavities 15. In addition, whether the wireless communication device 16 is broken-down can be sensed on the basis of whether the wireless communication device 16 responses to a response request from an external device. As a result of the above-mentioned, it is possible to prevent any unopened receiving cavity 15 from being wrongly recognized to be opened, wherein the unopened one is unopened, for example, owing to the breakdown of the wireless communication device 16. Thus, it is possible to enhance reliability in sensing whether the cavity item 17 has been taken out of the receiving cavity 15. For example, if any of the wireless communication devices 16 is broken-down, the broken-down one does not respond to an external device, and thus, no unopened receiving cavity 15 is wrongly recognized to be opened, making it possible that this responseless wireless communication device 16 is found broken-down.

Figure 6A:
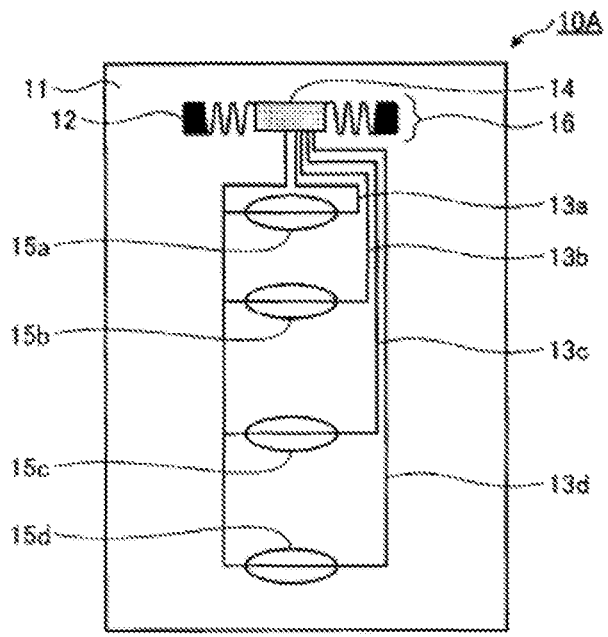
FIG. 6A is a view depicting a configuration example of a package according to a first variation of the second embodiment.

In this regard, the package 10A according to the second embodiment is illustrated such that the connecting line 13 having a loop pattern traverses on the sealed opening portion of the receiving cavity 15 (see FIG. 4A), but the connecting line 13 is not limited to any aspect as long as the connecting line 13 is formed so as to pass above the sealed opening portion of the receiving cavity 15. FIG. 6A is a view depicting a configuration example of a package according to a first variation of the second embodiment. As depicted in FIG. 6A, the connecting lines 13a to 13d in the package 10A may be partially shared.

Figure 6B:
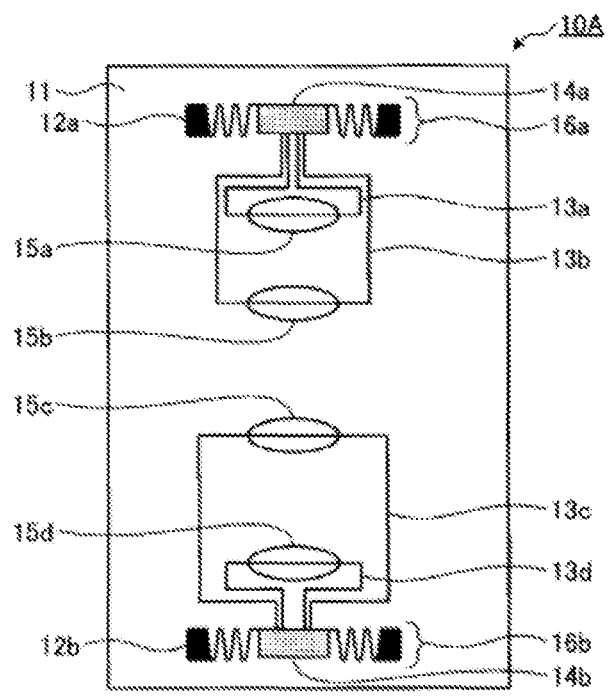
FIG. 6B is a view depicting a configuration example of a package according to a second variation of the second embodiment.

A configuration of the package 10A according to the second embodiment is illustrated such that only one wireless communication device 16 is provided on the sheet 11 (see FIG. 6A), but two or more wireless communication devices 16 may be provided. FIG. 6B is a view depicting a configuration example of a package according to a second variation of the second embodiment. As depicted in FIG. 6B, two wireless communication devices 16a and 16b are provided in the package 10A. In the package 10A according to the second variation, the wireless communication device 16a is connected to the connecting lines 13a and 13b, and the wireless communication device 16b is connected to the connecting lines 13c and 13d. In this regard, the wireless communication devices 16a and 16b in FIG. 6B are provided near the upper and lower ends of the sheet 11, but the positions at which the wireless communication devices 16a and 16b are provided are not limited to any ones, and the wireless communication devices 16a and 16b may be provided, for example, near the left and right ends of the sheet 11, or may be provided in the central portion of the sheet 11.

Figure 7:
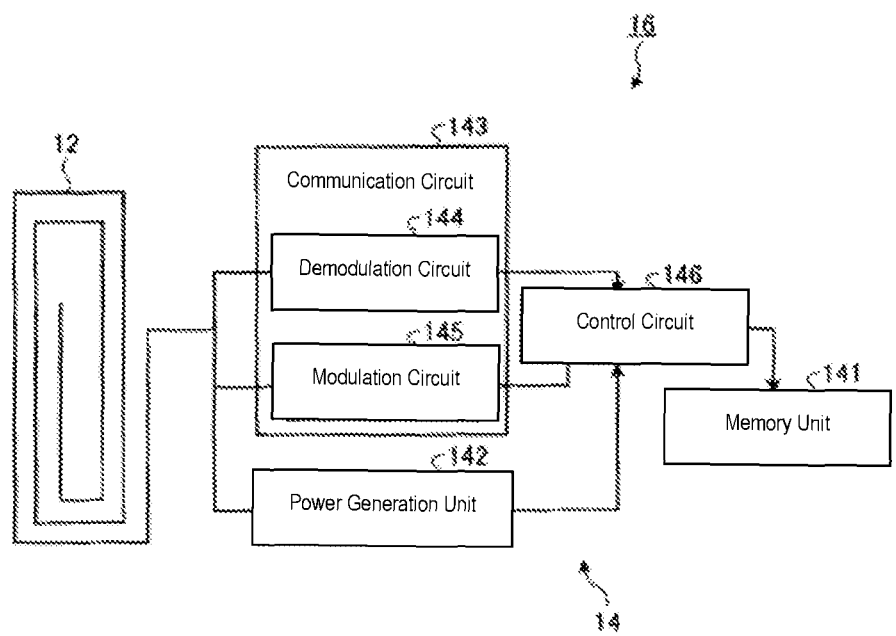
FIG. 7 is a block diagram depicting a configuration example of a wireless communication device employed for a package according to an embodiment of the present invention.

In addition, the wireless communication device 16 is not limited to any particular kind, but may be a wireless communication device for which a passive type or active type of RFID technology is used, or may be a wireless communication device conforming to a near filed communication standard such as Bluetooth (registered trademark). As above-mentioned, the wireless communication device 16 includes at least an antenna 12 and a circuit unit 14 (see the wireless communication devices 16a to 16d depicted in FIG. 1A and the wireless communication device 16 depicted in FIG. 4A). FIG. 7 is a block diagram depicting a configuration example of a wireless communication device 16 employed for a package according to an embodiment of the present invention. As depicted in FIG. 7, the wireless communication device 16 includes an antenna 12 and a circuit unit 14. The circuit unit 14 includes a memory unit 141, a power generation unit 142, a communication circuit 143, and a control circuit 146.

The antenna 12 transmits and receives a wireless signal to and from an external device such as a reader which reads information from the wireless communication device 16. The memory unit 141 as a memorizing method is configured using a memory element, a memory array, and a flip flop circuit, wherein the memory element has predetermined information (for example, unique information such as ID numbers) readably recorded therein. The power generation unit 142 functions as a rectifying circuit in the wireless communication device 16. The communication circuit 143 is a circuit for carrying out wireless communication, and is configured with, for example, a demodulation circuit 144 and a modulation circuit 145. The control circuit 146 controls these circuits. As depicted in FIG. 7, the antenna 12 is electrically connected via wiring to each circuit in the circuit unit 14.

In such a wireless communication device 16, the antenna 12 receives a wireless signal (a modulated wave signal) transmitted from an external device. The power generation unit 142 rectifies a modulated wave signal received by the antenna 12 and converts the signal to a direct current, and supplies the thus obtained direct current (power) to each constituent part of the wireless communication device 16. The demodulation circuit 144 demodulates this modulated wave signal, and transmits the thus obtained electric signal (command) to the control circuit 146. The memory unit 141 retains previously recorded information. The control circuit 146 reads information from the memory unit 141 on the basis of a command obtained in accordance with an electric signal received from the demodulation circuit 144, and transmits this read information to the modulation circuit 145. The modulation circuit 145 modulates the data received from the control circuit 146, and transmits the thus generated modulated wave signal to the antenna 12. The antenna 12 causes this modulated wave signal from the modulation circuit 145 to be transmitted to an external device as a wireless signal including the above-mentioned information.

In this regard, a circuit contained in the circuit unit 14 is not limited to any particular one as long as the circuit enables a wireless communication function to be carried out between the wireless communication device 16 and an external device. Examples of such a circuit include, but are not limited to, the memory unit 141, the power generation unit 142, the communication circuit 143, and the control circuit 146 which are depicted in FIG. 7.

On the other hand, the connecting line 13 is connected to the circuit unit 14 of the wireless communication device 16, though the line is not particularly depicted in FIG. 7 (see the connecting lines 13*a* to 13*d* and the circuit units 14*a* to 14*d* depicted in FIG. 1A and the connecting lines 13*a* to 13*d* and the circuit unit 14 depicted in FIG. 4A). For example, the connecting line 13 is connected to any of the circuits (for example, the memory unit 141, the communication circuit 143, and the control circuit 146) constituting the circuit unit 14. The circuit connected to the connecting line 13 is not limited to any particular one as long as the circuit makes it possible that information to be transmitted from the wireless communication device 16 to an external device varies between before and after the connecting line 13 is cut as a result of opening the receiving cavity 15.

(Method of Producing Package According to Embodiment)

Next, returning to FIGS. 1A to 1C as reference drawings, the configuration of the package 10 according to the first embodiment of the present invention will be described in detail. In this regard, the below-mentioned description of the configuration applies, in the same way, to the configurations of the package 10A according to the second embodiment which are depicted in FIGS. 4A to 4C.

As depicted in FIGS. 1B and 1C, the package body 18 has the receiving cavities 15*a* to 15*d* each formed into a generally semicircular convex. A breakable sheet 11 is adhered to the package body 18 at the opening portion side of the receiving cavities 15*a* to 15*d*. The opening portion of each of the receiving cavities 15*a* to 15*d* is sealed by this sheet 11.

The package body 18 is formed of: a transparent resin material such as polyethylene terephthalate, polyvinyl chloride, polypropylene, polyethylene, cyclic olefin copolymer, polychlorotrifluoroethylene, polychlorotetrafluoroethylene, or polyvinylidene chloride; a foam material of any of these; a laminate of two or more selected from these materials; or the like.

The sheet 11 is not limited to any particular material, and examples of materials used for the sheet include a resin material, metal material, paper material, and a laminate thereof. Among these, a metal material (for example, metal foil) is preferably contained in the sheet from the viewpoint of stability to temperature, humidity, and the like, a low moisture vapor transmission rate, and the like. In this case, it is necessary to insulate the wireless communication device 16 from the sheet 11, and thus, the sheet 11 is preferably a laminate of a metal foil and an insulating layer.

Examples of materials to be used for an insulating layer of the sheet 11 include, but are not limited particularly to, inorganic materials, organic polymer materials, and mixtures of an inorganic material powder and an organic material. Examples of inorganic materials include silicon oxide, alumina, and the like. Examples of organic polymer materials include polyimide, polyvinyl alcohol, polyvinyl chloride, polyethylene terephthalate, polyvinylidene fluoride, polysiloxane, polyvinyl phenol, epoxy resins, acrylic resins, nitrocellulose resins, and the like. The insulating layer is not limited to any particular thickness. From the viewpoint of making it easy to break the sheet 11 in opening the receiving cavity 15, a scissible portion such as a perforation or a V-shaped incision may be provided on at least a part of the insulating layer constituting part of the sheet 11, wherein the part is positioned above the opening portion of the receiving cavity 15.

In addition, examples of methods of forming an insulating layer include known techniques such as: methods of laminating a film of a polymer such as polyethylene terephthalate on metal foil; and resistance heating evaporation, electron beam, sputtering, plating, CVD, ion plating coating, inkjet, printing, spin coating, blade coating, slit die coating, screen printing, bar coater, casting, transfer printing, and an immersion and withdrawal method. However, the methods of forming an insulating layer is not limited to these. In this regard, the insulating layer constituting part of the sheet 11 may be a monolayer or a multilayer. Furthermore, a printing layer may be formed between this insulating layer and metal foil. Examples of methods of printing a printing layer include, but are not limited particularly to: gravure printing and the like.

An adhesion layer for adhering the sheet 11 to the package body 18 exists between the sheet 11 and the package body 18, though the layer is not shown in the drawings. In this regard, a printing layer may be formed between this adhesion layer and the sheet 11. Examples of methods of printing a printing layer include, but are not limited particularly to: gravure printing and the like.

A material to be used for the connecting line 13 is not limited to any particular one, but may be any conducting material that can generally be used as a conductor. Examples of conducting materials for the connecting line 13 include conducting metal oxides, metals, inorganic conducting substances, organic conducting substances, conducting polymers, carbon materials, and the like. Examples of conducting metal oxides include tin oxide, indium oxide, indium tin oxide (ITO), and the like. Examples of metals include platinum, gold, silver, copper, iron, tin, zinc, aluminum, indium, chromium, lithium, sodium, potassium, cesium, calcium, magnesium, palladium, molybdenum, amorphous silicon, polysilicon, and alloys thereof. Examples of inorganic conducting substances include copper iodide, copper sulfide, and the like. Examples of organic conducting substances include polythiophene, polypyrrole, polyaniline, and complexes of polyethylenedioxythiophene and polystyrene sulfonate. Examples of conducting polymers include polymers having conductivity enhanced by doping them with iodine and the like. However, the conducting material for the connecting line 13 is not limited to these. These conducting materials may be used singly, or two or more of the materials may be laminated or used in mixture.

Examples of methods of forming the connecting line 13 include: a method in which a pattern of a conducting film is formed by a known photolithographic technique; a method in which a pattern is formed via a mask in desired shape in evaporating or sputtering an electrode substance; a method in which an electrode thin film produced by the above-mentioned method is formed into a pattern by laser processing; a method in which a pattern is formed by photolithographic processing using a photosensitive conducting paste; a method in which a pattern is directly formed by a printing technique; a method in which metal foil adhered onto the sheet 11 is etched; and the like. Examples of methods of forming a conducting film include resistance heating evaporation, electron beam, sputtering, plating, CVD, ion plating coating, inkjet, printing, and the like. Examples of printing techniques in directly forming the connecting line 13 as a pattern include inkjet, screen printing, gravure printing, flexographic printing, and the like.

The above-mentioned methods of forming a conducting film is not limited to any particular ones, and, from the viewpoint of production cost and the like, a conducting film is preferably formed by applying a conducting paste onto the sheet 11 by any of the above-mentioned printing techniques. In this regard, examples of methods of drying and firing a conducting paste include: use of an oven, inert oven, or hot plate; heat-curing or vacuum-curing with infrared light; curing with a xenon flash lamp; and photo-curing with UV light. However, these methods are not limited to any particular ones as long as the methods can bring about conduction.

In the present invention, an antenna (for example, the antennas 12a to 12d depicted in FIG. 1A) is one which transmits and receives electric waves. Examples of the antenna 12 include, but are not particular limited to: loop antennas and spiral antennas used for communication in an HF (High Frequency) band; dipole antennas and patch antennas used for communication in a UHF (Ultra High Frequency) band; and the like. In the present embodiment, a dipole antenna in the form of a meander line is mainly illustrated as an example of the pattern of the antenna 12, but the present invention is not limited to this.

A material to be used for the antenna 12 is not limited to any particular one, but may be any conducting material that can generally be used as a conductor. For example, the above-mentioned same conducting materials as for the connecting line 13 can be used as the materials for the antenna 12. Examples of methods of forming the antenna 12 include, but are not limited particularly to; a method in which an antenna sheet composed of a substrate with an antenna pattern formed thereon is adhered onto the sheet 11; a method in which a conducting paste is printed on the sheet 11 and cured by heat or light so as to have a pattern corresponding to an antenna; a method in which metal foil processed in antenna form using a die blade is transferred onto the sheet 11; and the like. In this regard, examples of methods of forming the above-mentioned antenna sheet include: a method in which metal foil such as copper foil or aluminum foil is processed in antenna form using a die blade and transferred onto a substrate; a method in which metal foil adhered to a substrate such as a polymer film is etched via a mask as which a resist layer formed on the metal foil is used; a method in which a conducting paste is printed on a substrate such as a polymer film so as to have a pattern corresponding to an antenna, and cured by heat or light; and the like. However, methods of forming the antenna sheet are not limited to these.

Figure 8:
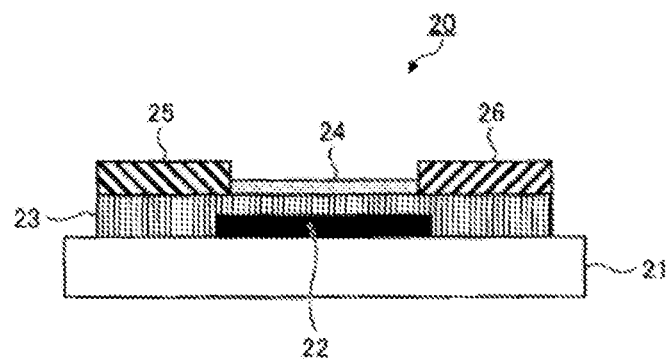
FIG. 8 is a side view depicting a configuration example of a thin film transistor employed for a circuit unit of a wireless communication device in the present invention.

Examples of methods of forming the circuit unit 14 include; a method in which conventional IC chips are mounted; and a method in which ICs are formed by a coating process such as printing. From the viewpoint of production cost, the latter methods are preferable as methods of forming the circuit unit 14. FIG. 8 is a side view depicting a configuration example of a thin film transistor employed for a circuit unit of a wireless communication device 16 in the present invention. The circuit unit 14 has at least a thin film transistor 20 illustrated in FIG. 8 and wiring (not shown). As depicted in FIG. 8, the thin film transistor 20 is configured with a substrate 21, a gate electrode 22, a source electrode 25, a drain electrode 26, a gate insulating layer 23, and a semiconductor layer 24. The structure of the thin film transistor 20 (hereinafter, suitably referred to as a TFT structure) is what is called a bottom-gate structure having a gate electrode 22 disposed (on the substrate 21 side) below the semiconductor layer 24 and having a source electrode 25 and a drain electrode 26 disposed on the same plane as the semiconductor layer 24 is disposed. However, a TFT structure employed for the circuit unit 14 of the wireless communication device 16 in the present invention is not limited to this, but may be, for example, what is called a top-gate structure having a gate electrode 22 disposed (on the opposite side from the substrate 21) above the semiconductor layer 24 and having a source electrode 25 and a drain electrode 26 disposed on the same plane as the semiconductor layer 24 is disposed.

To form the electrodes (the gate electrode 22, the source electrode 25, and the drain electrode 26) and wiring of the thin film transistor 20, the same materials and forming methods as employed for the connecting line 13 can be employed. From the viewpoint of the performance of the circuit unit 14, however, the processing of the electrodes and wiring of the thin film transistor 20 requires microfabrication, and thus, photolithographic processing is preferably carried out using a photosensitive conducting paste in cases where the circuit unit 14 is formed by coating. The photosensitive conducting paste is not limited to any particular one, but is preferably a photosensitive conducting paste containing at least silver (Ag) particles and a photosensitive organic component from the viewpoint of microfabrication and production cost.

In cases where the circuit unit 14 is formed by coating, the wiring and the connecting line 13 of the circuit unit 14 may be formed by coating together with the circuit unit 14 in the coating process of the circuit unit 14. Specific examples include a method in which the wiring of the circuit unit 14 and the connecting line 13 are obtained by: forming a coating film on the sheet 11 using a photosensitive conducting paste containing a conductor, for example, Ag particles and a photosensitive organic component; processing this coating film by photolithography into patterns corresponding to the wiring of the circuit unit 14 and the connecting line 13; and curing the patterns corresponding to the wiring of the circuit unit 14 and the connecting line 13. However, a method of forming the wiring of the circuit unit 14 and the connecting line 13 is not limited to this.

Materials to be used for the semiconductor layer 24 are not limited to any particular ones as long as the materials have semiconductivity, and examples of the materials include inorganic semiconductors such as silicon semiconductors and oxide semiconductors, organic semiconductors such as pentacene and polythiophene derivatives, and carbon semiconductors such as carbon nanotubes (CNT), graphene, and fullerene. Among these, organic semiconductors and carbon semiconductors are preferable from the viewpoint of the capability to form the semiconductor layer 24 by coating and the capability to form the semiconductor layer 24 at a low temperature of 200° C. or less. That is, the material for the semiconductor layer 24 preferably contains one or more selected from the group consisting of CNTs, graphene, fullerene, and organic semiconductors. Furthermore, the material for the semiconductor layer 24 preferably contains CNTs from the viewpoint of the performance and heat resistance of a transistor circuit.

In particular, from the viewpoint of high semiconductor characteristics, the material for the semiconductor layer 24 preferably contains a CNT composite in which a conjugated polymer is adhered to at least a part of the surface of a CNT. This is because adhering a conjugated polymer to at least a part of the surface of a CNT enables the CNTs to be uniformly dispersed in a solution for formation of a semiconductor layer without impairing the high electrical characteristics retained by CNTs. In addition, using a solution having CNTs uniformly dispersed therein makes it possible that a film having CNTs uniformly dispersed therein is formed as the semiconductor layer 24 by a coating method such as an inkjet method.

The "state where a conjugated polymer is adhered to at least a part of the surface of a CNT" means a state where a part or all of the surface of a CNT is covered with a conjugated polymer. It is inferred that the reason why a CNT can be covered with a conjugated polymer is that the overlapping of the n electron clouds derived from the conjugated structures of the CNT and the polymer causes interaction to occur between the CNT and the polymer. Whether a CNT is covered with a conjugated polymer can be determined on the basis of whether the reflected color of the covered CNT is closer to the color of the conjugated polymer than to the color of the uncovered CNT. Elemental analysis such as XPS can quantitatively identify the existence of adhered matter and the weight ratio of the adhered matter to the CNT.

Examples of methods of adhering a conjugated polymer to a CNT include the following four methods and the like. A first method is a method in which CNTs are added to and mixed with a molten conjugated polymer. A second method is a method in which a conjugated polymer is dissolved in a solvent, and CNTs are added to and mixed with the resulting solution. A third method is a method in which CNTs are preliminarily dispersed in a solvent by ultrasonication, and a conjugated polymer is added to and mixed with the resulting dispersion. A fourth method is a method in which a conjugated polymer and CNTs are added to a solvent, and the polymer, CNTs, and the solvent are mixed by irradiating the mixture system with ultrasonic waves. In the present invention, any of these methods may be used, or one or more of the methods may be combined.

Examples of conjugated polymers include, but are not limited particularly to, polythiophene-based polymers, polypyrrole-based polymers, polyaniline-based polymers, polyacetylene-based polymers, poly-p-phenylene-based polymers, poly-p-phenylenevinylene-based polymers, and the like. Among these polymers, a polymer resulting from arranging single monomer units is preferably used, and a block copolymer or random copolymer of different monomer units is also used. In addition, a graft polymer can be used.

Examples of insulating materials to be used for the gate insulating layer 23 include, but are not limited particularly to, inorganic materials such as silicon oxide and alumina; organic polymer materials such as polyimide, polyvinyl alcohol, polyvinyl chloride, polyethylene terephthalate, polyvinylidene fluoride, polysiloxane, polyvinyl phenol, and acrylic resins; mixtures of an inorganic material powder and an organic material; and the like. Among these, an organic compound containing a bond between a silicon atom and a carbon atom is preferably contained in an insulating material to be used for the gate insulating layer 23. In addition to the compound, a metal compound containing a bond between a metal atom and an oxygen atom is still more preferably contained in the insulating material. The gate insulating layer 23 may be composed of a monolayer or a multilayer. In addition, one layer in the gate insulating layer 23 may be formed of a plurality of insulating materials, or a plurality of layers in the gate insulating layer 23 may be formed by laminating a plurality of insulating materials.

Examples of methods of forming the gate insulating layer 23 include known techniques such as resistance heating evaporation, electron beam, sputtering, plating, CVD, ion plating coating, inkjet, printing, spin coating, blade coating, slit die coating, screen printing, bar coater, casting, transfer printing, and an immersion and withdrawal method. However, the methods of forming the gate insulating layer 23 is not limited to these.

In this regard, a method of disposing the circuit unit 14 on the sheet 11 is not limited to any particular one, but the circuit unit 14 may be formed directly on the sheet 11, or the substrate 21 with the circuit unit 14 thereon may be adhered to the sheet 11, wherein the circuit unit 14 is formed on the substrate 21 such as a polymer film and contains a thin film transistor 20 (see FIG. 8). Alternatively, the circuit unit 14 may be formed on a substrate 21 such as of the same polymer film as the antenna 12 followed by adhering the substrate 21 with the circuit unit 14 thereon to the sheet 11.

(Method of Producing Package)

Figure 9A:
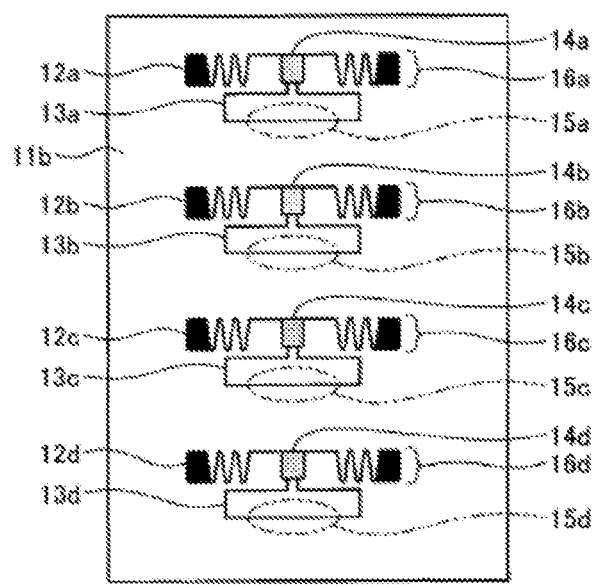
FIG. 9A is a view describing the formation of connecting lines and wireless communication devices in a method of producing a package according to a first embodiment of the present invention.
Figure 9B:
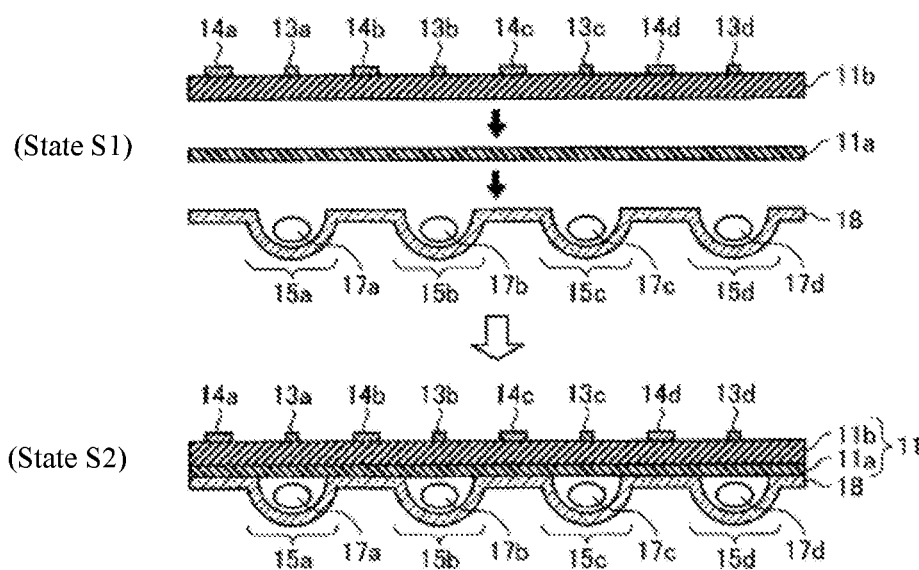
FIG. 9B is a view describing the adhesion of a sheet to a package body in the method of producing a package according to the first embodiment of the present invention.

Next, a method of producing a package according to an embodiment of the present invention will be described. FIGS. 9A and 9B are views describing a method of producing a package according to this first embodiment. FIG. 9A is a view describing the formation of connecting lines and a wireless communication device 16 in a method of producing a package according to this first embodiment. FIG. 9B is a view describing the adhesion of a sheet to a package body in the method of producing a package according to this first embodiment. In this regard, the method of producing a package depicted in FIGS. 9A and 9B is an example of the first embodiment, and a method of producing a package according to the present invention is not limited to this.

The method of producing a package according to this first embodiment of the present invention is a method of producing a package including: a package body having at least one receiving cavity 15 for receiving a cavity item 17; and a sheet 11 for sealing this at least one receiving cavity 15, wherein the method includes at least a functional portion formation step and an adhering step. The functional portion formation step is a step in which a conductive wire and a wireless communication device 16 are formed, on a substrate constituting the sheet 11, so as to correspond to each of the plurality of receiving cavities 15, wherein the conducting wire passes above the sealed opening portion of the receiving cavity 15, and wherein the wireless communication device 16 is connected to this conducting wire and transmits a signal including information which differs between before and after the conducting wire together with the sheet 11 is cut as a result of opening the receiving cavity 15.

In addition, the method of producing a package according to the second embodiment of the present invention is similarly a method of producing a package including: a package body having at least one receiving cavity 15 for receiving a cavity item 17; and a sheet 11 for sealing this at least one receiving cavity 15, wherein the method includes at least a functional portion formation step and an adhering step. The functional portion formation step is a step in which conductive wires and at least one wireless communication device 16 are formed on a substrate constituting the sheet 11, wherein each conducting wire corresponds to each of the plurality of receiving cavities 15 and passes above the sealed opening portion of the receiving cavity 15, and wherein the wireless communication device 16 is connected to this conducting wire and transmits a signal including information which differs between before and after the conducting wire together with the sheet 11 is cut as a result of opening the receiving cavity 15.

The adhering step is a step in which the package body having the cavity items 17 received in the plurality of receiving cavities 15 is adhered to the sheet 11 in which the plurality of conducting wires and the plurality of wireless communication devices 16 are formed on the substrate, and this adhered sheet 11 seals the plurality of receiving cavities 15 of the package body. Below, with reference to an example in which the above-mentioned package 10 (see FIGS. 1A to 1C) is produced, a method of producing the package 10 according to the first embodiment of the present invention will be specifically described.

For example, in the functional portion formation step in the method of producing the package 10 according to the first embodiment (see FIG. 1A), the connecting lines 13a to 13d and the wireless communication devices 16a to 16d are formed on the substrate 11b so as to correspond to the receiving cavities 15a to 15d respectively, as depicted in FIG. 9A. The substrate 11b constitutes part of the sheet 11 (specifically, is an insulating layer of the sheet 11). The connecting lines 13a to 13d are each formed on the substrate 11b so as to form a loop pattern which passes each of those parts (shown by the two-dot chain lines in FIG. 9A) of the substrate 11b at which the opening portions of the receiving cavities 15a to 15d are positioned, wherein the opening portions are sealed by the sheet 11. For example, the connecting line 13a is formed on the substrate 11b so as to pass the part at which the sealed opening portion of the receiving cavity 15a is positioned. The wireless communication devices 16a to 16d are produced by forming the antennas 12a to 12d and the circuit units 14a to 14d on the substrate 11b. In this case, the antennas 12a to 12d are formed to be connected to the circuit units 14a to 14d respectively. The circuit units 14a to 14d are formed to be connected to the connecting lines 13a to 13d respectively. For example, the antenna 12a is connected to the circuit unit 14a, the circuit unit 14a is connected to the connecting line 13a, and forming these antenna 12a and circuit unit 14a results in forming a wireless communication device 16a on the substrate 11b.

In addition, the same functional portion formation step as in the above-mentioned method can be adopted in the method of producing the package 10A according to the second embodiment (see FIG. 4A) except that at least one wireless communication device 16 is formed on the sheet 11, and that the connecting lines 13a to 13d are connected to the wireless communication device 16.

After the above-mentioned functional portion formation step was carried out, an adhering step is carried out. As depicted in FIG. 9B, the adhering step includes adhering the package body 18 to the substrate 11b, for example, via metal foil 11a, if necessary, wherein the package body 18 has the receiving cavities 15a to 15d formed therein, and wherein the substrate 11b has the connecting lines 13a to 13d and the wireless communication devices 16a to 16d formed thereon (in FIG. 9B, the circuit units 14a to 14d of the wireless communication devices 16a to 16d are depicted). In this case, the package body 18 is in a state where the cavity items 17a to 17d are previously received in the receiving cavities 15a to 15d respectively, as depicted by the state S1 in FIG. 9B. The metal foil 11a and the substrate 11b are adhered to the package body 18 at the opening portion side of these receiving cavities 15a to 15d by a technique such as lamination. As depicted by the state S2 in FIG. 9B, adhering these results in forming the sheet 11 composed of a laminate of the metal foil 11a and the substrate 11b, and causing the sheet 11 to seal the package body 18 with the cavity items 17a to 17d received in the receiving cavities 15a to 15d respectively. In this case, the metal foil 11a is between the package body 18 and the substrate 11b. In this regard, the same adhering step as in the above-mentioned method can be adopted in production of the package 10A depicted in FIG. 4A.

In the above-mentioned adhering step, the method of adhering the sheet 11 to the package body 18 is not limited to any particular one. For example, the metal foil 11a may be laminated onto the package body 18 followed by adhering the substrate 11b to this metal foil 11a by a method such as lamination, wherein, on the substrate 11b, the connecting lines 13a to 13d and the wireless communication devices 16a to 16d are previously formed in the functional portion formation step. Alternatively, the metal foil 11a and the substrate 11b may be laminated to form the sheet 11, wherein, on the substrate 11b, the connecting lines 13a to 13d and the wireless communication devices 16a to 16d are previously formed in the functional portion formation step. Then, the metal foil 11a side of this sheet 11 may be adhered to the package body 18 by a method such as lamination. Alternatively, the metal foil 11a and the substrate 11b may be laminated to form the sheet 11, followed by forming the connecting lines 13a to 13d and the wireless communication devices 16a to 16d on the substrate 11b of this sheet 11 in the functional portion formation step and adhering the metal foil 11a side of this sheet 11 to the package body 18 by a method such as lamination after the functional portion formation step. In this regard, the adhering step in production of the package 10A depicted in FIG. 4A is carried out in the same manner.

In addition, the sheet 11 can be produced using the above-mentioned materials and methods for forming the metal foil 11a, the substrate 11b, and the like. The substrate 11b can be produced using the above-mentioned materials and methods for forming the insulating layer of the sheet 11. In addition, it is possible to use the above-mentioned materials and forming methods to form, on the substrate 11b, the following: the connecting lines 13a to 13d; the antennas 12a to 12d and circuit units 14a to 14d of the wireless communication devices 16a to 16d; and the thin film transistor 20 (see FIG. 8) employed for each of the circuits (for example, the memory unit 141 and the communication circuit 143 depicted in FIG. 7) in the circuit unit 14. The package body 18 can be produced using the above-mentioned materials by molding or the like. In this regard, the package 10A depicted in FIG. 4A is produced in the same manner.

When the connecting lines 13a to 13d and the wireless communication devices 16a to 16d are formed on the substrate 11b in the above-mentioned functional portion formation step, an antenna sheet having the patterns of the antennas 12a to 12d formed thereon may be adhered onto the substrate 11b, and then, the circuit units 14a to 14d electrically connected to these antennas 12a to 12d respectively and the connecting lines 13a to 13d electrically connected to these circuit units 14a to 14d respectively may be formed on the substrate 11b. As above-mentioned, the circuit units 14a to 14d and the connecting lines 13a to 13d are preferably formed by a coating method such as printing from the viewpoint of production cost. In this regard, the package 10A depicted in FIG. 4A is produced in the same manner.

(Wireless Communication Device)

Next, an embodiment of a wireless communication device employed for a package according to the present invention will be specifically described. It should be noted that an embodiment of a wireless communication device according to the present invention is not limited to the following description.

Third Embodiment

Figure 10:
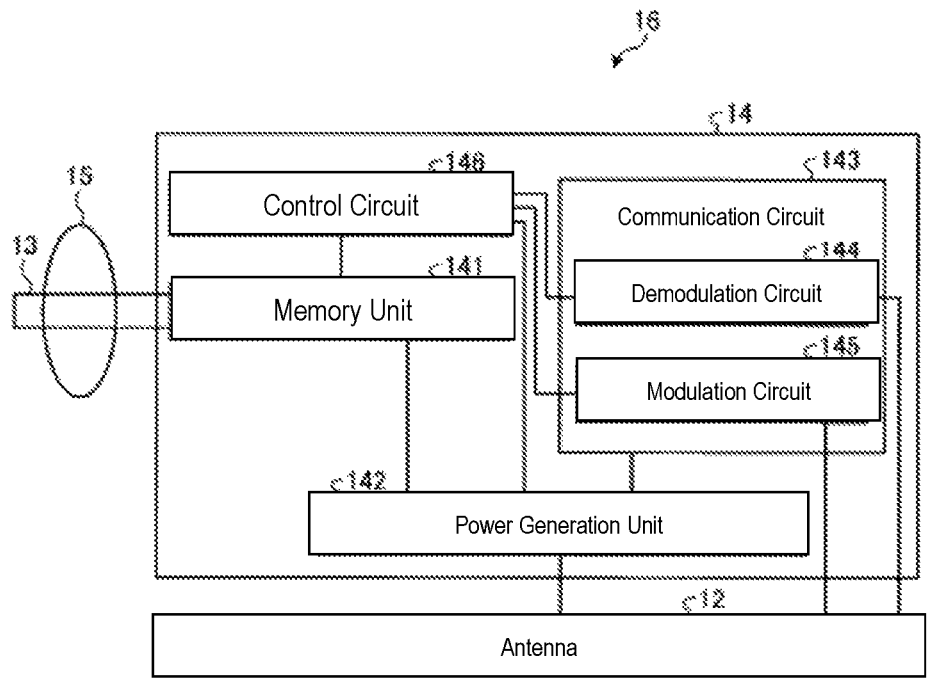
FIG. 10 is a block diagram depicting a basic configuration example of a wireless communication device according to a third embodiment of the present invention, wherein the wireless communication device is connected to a package according to the first embodiment.

A wireless communication device according to the third embodiment of the present invention will be described. FIG. 10 is a block diagram depicting a basic configuration example of a wireless communication device 16 according to the third embodiment of the present invention. As depicted in FIG. 10, the wireless communication device 16 includes an antenna 12 and a circuit unit 14 in the third embodiment. The circuit unit 14 has: a memory unit 141; a power generation unit 142; a communication circuit 143 configured with a demodulation circuit 144 and a modulation circuit 145; and a control circuit 146. In this circuit unit 14, a connecting line 13 passing above the sealed opening portion of a receiving cavity 15 is connected to the memory unit 141 as a memorizing method. The wireless communication device 16 having such a configuration transmits a signal to an external device, wherein the signal contains information recorded in the memory unit 141 and differing between before and after the connecting line 13 is cut as a result of opening the receiving cavity 15. In this manner, this external device can sense whether the receiving cavity 15 is opened.

Figure 11:
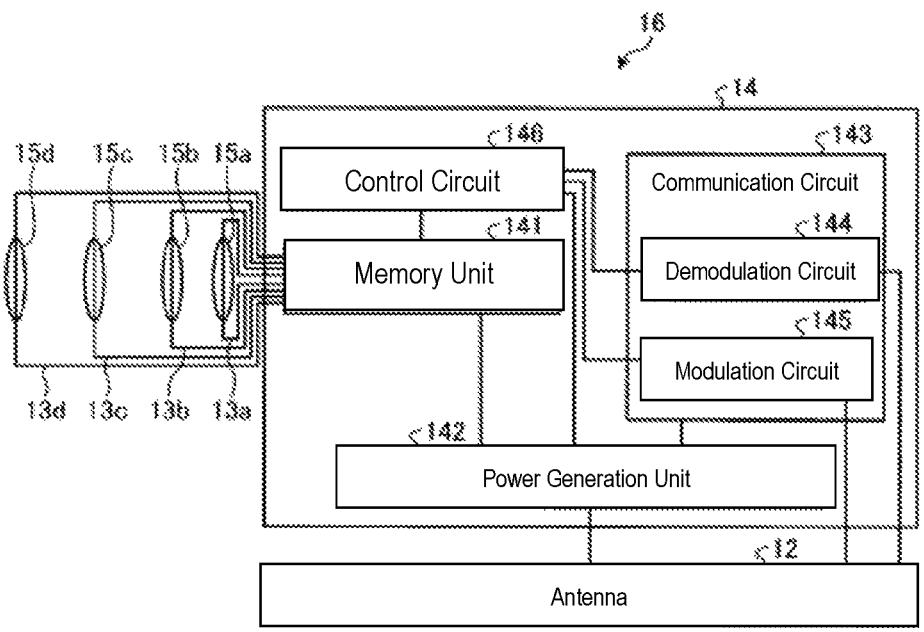
FIG. 11 is a block diagram depicting a basic configuration example of a wireless communication device according to the third embodiment of the present invention, wherein the wireless communication device is connected to a package according to the second embodiment.

In addition, FIG. 11 is a block diagram depicting a basic configuration example of a wireless communication device according to the third embodiment of the present invention, wherein the wireless communication device is connected in the package 10A depicted in FIG. 4A. FIG. 11 is the same as the above-described FIG. 10 depicting the wireless communication device 16, except that the connected package is the package 10A depicted in FIG. 4A.

(First Configuration Example of Wireless Communication Device)

Figure 12A:
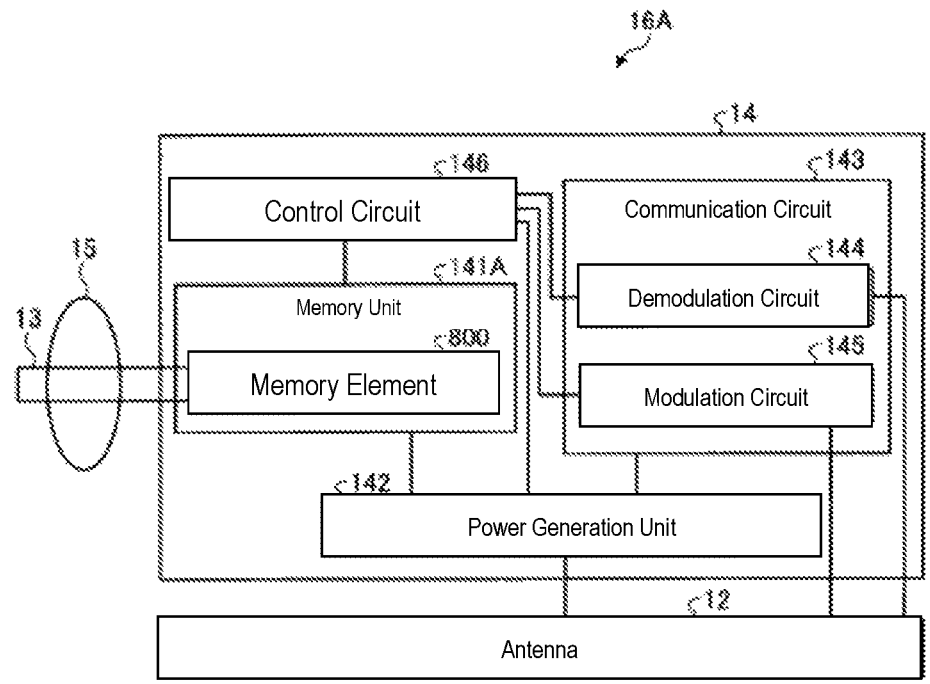
FIG. 12A is a block diagram depicting a first configuration example of the wireless communication device according to the third embodiment of the present invention.
Figure 12B:
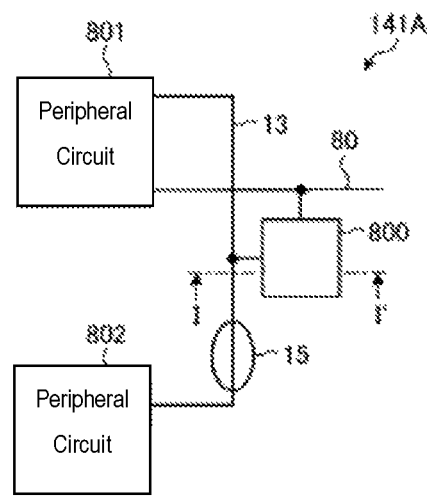
FIG. 12B is a diagram depicting a configuration example of a memory unit of the wireless communication device depicted in FIG. 12A.
Figure 12C:
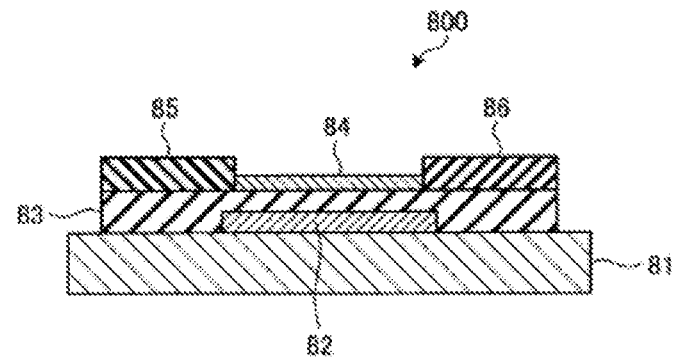
FIG. 12C is a cross-sectional view taken along line I-I' in the view of a memory element depicted in FIG. 12B.

A first configuration example of a wireless communication device according to the third embodiment of the present invention is, for example, a configuration in which the memory unit has at least a memory element that records information for sensing whether the receiving cavity 15 is opened. FIG. 12A is a block diagram depicting the first configuration example of the wireless communication device 16A according to the third embodiment of the present invention, wherein the wireless communication device 16A is in the package 10 depicted in FIG. 1A. FIG. 12B is a diagram depicting a configuration example of a memory unit 141A of the wireless communication device 16A depicted in FIG. 12A. FIG. 12C is a cross-sectional view taken along line I-I' in the view of the memory element depicted in FIG. 12B. FIGS. 12A to 12C illustrate a 1-bit memory element 800 as a memory element employed for the memory unit 141A of the wireless communication device 16A in this first example, but without limitation to this, the memory unit 141A may have a multi-bit memory element (that is, a plurality of memory elements 800).

As depicted in FIG. 12A, the wireless communication device 16A has the memory unit 141A as a circuit constituting part of the circuit unit 14. The memory unit 141A is an example of the memory unit 141 depicted in FIG. 10, and has at least one memory element 800. The connecting line 13 is connected to the memory element 800, passing above the sealed opening portion of the receiving cavity 15. The other constituents are the same as those of the wireless communication device 16 depicted in FIG. 10, and the same constituents are indicated by the same reference signs.

As depicted in FIG. 12B, the memory unit 141A has: a memory element 800, peripheral circuits 801 and 802, such as a decoder, which reads information out of the memory element 800; and a word line 80. The connecting line 13 is connected to the memory element 800 and the peripheral circuits 801 and 802, passing above the sealed opening portion of the receiving cavity 15. That is, the connecting line 13 in the memory unit 141A is constituted by a bit line connected to the memory element 800 and by the wire passing above the opening portion of the above-mentioned receiving cavity 15, and functions as a bit line. The connecting line 13 and the word line 80 are disposed so as to intersect, insulated from each other. The memory element 800 is provided so as to correspond to the intersection between the word line 80 and the bit line (first wire) included in the connecting line 13. In this regard, the wiring structure of the memory unit 141A, the arrangements of the memory element 800 and the peripheral circuits 801 and 802, and the like are not limited to those illustrated in FIG. 12B.

The memory element 800 is, for example, a memory element having such a TFT structure as depicted in FIG. 12C. As depicted in FIG. 12C, the memory element 800 specifically has a substrate 81, a first electrode 85, a second electrode 86, a third electrode 82, an insulating layer 83, and a semiconductor layer 84.

In the memory element 800, the third electrode 82 is, for example, a gate electrode, and formed on the substrate 81.

The third electrode 82 is electrically connected, via wiring, to the word line 80 depicted in FIG. 12B. The first electrode 85 is, for example, a drain electrode, and the second electrode 86 is, for example, a source electrode. The first electrode 85 and the second electrode 86 are formed on the insulating layer 83 so as to be spaced from each other. The first electrode 85 is electrically connected, via wiring, to the connecting line 13 depicted in FIG. 12B. This connecting line 13 contains the bit line of the memory element 800, as above-mentioned. The second electrode 86 is connected, via wiring, to a reference potential line (not shown). The insulating layer 83 is a gate insulating layer electrically insulating the first electrode 85 and the second electrode 86 from the third electrode 82. For example, as depicted in FIG. 12C, the insulating layer 83 is formed on the substrate 81 so as to be between the first electrode 85 and the third electrode 82 and between the second electrode 86 and the third electrode 82. The semiconductor layer 84 is constituted by a coating layer or the like of a semiconductor material, and formed in a region between the first electrode 85 and the second electrode 86. The semiconductor layer 84 determines the inter-electrode electrical characteristics of the first electrode 85 and the second electrode 86.

In the present invention, the "region between the first electrode and the second electrode" refers to a region positioned between the first electrode and the second electrode when the first electrode and the second electrode are planarly viewed across the thickness direction of the memory element (for example, the film thickness direction of the insulating layer). Such a region encompasses not only a region sandwiched between the first electrode and the second electrode, but also a region facing this sandwiched region in the thickness direction of the memory element (for example, from above) (a region not sandwiched between the first electrode and the second electrode).

Here, the connecting line 13 is in an uncut state when the receiving cavity 15 is not opened yet. In this state, a voltage is applied to the third electrode 82 of the memory element 800 via the word line 80 when the peripheral circuit 801 selects the memory element 800 as an object for information read-out. This causes electric current between the first electrode 85 and the second electrode 86. This electric current is detected by the peripheral circuit 802 via the connecting line 13. In this case, information read out of the memory element 800 is defined as, for example, "1". On the other hand, when the receiving cavity 15 is opened, the connecting line 13 results in being cut at its part corresponding to the receiving cavity 15. In this state, the peripheral circuit 802 can no longer detect electric current between the first electrode 85 and the second electrode 86, even if the peripheral circuit 801 selects a memory element 800 as an object for information read-out out. In this case, information read out of the memory element 800 is defined as, for example, "0".

In this manner, information read out of the memory element 800 (that is, information previously recorded in the memory element 800) is varied between before and after the connecting line 13 is cut, thereby enabling information transmitted from the wireless communication device 16A to an external device to differ between before and after the connecting line 13 is cut as a result of opening the receiving cavity 15. This results in enabling the external device to sense whether the receiving cavity 15 is opened.

(Second Configuration Example of Wireless Communication Device)

Figure 13A:
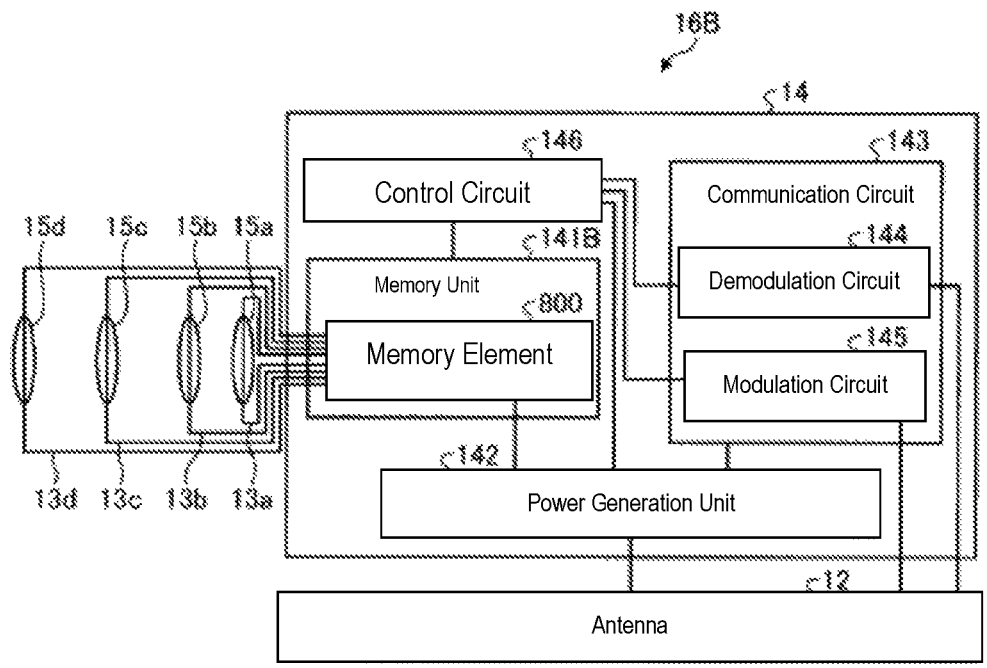
FIG. 13A is a block diagram depicting a second configuration example of the wireless communication device according to the third embodiment of the present invention.
Figure 13B:
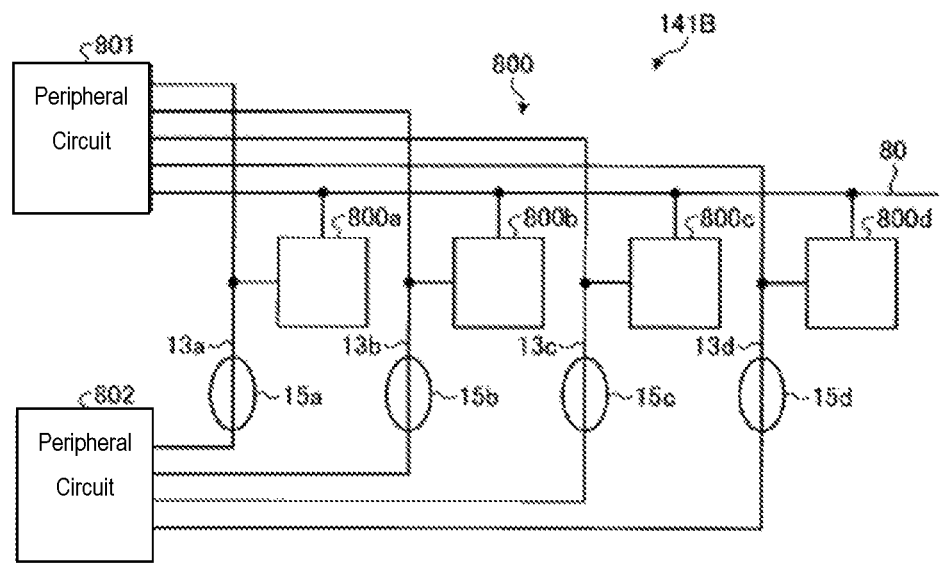
FIG. 13B is a diagram depicting a configuration example of a memory unit of the wireless communication device depicted in FIG. 13A.

FIG. 13A is a block diagram depicting a second configuration example of a wireless communication device according to the third embodiment of the present invention, wherein the wireless communication device is in the package depicted in FIG. 4A. FIG. 13B is a diagram depicting a configuration example of a memory unit of the wireless communication device depicted in FIG. 13A. As depicted in FIG. 13B, the memory unit 141B has the memory elements 800a to 800d disposed so as to correspond to the receiving cavities 15a to 15d respectively, and the memory elements 800a to 800d are connected to the connecting lines 13a to 13d respectively, thereby enabling to information transmitted from the wireless communication device 16B to an external device to differ between before and after the connecting line 13 is cut as a result of opening the receiving cavity 15. This results in enabling the external device to sense whether the receiving cavity 15 is opened. FIG. 13B illustrates a 1-bit memory element 800 as a memory element corresponding to each receiving cavity 15, but without limitation to this, the memory unit 141B may have a multi-bit memory element (that is, a plurality of memory elements 800).

As depicted in FIG. 13B, the memory unit 141B has: a memory element 800, peripheral circuits 801 and 802, such as a decoder, which read information out of the memory element 800; and a word line 80. The connecting lines 13a to 13d are connected to the memory elements 800a to 800d and the peripheral circuits 801 and 802, passing above the sealed opening portions of the receiving cavities 15a to 15d. That is, the connecting lines 13a to 13d in the memory unit 141B are constituted by the bit lines connected to the memory elements 800a to 800d and by the wires passing above the opening portions of the above-mentioned receiving cavities 15a to 15d, and function as bit lines. The connecting lines 13a to 13d and the word line 80 are disposed so as to intersect, insulated from each other. The memory elements 800a to 800d are provided so as to correspond to the intersections between the word line 80 and the bit lines (first wires) included in the connecting lines 13a to 13d. In this regard, the wiring structure of the memory unit 141B, the arrangements of the memory elements 800a to 800d and the peripheral circuits 801 and 802, and the like are not limited to those illustrated in FIG. 13B.

In this regard, the configurations of the memory elements and the sense-of-opening method are the same as for the packages depicted in FIGS. 12A to 12C.

(Memory Unit Having Memory Array)

On the other hand, the memory unit 141 (see FIG. 10) of the wireless communication device 16 preferably further has a memory array having one or more additional memory elements arranged for recording unique information such as ID numbers as information other than information used to sense whether the above-mentioned receiving cavity 15 is opened (other information). That is, the wireless communication device 16 preferably has a memory array in the memory unit 141, wherein the memory array is formed by arranging a plurality of memory elements including: a memory element that records information capable of differing between before and after the connecting line 13 is cut; and a memory element that records unique information of the wireless communication device 16.

For example, unique information differing among a plurality of receiving cavities 15 is recorded in a memory array in each of a plurality of wireless communication devices 16 formed to correspond to each of the plurality of receiving cavities 15. Thus, this recordation makes it possible to individually sense whether each of the plurality of receiving cavities 15 is opened, and to carry out management.

The plurality of memory elements constituting the above-mentioned memory array are not limited to any particular kind, but may be rewritable memory elements such as RAMs (Random Access Memory) or read-only types of memory elements such as ROMs (Read Only Memory). The plurality of memory elements are preferably ROMs from the viewpoint of prevention of information falsification.

A mask ROM is known as a type of ROM, wherein the mask ROM has information written during production of a memory circuit, and wherein the memory elements corresponding to "0" information and "1" information to be recorded are separately produced by photolithographic processing. However, different masks are required for different commercial items (for example, packages) in cases where different pieces of unique information are written in different memory elements in accordance with different receiving cavities 15, as in the present invention. Because of this, the production cost of the memory array is increased. Accordingly, a method of forming a memory element is preferably a method in which the characteristics of the semiconductor layer of the thin film transistor 20 are separately produced by a coating method.

More specifically, the memory array employed for the memory unit 141 (see FIG. 10) has, on a substrate, the following: a plurality of first wires; at least one second wire intersecting the plurality of first wires; and a plurality of memory elements which are each provided so as to correspond to each of the intersections between the plurality of first wires and the at least one second wire. In this memory array, the plurality of memory elements each have a first electrode and a second electrode which are spaced from each other; a third electrode connected to one of the above-mentioned at least one second wire; and an insulating layer electrically insulating the first electrode and the second electrode from the third electrode. In addition, one of the first electrode and the second electrode is connected to one of the above-mentioned plurality of first wires. At least one of the plurality of memory elements has a coating layer in a region between the above-mentioned first electrode and the second electrode. The plurality of memory elements are composed of two different kinds of memory elements having different inter-electrode electrical characteristics of the above-mentioned first electrode and the second electrode, wherein the characteristics are differentiated by the above-mentioned coating layer. Information recorded in such a memory array (for example, unique information such as ID numbers) is determined by an arrangement formed by any combination of these memory elements of two kinds.

As above-mentioned, the "region between the first electrode and the second electrode" refers to a region positioned between the first electrode and the second electrode when the first electrode and the second electrode are planarly viewed across the thickness direction of the memory element.

(Third Configuration Example of Wireless Communication Device)

Figure 14A:
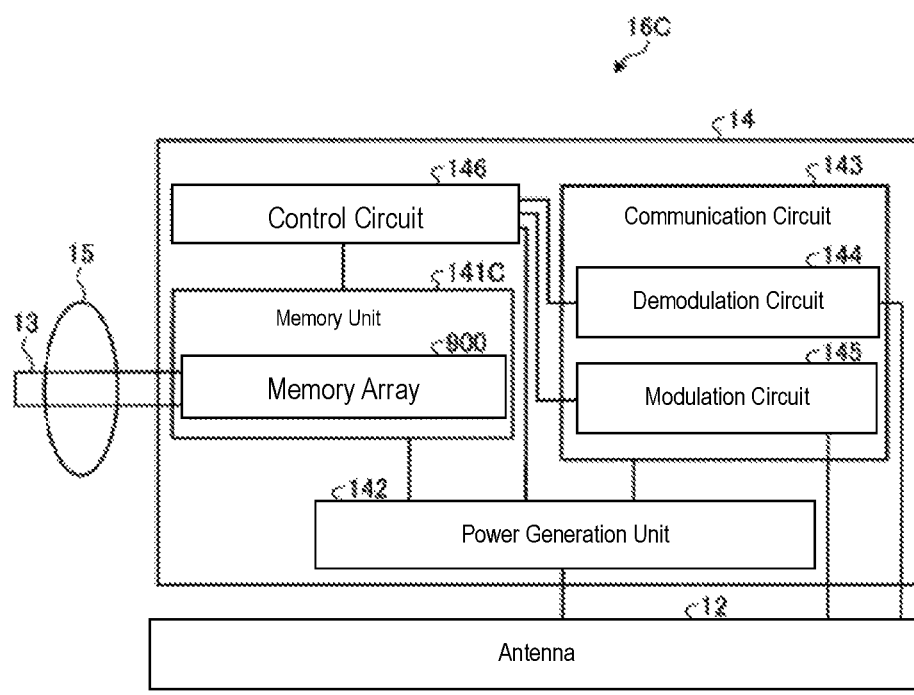
FIG. 14A is a block diagram depicting a third configuration example of the wireless communication device according to the third embodiment of the present invention.
Figure 14B:
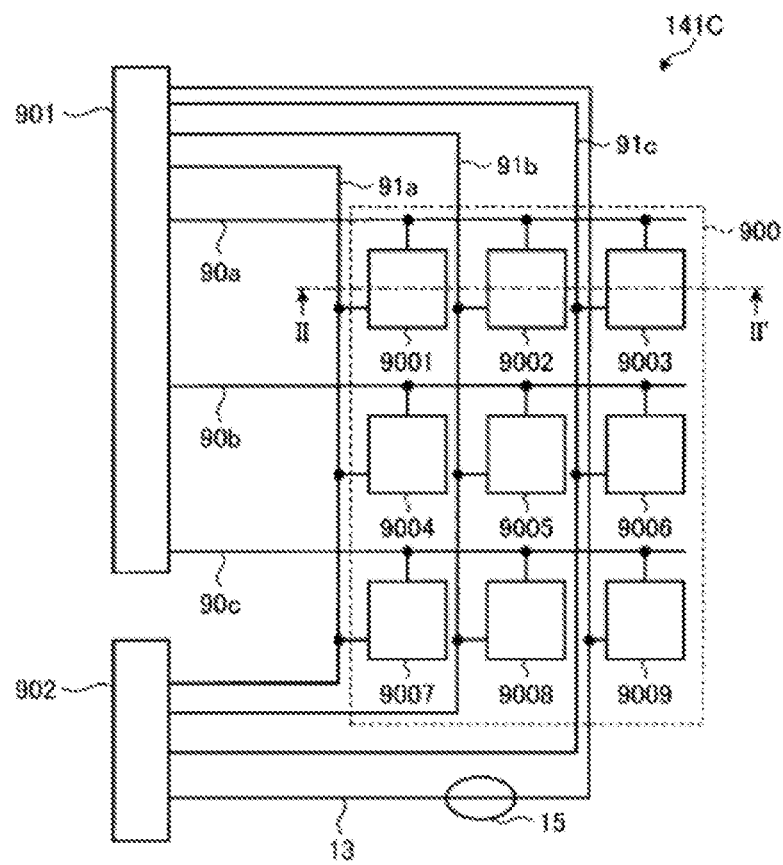
FIG. 14B is a diagram depicting a configuration example of a memory unit of the wireless communication device depicted in FIG. 14A.

FIG. 14A is a block diagram depicting a third configuration example of a wireless communication device according to the third embodiment of the present invention, wherein the wireless communication device is in the package depicted in FIG. 1A. FIG. 14B is a diagram depicting a configuration example of a memory unit of the wireless communication device depicted in FIG. 14A. FIGS. 14A and 14B illustrate a memory array 900, which is an arrangement of nine memory elements 9001 to 9009, as a memory array employed for a memory unit 141C of the wireless communication device 16C in this third example, but without limitation to this, the memory unit 141C may have a memory array formed by arranging a plurality of (two or more) memory elements.

As depicted in FIG. 14A, the wireless communication device 16C has the memory unit 141C as a circuit constituting part of the circuit unit 14. The memory unit 141C is an example of the memory unit 141 depicted in FIG. 10, and has the memory array 900. The connecting line 13 is connected to the memory array 900, passing above the sealed opening portion of the receiving cavity 15. The other constituents are the same as those of the wireless communication device 16 depicted in FIG. 10, and the same constituents are indicated by the same reference signs.

As depicted in FIG. 14B, the memory unit 141C has: a memory array 900, peripheral circuits 901 and 902, such as a decoder, which read information out of the memory array 900; three word lines 90a to 90c; three bit lines 91a to 91c; and a connecting line 13. The memory array 900 has nine memory elements 9001 to 9009. The connecting line 13 is connected to the memory element 9009 of the memory array 900 and the peripheral circuits 901 and 902, passing above the sealed opening portion of the receiving cavity 15. That is, the connecting line 13 in the memory unit 141C is constituted by a bit line connected to the memory element 9009 and by the wire passing above the opening portion of the above-mentioned receiving cavity 15, and functions as a bit line. In this regard, the wiring structure of the memory unit 141C, the arrangements of the memory elements 9001 to 9009 and the peripheral circuits 901 and 902, and the like are not limited to those illustrated in FIG. 14B.

The word lines 90a to 90c are an example of the above-mentioned at least one second wire. The word lines 90a to 90c, the longitudinal direction of which is predetermined, are arranged so as to be spaced from each other. Specifically, the word line 90a is connected to the peripheral circuit 901 and the memory elements 9001 to 9003. The word line 90b is connected to the peripheral circuit 901 and the memory elements 9004 to 9006. The word line 90c is connected to the peripheral circuit 901 and the memory elements 9007 to 9009. The bit lines 91a to 91c and the bit line contained in the connecting line 13 are an example of the above-mentioned plurality of first wires. The bit lines 91a to 91c and the bit line contained in the connecting line 13 are arranged so as to be spaced from each other, wherein the longitudinal direction of the lines intersects each of the word lines 90a to 90c. In addition, the word lines 90a to 90c are disposed so as to intersect the bit lines 91a to 91c and the bit line in the connecting line 13, insulated from each other.

The memory elements 9001 to 9009 are an example of a plurality of memory elements provided so as to correspond to the intersections between the above-mentioned first wires and the second wires. Specifically as depicted in FIG. 14B, the memory elements 9001 to 9008 are arranged in eight regions defined by the intersections between the word lines 90a to 90c and the bit lines 91a to 91c. The memory element 9009 is arranged in a region defined by the intersection between the word line 90c and the bit line in the connecting line 13.

It should be noted that FIG. 14B illustrates a memory array 900 for nine bits for simplicity of explanation, but it is obvious that the memory array 900 according to the third embodiment is not limited to any one for 9 bits but may be one for two or more bits. In addition, FIG. 14B illustrates, for simplicity of explanation, a 1-bit memory element as the memory element 9009 connected to the bit line in the connecting line 13, but it is obvious that the memory array 900 according to the third embodiment may have a multi-bit memory element as the memory element 9009 connected to the bit line in the connecting line 13.

Figure 14C:
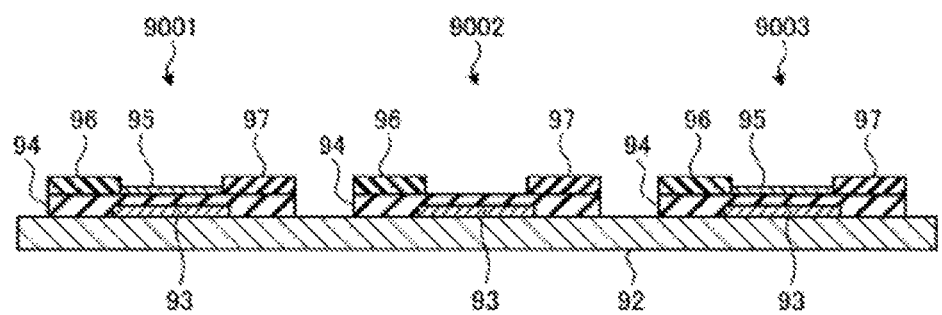
FIG. 14C is a cross-sectional view taken along line II-II' in the view of a memory array depicted in FIG. 14B.

FIG. 14C is a cross-sectional view taken along line II-II' in the view of the memory array depicted in FIG. 14B. FIG. 14C depicts a configuration example of the memory elements 9001 to 9003 as a representative of two kinds of memory elements constituting the memory array 900 according to the third embodiment.

As depicted in FIG. 14C, the memory elements 9001 to 9003, which are each an example of one of the above-mentioned two kinds of memory elements, are formed on a substrate 92. The memory elements 9001 to 9003 have a first electrode 96, a second electrode 97, an insulating layer 94, and a third electrode 93 on the substrate 92. The third electrode 93 is electrically insulated from the first electrode 96 and the second electrode 97 by the insulating layer 94. The first electrode 96 and the second electrode 97 are, for example, spaced from each other on the insulating layer 94. In this regard, the substrate 92 may be the sheet 11 (specifically the substrate 11b depicted in FIGS. 9A and 9B), or another insulating substrate.

In the third embodiment, the memory elements 9001 and 9003 and the memory element 9002 are an example of the two kinds of memory elements which have different inter-electrode electrical characteristics of the first electrode 96 and the second electrode 97. As depicted in FIG. 14C, the memory elements 9001 and 9003 which are memory elements of one of these two kinds further have a semiconductor layer 95 in a region between the first electrode 96 and the second electrode 97. The semiconductor layer 95 is an example of a coating layer composed of a semiconductor material and formed in a region between the first electrode 96 and the second electrode 97. The memory element 9002, which is of the other kind, has no semiconductor layer 95 in this region. In the third embodiment, whether the semiconductor layer 95 is formed in a region between the first electrode 96 and the second electrode 97 determines whether information recorded in each of the memory elements 9001 to 9003 is, for example, "0" or "1". That is, each of the memory elements 9001 to 9003 records information which differs according to whether the semiconductor layer 95 exists. The recorded information differs between the two kinds of memory elements in this manner, because the memory elements 9001 to 9003 having the semiconductor layer 95 is provided with an electric current flow, but the memory element 9002 having no semiconductor layer 95 is provided with no electric current flow, when each of the memory elements 9001 to 9003 is selected, that is, when the third electrode 93 of each of the memory elements 9001 to 9003 is provided with a given voltage.

In each of the memory elements 9001 to 9003, the third electrode 93 is, for example, a gate electrode, and is electrically connected, via wiring, to the word line 90a depicted in FIG. 14B. The first electrode 96 is, for example, a drain electrode.

The first electrode 96 in the memory element 9001 is electrically connected, via wiring, to the bit line 91a depicted in FIG. 14B. The first electrode 96 in the memory element 9002 is electrically connected, via wiring, to the bit line 91b depicted in FIG. 14B. The first electrode 96 in the memory element 9003 is electrically connected, via wiring, to the bit line 91c depicted in FIG. 14B. The second electrode 97 is, for example, a source electrode. In this regard, the second electrode 97 in each of the memory elements 9001 to 9003 is electrically connected, via wiring, to a reference potential line, which is not particularly shown.

Of the nine memory elements 9001 to 9009 constituting the memory array 900 depicted in FIG. 14B, the memory elements 9001 to 9008 have the same structure as one of the two kinds of memory elements 9001 and 9002 depicted in FIG. 14C. For example, in each of the memory elements 9004 to 9006, the third electrode 93 is electrically connected, via wiring, to the word line 90b. The first electrode 96 in the memory element 9004 is electrically connected, via wiring, to the bit line 91a. The first electrode 96 in the memory element 9005 is electrically connected, via wiring, to the bit line 91b. The first electrode 96 in the memory element 9006 is electrically connected, via wiring, to the bit line 91c. In addition, in each of the memory elements 9007 and 9008, the third electrode 93 is electrically connected, via wiring, to the word line 90c. The first electrode 96 in the memory element 9007 is electrically connected, via wiring, to the bit line 91a. The first electrode 96 in the memory element 9008 is electrically connected, via wiring, to the bit line 91b. In this regard, the second electrode 97 in each of the memory elements 9004 to 9008 is electrically connected, via wiring, to a reference potential line, which is not particularly shown.

In the memory array 900 depicted in FIG. 14B, the memory elements 9001 to 9008 are arranged in any combination of memory elements of the two kinds: a "memory element having a semiconductor layer 95" illustrated with the memory element 9001; and a "memory element having no semiconductor layer 95" illustrated with the memory element 9002. The arrangement determines what information is recorded. This determined information can be recorded in the memory array 900 as unique information, such as an ID number, unique to the memory array 900 (eventually, the receiving cavity 15 corresponding to the wireless communication device 16C having the memory array 900). For example, in the case where the eight memory elements 9001 to 9008 are arranged as [the memory element 9001, memory element 9002, memory element 9003, memory element 9004, memory element 9005, memory element 9006, memory element 9007, and memory element 9008], where the memory elements 9001, 9003, 9005, and 9007 have a semiconductor layer 95, and where the memory elements 9002, 9004, 9006, and 9008 have no semiconductor layer 95, information [1,0,1,0,1,0,1,0] or [0,1,0,1,0,1,0,1] is recorded as unique information in the memory array 900.

On the other hand, the memory element 9009 is formed to have the same structure as the memory element 9001 depicted in FIG. 14C, and has a semiconductor layer 95 between the first electrode 96 and the second electrode 97. In the memory element 9009, the third electrode 93 is electrically connected, via wiring, to the word line 90c, and the first electrode 96 is electrically connected, via wiring, to the bit line in the connecting line 13. In this case, the connecting line 13 functions as the bit line of the memory element 9009. In this regard, the second electrode 97 in the memory element 9009 is electrically connected, via wiring, to a reference potential line, which is not particularly shown.

Here, the connecting line 13 is in an uncut state when the receiving cavity 15 is not opened yet. In this state, a given voltage is applied to the third electrode 93 of the memory element 9009 via the word line 90c when the peripheral circuit 901 selects the memory element 9009 as an object for information read-out. As above-mentioned, this causes electric current between the first electrode 96 and the second electrode 97 in the memory element 9009 having a semiconductor layer 95. This electric current is detected by the peripheral circuit 902 via the connecting line 13. In this case, information read out of the memory element 9009 is defined as, for example, "1". On the other hand, when the receiving cavity 15 is opened, the connecting line 13 results in being cut at its part corresponding to the receiving cavity 15. When, in this state, the peripheral circuit 901 selects the memory element 9009 as an object for information read-out, the memory element 9009 having a semiconductor layer 95 is provided with an electric current flow as above-mentioned, but the peripheral circuit 902 is unable to detect this electric current flow. From the viewpoint of the peripheral circuit 902, this is the same state as in which the memory element 9009 is provided with no electric current. In this case, information read out of the memory element 9009 is defined as, for example, "0". That is, the information recorded in the memory array 900 (the information read out of the memory array 900) can be said to have varied between before and after the receiving cavity 15 is opened.

For example, in cases where the above-mentioned information is recorded in the memory elements 9001 to 9008, the information recorded in the memory array 900 before the receiving cavity 15 is opened is [1,0,1,0,1,0,1,0,1] or [0,1,0,1,0,1,0,1,0] in accordance with the memory elements 9001 to 9009 arranged as [the memory element 9001, memory element 9002, memory element 9003, memory element 9004, memory element 9005, memory element 9006, memory element 9007, memory element 9008, and memory element 9009]. On the other hand, the information recorded in the memory array 900 after the receiving cavity 15 is opened is [1,0,1,0,1,0,1,0,0] or [0,1,0,1,0,1,0,1,1] in accordance with the above-mentioned arrangement.

In the above-mentioned manner, information read out of the memory array 900 (that is, information previously recorded in the memory array 900) is varied between before and after the connecting line 13 is cut as a result of opening the receiving cavity 15, thereby enabling the wireless communication device 16C to maintain the information unique to the memory array 900 and, at the same time, transmit, to an external device, the unique information and the information that differs between before and after the connecting line 13 is cut. This results in enabling the external device to sense whether any of the plurality of receiving cavities 15 is opened, wherein the sensing is carried out for each receiving cavity 15 and can thus serve for management.

In this regard, the structure (TFT structure) of the memory elements 9001 to 9009 employed for the memory array 900 according to the above-mentioned third embodiment is, as illustrated in FIG. 14C, what is called a bottom-gate structure having the third electrode 93 disposed (on the substrate 92 side) below the semiconductor layer 95 and having the first electrode 96 and the second electrode 97 disposed on the same plane as the semiconductor layer 95 is disposed. However, the TFT structure that can be employed for the memory array 900 according to the third embodiment is not limited to this, but may be, for example, what is called a top-gate structure having the third electrode 93 disposed (on the opposite side from the substrate 92 side) above the semiconductor layer 95 and having the first electrode 96 and the second electrode 97 disposed on the same plane as the semiconductor layer 95 is disposed.

(Fourth Configuration Example of Wireless Communication Device)

Figure 15A:
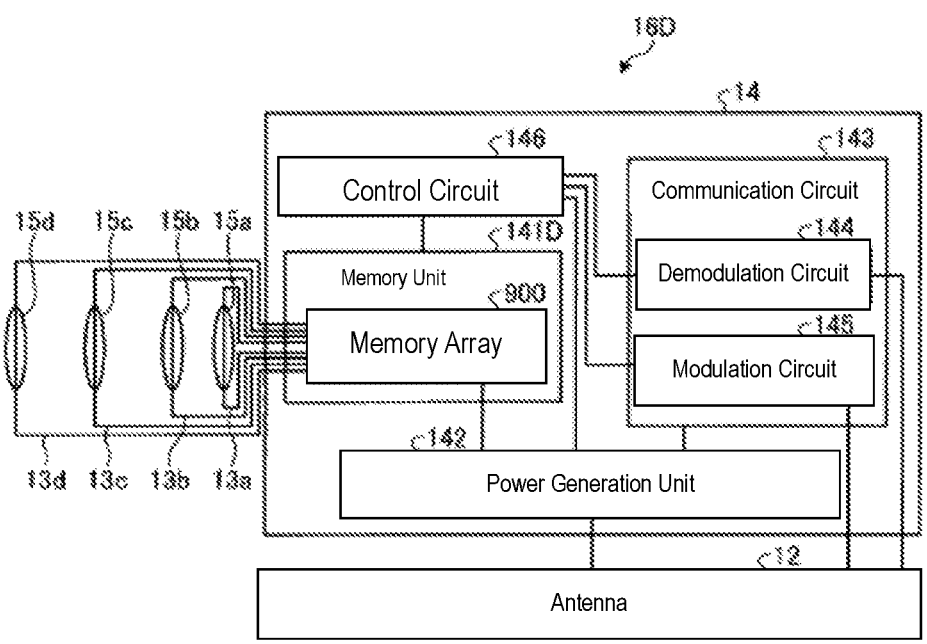
FIG. 15A is a block diagram depicting a fourth configuration example of the wireless communication device according to the third embodiment of the present invention.
Figure 15B:
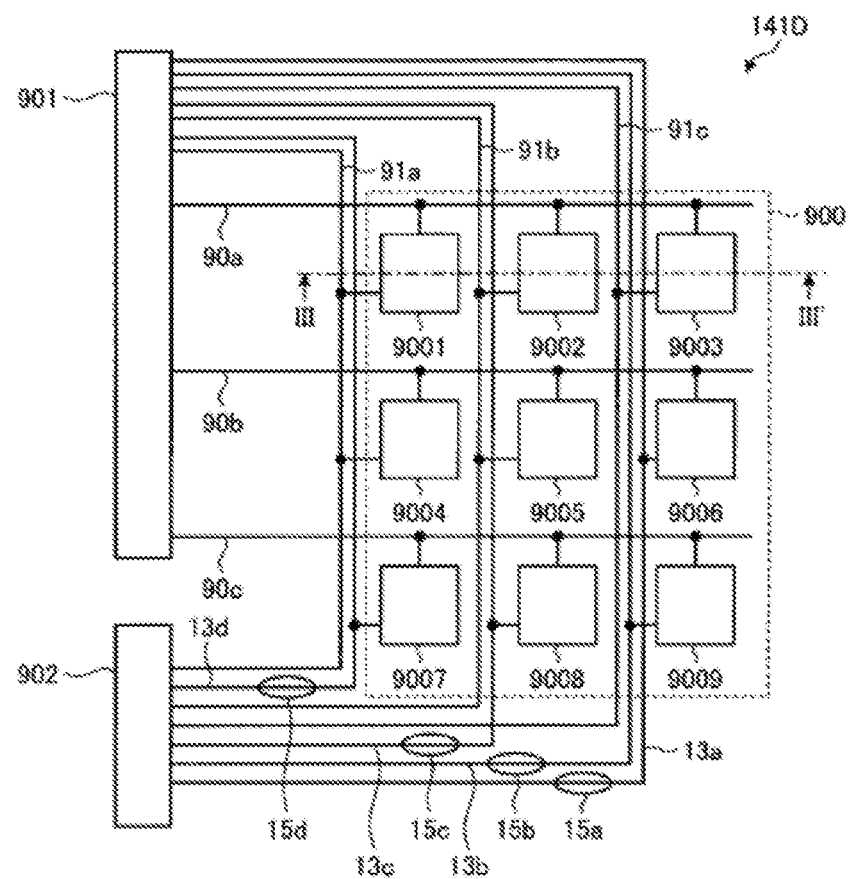
FIG. 15B is a diagram depicting a configuration example of a memory unit of the wireless communication device depicted in FIG. 15A.

FIG. 15A is a block diagram depicting a fourth configuration example of a wireless communication device according to the third embodiment of the present invention, wherein the wireless communication device is in the package depicted in FIG. 4A. FIG. 15B is a diagram depicting a configuration example of a memory unit of the wireless communication device depicted in FIG. 15A. FIGS. 15A and 15B illustrate a memory array 900, which is an arrangement of nine memory elements 9001 to 9009, as a memory array employed for a memory unit 141D of the wireless communication device 16D in this fourth example, but without limitation to this, the memory unit 141D may have a memory array formed by arranging a plurality of (two or more) memory elements.

As depicted in FIG. 15B, the memory unit 141D has: a memory array 900, peripheral circuits 901 and 902, such as a decoder, which read information out of the memory array 900; three word lines 90a to 90c; three bit lines 91a to 91c; and connecting lines 13a to 13d. The memory array 900 has nine memory elements 9001 to 9009. The connecting lines 13a to 13d are connected to the memory element 9009 of the memory array 900 and the peripheral circuits 901 and 902, passing above the sealed opening portions of the receiving cavities 15a to 15d. That is, the connecting lines 13a to 13d in the memory unit 141D are constituted by the bit lines connected to the memory elements 9006 to 9009 and by the wires passing above the opening portions of the above-mentioned receiving cavities 15a to 15d, and function as bit lines. In this regard, the wiring structure of the memory unit 141D, the arrangements of the memory elements 9001 to 9009 and the peripheral circuits 901 and 902, and the like are not limited to those illustrated in FIG. 15B.

The word lines 90a to 90c are an example of the above-mentioned at least one second wire. The word lines 90a to 90c, the longitudinal direction of which is predetermined, are arranged so as to be spaced from each other. Specifically, the word line 90a is connected to the peripheral circuit 901 and the memory elements 9001 to 9003. The word line 90b is connected to the peripheral circuit 901 and the memory elements 9004 to 9006. The word line 90c is connected to the peripheral circuit 901 and the memory elements 9007 to 9009. The bit lines 91a to 91c and the bit lines contained in the connecting lines 13a to 13d are an example of the above-mentioned plurality of first wires. The bit lines 91a to 91c and the bit lines contained in the connecting lines 13a to 13d are arranged so as to be spaced from each other, wherein the longitudinal direction of the lines intersects each of the word lines 90a to 90c. In addition, the word lines 90a to 90c are disposed so as to intersect the bit lines 91a to 91c and the bit line in the connecting lines 13a to 13d, insulated from each other.

The memory elements 9001 to 9009 are an example of a plurality of memory elements provided so as to correspond to the intersections between the above-mentioned first wires and the second wires. Specifically as depicted in FIG. 15B, the memory elements 9001 to 9005 are arranged in five regions defined by the intersections between the word lines 90a to 90c and the bit lines 91a to 91c. The memory element 9006 is arranged in a region defined by the intersection between the word line 90b and the bit line in the connecting line 13a. The memory element 9007 is arranged in a region defined by the intersection between the word line 90c and the bit line in the connecting line 13d. The memory element 9008 is arranged in a region defined by the intersection between the word line 90c and the bit line in the connecting line 13c. The memory element 9009 is arranged in a region defined by the intersection between the word line 90c and the bit line in the connecting line 13b.

It should be noted that FIG. 15B illustrates a memory array 900 for nine bits for simplicity of explanation, but it is obvious that the memory array 900 according to the third embodiment is not limited to any one for 9 bits but may be one for two or more bits. In addition, FIG. 15B illustrates, for simplicity of explanation, 1-bit memory elements as the memory elements 9006 to 9009 connected to the bit lines in the connecting lines 13a to 13d, but it is obvious that the memory array 900 according to the third embodiment may have multi-bit memory elements as the memory elements 9006 to 9009 connected to the bit lines in the connecting lines 13a to 13d.

The cross-sectional view taken along line III-III' in the view of the memory array 900 depicted in FIG. 15B is the same as the cross-sectional view depicted in FIG. 14C. In addition, the configurations of the memory elements and the sense-of-opening method are the same as for the package depicted in FIGS. 14A to 14C.

That is, in the memory array 900 depicted in FIG. 15B, the memory elements 9001 to 9005 are arranged in any combination of memory elements of the two kinds: a "memory element having a semiconductor layer 95" illustrated with the memory element 9001 depicted in FIG. 14C; and a "memory element having no semiconductor layer 95" illustrated with the memory element 9002. The arrangement determines what information is recorded. This determined information can be recorded in the memory array 900 as unique information, such as an ID number, unique to the memory array 900 (eventually, the receiving cavity 15 corresponding to the wireless communication device 16D having the memory array 900). For example, in the case where the five memory elements 9001 to 9005 are arranged as [the memory element 9001, memory element 9002, memory element 9003, memory element 9004, and memory element 9005], where the memory elements 9001, 9003, and 9005 have a semiconductor layer 95, and where the memory elements 9002 and 9004 have no semiconductor layer 95, information [1,0,1,0,1] or [0,1,0,1,0] is recorded as unique information in the memory array 900.

On the other hand, the memory elements 9006 to 9009 are formed to have the same structure as the memory element 9001 depicted in FIG. 14C, and has a semiconductor layer between the first electrode 96 and the second electrode 97. In the memory elements 9006 to 9009, the third electrodes 93 are electrically connected, via wiring, to the word lines 90b and 90c, and the first electrodes 96 are electrically connected, via wiring, to the bit lines in the connecting lines 13a to 13d. In this case, the connecting lines 13 function as the bit lines of the memory elements 9006 to 9009. In this regard, the second electrodes 97 in the memory elements 9006 to 9009 are electrically connected, via wiring, to a reference potential line, which is not particularly shown.

Here, the connecting lines 13a to 13d are in an uncut state when the receiving cavities 15a to 15d are not opened yet. In this state, a given voltage is applied to the third electrode 93 of each of the memory elements 9006 to 9009 via the word lines 90b and 90c when the peripheral circuit 901 selects the memory elements 9006 to 9009 as objects out of which information is read. At this time, as above-mentioned, this causes electric current between the first electrode 96 and the second electrode 97 in each of the memory elements 9006 to 9009 having a semiconductor layer 95.

This electric current is detected by the peripheral circuit 902 via the connecting lines 13a to 13d. In this case, information read out of the memory elements 9006 to 9009 is defined as, for example, "1". On the other hand, when the receiving cavities 15a to 15d are opened, the connecting lines 13a to 13d result in being cut at their parts corresponding to the receiving cavities 15a to 15d. When, in this state, the peripheral circuit 901 selects the memory elements 9006 to 9009 as objects out of which information is read, the memory elements 9006 to 9009 having a semiconductor layer is provided with an electric current flow as above-mentioned, but the peripheral circuit 902 is unable to detect this electric current flow. Therefore, when viewed from the peripheral circuit 902, this is the same state as in which the memory elements 9006 to 9009 are provided with no electric current. In this case, information read out of the memory elements 9006 to 9009 is defined as, for example, "0". That is, the information recorded in the memory array 900 (the information read out of the memory array 900) can be said to have varied between before and after the receiving cavity 15 is opened.

For example, in cases where the above-mentioned information recorded in the memory elements 9001 to 9005, the information recorded in the memory array 900 before the receiving cavity 15 is opened is [1,0,1,0,1,1,1,1,1] or [0,1,0,1,0,0,0,0,0] in accordance with the memory elements 9001 to 9009 arranged as [the memory element 9001, memory element 9002, memory element 9003, memory element 9004, memory element 9005, memory element 9006, memory element 9007, memory element 9008, and memory element 9009]. On the other hand, the information recorded in the memory array 900 after the receiving cavities 15a to 15d is opened is [1,0,1,0,1,0,0,0,0] or [0,1,0,1,0,1,1,1,1] in accordance with the above-mentioned arrangement.

In the above-mentioned manner, information read out of the memory array 900 (that is, information previously recorded in the memory array 900) is varied between before and after the above-mentioned connecting lines 13a to 13d are cut as a result of opening the receiving cavities 15a to 15d, thereby enabling the wireless communication device 16D to maintain the information unique to the memory array 900 and, at the same time, transmit, to an external device, the unique information and the information that differs between before and after the connecting lines 13 are cut. This results in enabling the external device to sense whether the plurality of receiving cavities 15a to 15d are opened, and the sensing can thus serve for management.

(Fifth Configuration Example of Wireless Communication Device)

Figure 16A:
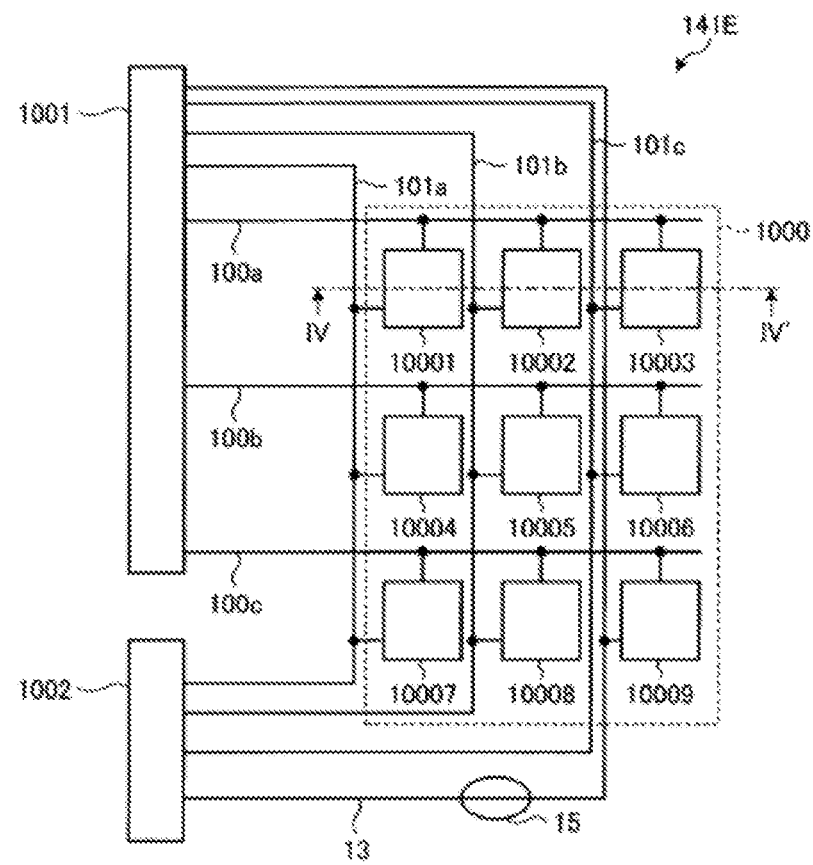
FIG. 16A is a diagram depicting a configuration example of a memory unit employed for a fifth example of the wireless communication device according to the third embodiment of the present invention.

In addition, examples of memory arrays employed for the memory unit 141E (see FIG. 10) of the wireless communication device 16 include memory arrays having the below-mentioned structure, other than the memory array 900 having the structure depicted in FIG. 14B or 14C. FIG. 16A is, in reference to the package 10 depicted in FIG. 1A, a diagram depicting a configuration example of a memory unit employed for a fifth example of a wireless communication device according to the third embodiment of the present invention.

In this regard, the wireless communication device in this fifth example includes, as an example of the memory unit 141E, a memory unit 141E having a memory array 1000, and is configured in the same manner as the wireless communication device 16C depicted in FIG. 14A except that the connecting line 13 is connected to the memory array 1000, although the configuration is not depicted in FIG. 16A. FIG. 16A illustrates a memory array 1000, which is an arrangement of nine memory elements 10001 to 10009, as a memory array employed for the memory unit 141E in this fifth example, but without limitation to this, the memory unit 141E may have a memory array formed by arranging a plurality of (two or more) memory elements.

As depicted in FIG. 16A, the memory unit 141E has: a memory array 1000, peripheral circuits 1001 and 1002, such as a decoder, which read information out of the memory array 1000; three word lines 100a to 100c; three bit lines 101a to 101c, and a connecting line 13. The memory array 1000 has nine memory elements 10001 to 10009. The connecting line 13 is connected to the memory element 10009 of the memory array 1000 and the peripheral circuits 1001 and 1002, passing above the sealed opening portion of the receiving cavity 15. That is, the connecting line 13 in the memory unit 141E is constituted by a bit line connected to the memory element 10009 and by the wire passing above the opening portion of the above-mentioned receiving cavity 15, and functions as a bit line. In this regard, the wiring structure of the memory unit 141E, the arrangements of the memory elements 10001 to 10009 and the peripheral circuits 1001 and 1002, and the like are not limited to those illustrated in FIG. 16A.

The word lines 100a to 100c are an example of the above-mentioned at least one second wire. The word lines 100a to 100c, the longitudinal direction of which is predetermined, are arranged so as to be spaced from each other. Specifically, the word line 100a is connected to the peripheral circuit 1001 and the memory elements 10001 to 10003. The word line 100b is connected to the peripheral circuit 1001 and the memory elements 10004 to 10006. The word line 100c is connected to the peripheral circuit 1001 and the memory elements 10007 to 10009. The bit lines 101a to 101c and the bit line contained in the connecting line 13 are an example of the above-mentioned plurality of first wires. The bit lines 101a to 101c and the bit line contained in the connecting line 13 are arranged so as to be spaced from each other, wherein the longitudinal direction of the lines intersects each of the word lines 100a to 100c. In addition, the word lines 100a to 100c are disposed so as to intersect the bit lines 101a to 101c and the bit line in the connecting line 13, insulated from each other.

The memory elements 10001 to 10009 are an example of a plurality of memory elements provided so as to correspond to the intersections between the above-mentioned first wires and the second wires. Specifically as depicted in FIG. 16A, the memory elements 10001 to 10008 are arranged in eight regions defined by the intersections between the word lines 100a to 100c and the bit lines 101a to 101c. The memory element 10009 is arranged in a region defined by the intersection between the word line 100c and the bit line in the connecting line 13.

Figure 16B:
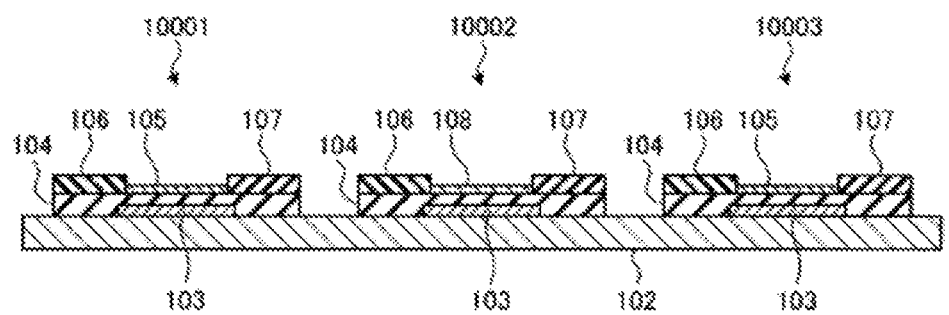
FIG. 16B is a cross-sectional view taken along line IV-IV' in the view of a memory array depicted in FIG. 16A.

FIG. 16B is a cross-sectional view taken along line IV-IV' in the view of the memory array depicted in FIG. 16A. FIG. 16B depicts a configuration example of the memory elements 10001 to 10003 as a representative of two kinds of memory elements constituting the memory array 1000 according to the third embodiment.

As depicted in FIG. 16B, the memory elements 10001 to 10003, which are each an example of one of the above-mentioned two kinds of memory elements, are formed on a substrate 102. The memory elements 10001 to 10003 have a first electrode 106, a second electrode 107, an insulating layer 104, and a third electrode 103 on the substrate 102. The third electrode 103 is electrically insulated from the first electrode 106 and the second electrode 107 by the insulating layer 104. The first electrode 106 and the second electrode 107 are, for example, spaced from each other on the insulating layer 104.

In addition, the memory elements 10001 to 10003 further have, in a region between the first electrode 106 and the second electrode 107, one of the semiconductor layers 105 and 108 which have different electrical characteristics. The semiconductor layers 105 and 108 are each an example of a coating layer composed of a semiconductor material and formed in a region between the first electrode 106 and the second electrode 107. The memory elements 10001 to 10003 as above-mentioned are distinguished, according to which of the semiconductor layers 105 and 108 the memory elements have, into two different kinds of memory elements having different inter-electrode electrical characteristics of the first electrode 106 and the second electrode 107. For example, of these two kinds of memory elements, the memory elements of one kind are the memory elements 10001 and 10003 having a first semiconductor layer, and the memory element of the other kind is the memory element 10002 having a second semiconductor layer. These memory elements 10001 and 10003 of one kind and the memory element 10002 of the other kind record information, which differs between each other (for example, "0" or "1"), in accordance with the difference in electrical characteristics between the semiconductor layers 105 and 108. In this regard, the substrate 102 may be the sheet 11 (specifically the substrate 11b depicted in FIGS. 9A and 9B), or another insulating substrate.

In each of the memory elements 10001 to 10003, the third electrode 103 is, for example, a gate electrode, and is electrically connected, via wiring, to the word line 100a depicted in FIG. 16A. The first electrode 106 is, for example, a drain electrode. The first electrode 106 in the memory element 10001 is electrically connected, via wiring, to the bit line 101a depicted in FIG. 16A. The first electrode 106 in the memory element 10002 is electrically connected, via wiring, to the bit line 101b depicted in FIG. 16A. The first electrode 106 in the memory element 10003 is electrically connected, via wiring, to the bit line 101c depicted in FIG. 16A. The second electrode 107 is, for example, a source electrode. In this regard, the second electrode 107 in each of the memory elements 10001 to 10003 is electrically connected, via wiring, to a reference potential line, which is not particularly shown.

Of the nine memory elements 10001 to 10009 constituting the memory array 1000 depicted in FIG. 16A, the memory elements 10001 to 10008 have the same structure as one of the two kinds of memory elements 10001 and 10002 depicted in FIG. 16B. For example, in each of the memory elements 10004 to 10006, the third electrode 103 is electrically connected, via wiring, to the word line 100b. The first electrode 106 in the memory element 10004 is electrically connected, via wiring, to the bit line 101a. The first electrode in the memory element 10005 is electrically connected, via wiring, to the bit line 101b. The first electrode in the memory element 10006 is electrically connected, via wiring, to the bit line 101c. In addition, in each of the memory elements 10007 and 10008, the third electrode is electrically connected, via wiring, to the word line 100c. The first electrode in the memory element 10007 is electrically connected, via wiring, to the bit line 101a. The first electrode in the memory element 10008 is electrically connected, via wiring, to the bit line 101b. In this regard, the second electrode 107 in each of the memory elements 10004 to 10008 is electrically connected, via wiring, to a reference potential line, which is not particularly shown.

In particular, the memory elements 10001 to 10008 have one of the first semiconductor layer and the second semiconductor layer which have electrical characteristics different between each other, as illustrated with the above-mentioned semiconductor layers 105 and 108 (see FIG. 16B). This determines information, for example, "0" or "1", recorded in each of the memory elements 10001 to 10008.

That is, assuming that, of the two kinds of memory elements constituting the memory array 1000, a memory element having a first semiconductor layer (for example, a semiconductor layer 105) is a memory element (a), and that a memory element having a second semiconductor layer (for example, a semiconductor layer 108) is a memory element (b), the first semiconductor layer and the second semiconductor layer according to the third embodiment have electrical characteristics different between each other, and thus, the memory element (a) and the memory element (b) each record different information in accordance with the difference in electrical characteristics between the first semiconductor layer and the second semiconductor layer.

The above-mentioned "difference in electrical characteristics" means a difference between these memory elements (a) and (b) in the value of the electric current caused between the first electrode 106 and the second electrode 107 when the memory elements (a) and (b) are each selected, that is, when a given voltage is applied to the third electrode 103 of each of the memory elements (a) and (b). Such a difference in electric current makes it possible to distinguish between the "0" state and "1" state of each of the memory element (a) and memory element (b). To carry out this distinction sufficiently, one value is preferably 100 times or more, more preferably 1000 times or more, greater than the other, wherein the values are: the value of electric current caused between the first electrode 106 and second electrode 107 in the memory element which has recorded "1", and the value of electric current caused between the first electrode 106 and second electrode 107 in the memory element which has recorded "0".

In the memory array 1000, the unique information of the memory array 1000 is determined and recorded in accordance with the arrangement of the eight memory elements 10001 to 10008 composed of these two kinds of memory elements (a) and (b), wherein the arrangement is [the memory element 10001, memory element 10002, memory element 10003, memory element 10004, memory element 10005, memory element 10006, memory element 10007, and memory element 10008].

On the other hand, the memory element 10009 connected to the bit line in the connecting line 13 is one of the two kinds of memory elements (a) and (b) which have, in a region between the first electrode 106 and the second electrode 107, a semiconductor layer having electric current caused between the first electrode 106 and the second electrode 107, wherein the value of the electric current in the one memory element is higher than in the other. The other configurations are the same as in the memory elements 10001 to 10003 depicted in FIG. 16B.

Here, the connecting line 13 is in an uncut state when the receiving cavity 15 is not opened yet. In this state, a given voltage is applied to the third electrode of the memory element 10009 via the word line 100c when the peripheral circuit 1001 selects the memory element 10009 as an object for information read-out. At this time, as above-mentioned, this causes electric current between the first electrode and the second electrode in the memory element 10009 having a semiconductor layer. This electric current is detected by the peripheral circuit 1002 via the connecting line 13. In this case, information read out of the memory element 10009 is defined as, for example, "1".

On the other hand, when the receiving cavity 15 is opened, the connecting line 13 results in being cut at its part corresponding to the receiving cavity 15. When, in this state, the peripheral circuit 1001 selects the memory element 10009 as an object for information read-out, the memory element 10009 is provided with an electric current flow as above-mentioned, but the peripheral circuit 1002 is unable to detect this electric current flow. Therefore, when viewed from the peripheral circuit 1002, this results in the same state as in which the electric current caused in the memory element 10009 is smaller than before the connecting line 13 is cut. This means substantially the same thing as that the memory element 10009 is one of the above-mentioned two kinds of memory elements (a) and (b) which has a semiconductor layer having electric current caused between the first electrode 106 and the second electrode 107, wherein the value of the electric current in the one memory element is lower than in the other. That is, the information recorded in the memory element 10009 can be said to have varied between before and after the receiving cavity 15 is opened. In this case, information read out of the memory element 10009 is defined as, for example, "0".

For example, in cases where unique information of the memory array 1000 has been recorded in the memory elements 10001 to 10008, the information recorded in the memory array 1000 before the receiving cavity 15 is opened is [unique information, 1] in accordance with the arrangement of the memory elements 10001 to 10009. On the other hand, the information recorded in the memory array 1000 after the receiving cavity 15 is opened is [unique information, 0] in accordance with the above-mentioned arrangement.

In the above-mentioned manner, information read out of the memory array 1000 (that is, information previously recorded in the memory array 1000) is varied between before and after the connecting line 13 is cut as a result of opening the receiving cavity 15, thereby enabling the wireless communication device 16 having the memory array 1000 in the memory unit 141E to maintain the information unique to the memory array 1000 and, at the same time, transmit, to an external device, the unique information and the information that differs between before and after the above-mentioned connecting line 13 is cut. This results in enabling the external device to sense whether any of the plurality of receiving cavities 15 is opened, wherein the sensing is carried out for each receiving cavity 15 and can thus serve for management.

In this regard, the TFT structure of the memory elements 10001 to 10009 employed for the memory array 1000 according to the above-mentioned third embodiment is, as illustrated in FIG. 16B, what is called a bottom-gate structure. However, the TFT structure that can be employed for the memory array 1000 according to the third embodiment is not limited to this but may be what is called a top-gate structure.

In addition, the electrical characteristics differ between the semiconductor layer 105 and the semiconductor layer 108 that are depicted in FIG. 16B preferably because the configuration differs between them. Examples of differences in configuration between the first semiconductor layer and the second semiconductor layer in the third embodiment include a difference in film thickness between the semiconductor layers, a difference in the semiconductor material constituting the semiconductor layer, and the like. Besides, a difference in configuration between the first semiconductor layer and the second semiconductor layer is not limited to these as long as the difference causes the electrical characteristics to sufficiently differ between the first semiconductor layer and the second semiconductor layer.

Examples of differences in the semiconductor material constituting the semiconductor layer include: cases where the second semiconductor layer contains a semiconductor material different from the material of the first semiconductor layer, for example, cases where the semiconductor material constituting the second semiconductor layer has a higher mobility than the semiconductor material constituting the first semiconductor layer; cases where a semiconductor material resulting in an enhancement type is used for the first semiconductor layer, and where a semiconductor material resulting in a depression type is used for the second semiconductor layer; and the like.

Examples of differences in film thickness between the semiconductor layers include: cases where the film thickness of the second semiconductor layer is larger than the film thickness of the first semiconductor layer; and the like. This causes the resistivity to differ between the second semiconductor layer and the first semiconductor layer. This enables the value of electric current caused between the first electrode and the second electrode to differ between the memory elements, when a given voltage is applied to the third electrode of each of the memory elements.

In addition, in cases where the first semiconductor layer and the second semiconductor layer each contain CNTs as a semiconductor material, causing the concentration of the contained CNTs to differ between them enables the electrical characteristics to sufficiently differ between the first semiconductor layer and the second semiconductor layer. For example, making the CNT concentration of the semiconductor layer 105 (the first semiconductor layer) higher than the CNT concentration of the semiconductor layer 108 (the second semiconductor layer) more easily causes electric current between the first electrode 106 and the second electrode 107 in the memory element having the semiconductor layer 105 having the higher CNT concentration than in the other memory element.

The above-mentioned CNT concentration refers to the number of CNTs present in any 1 μm² region in the semiconductor layer. Examples of methods of measuring the number of CNTs include a method in which any 1 μm² region is selected from an image of a semiconductor layer, wherein the image is obtained using an atomic force microscope, a scanning electron microscope, a transmission electron microscope, and the like, and in which the total number of CNTs contained in the region is counted.

(Sixth Configuration Example of Wireless Communication Device)

Figure 17:
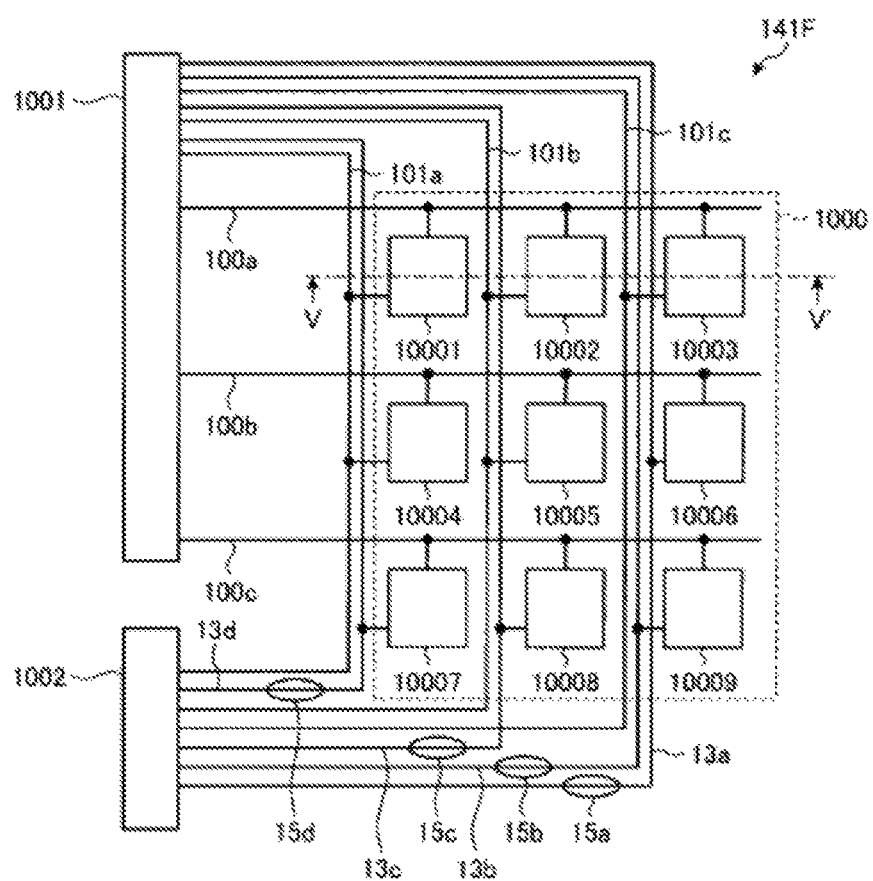
FIG. 17 is a diagram depicting a configuration example of a memory unit employed for a sixth example of the wireless communication device according to the third embodiment of the present invention.

FIG. 17 is, in reference to the package 10A depicted in FIG. 4A, a diagram depicting a configuration example of a memory unit employed for a sixth configuration example of a wireless communication device according to the third embodiment of the present invention. FIG. 17 illustrate a memory array 1000, which is an arrangement of nine memory elements 10001 to 10009, as a memory array employed for a memory unit 141F of the wireless communication device 16D in this sixth example, but without limitation to this, the memory unit 141F may have a memory array formed by arranging a plurality of (two or more) memory elements.

As depicted in FIG. 17, the memory unit 141F has: a memory array 1000, peripheral circuits 1001 and 1002, such as a decoder, which read information out of the memory array 1000; three word lines 100a to 100c; three bit lines 101a to 101c; and connecting lines 13a to 13d. The memory array 1000 has nine memory elements 10001 to 10009. The connecting lines 13a to 13d are connected to the memory elements 10006 to 10009 of the memory array 1000 and the peripheral circuits 1001 and 1002, passing above the sealed opening portions of the receiving cavities 15a to 15d. That is, the connecting lines 13a to 13d in the memory unit 141F are constituted by the bit lines connected to the memory elements 10006 to 10009 and by the wires passing above the opening portions of the above-mentioned receiving cavities 15a to 15d, and function as bit lines. In this regard, the wiring structure of the memory unit 141F, the arrangements of the memory elements 10001 to 10009 and the peripheral circuits 1001 and 1002, and the like are not limited to those illustrated in FIG. 17.

The word lines 100a to 100c are an example of the above-mentioned at least one second wire. The word lines 100a to 100c, the longitudinal direction of which is predetermined, are arranged so as to be spaced from each other. Specifically, the word line 100a is connected to the peripheral circuit 1001 and the memory elements 10001 to 10003. The word line 100b is connected to the peripheral circuit 1001 and the memory elements 10004 to 10006. The word line 100c is connected to the peripheral circuit 1001 and the memory elements 10007 to 10009. The bit lines 101a to 101c and the bit lines contained in the connecting lines 13a to 13d are an example of the above-mentioned plurality of first wires. The bit lines 101a to 101 c and the bit lines contained in the connecting lines 13a to 13d are arranged so as to be spaced from each other, wherein the longitudinal direction of the lines intersects each of the word lines 100a to 100c. In addition, the word lines 100a to 100c are disposed so as to intersect the bit lines 101a to 101c and the bit line in the connecting lines 13a to 13d, insulated from each other.

The memory elements 10001 to 10009 are an example of a plurality of memory elements provided so as to correspond to the intersections between the first wires and the second wires. Specifically as depicted in FIG. 17, the memory elements 10001 to 10005 are arranged in five regions defined by the intersections between the word lines 100a to 100c and the bit lines 101a to 101c. The memory element 10006 is arranged in a region defined by the intersection between the word line 100b and the bit line in the connecting line 13a. The memory element 10007 is arranged in a region defined by the intersection between the word line 100c and the bit line in the connecting line 13d. The memory element 10008 is arranged in a region defined by the intersection between the word line 100c and the bit line in the connecting line 13c. The memory element 10009 is arranged in a region defined by the intersection between the word line 100c and the bit line in the connecting line 13b.

The cross-sectional view taken along line V-V' in the view of the memory array depicted in FIG. 17 is the same as the cross-sectional view depicted in FIG. 16B. In addition, the configurations of the memory elements and the sense-of-opening method are the same as for the package depicted in FIGS. 16A and 16B. In particular, the memory elements 10001 to 10005 have one of the first semiconductor layer and the second semiconductor layer which have electrical characteristics different between each other, as illustrated with the above-mentioned semiconductor layers 105 and 108 (see FIG. 16B). This determines information, for example, "0" or "1", recorded in each of the memory elements 10001 to 10008.

In the memory array 1000, the unique information of the memory array 1000 is determined and recorded in accordance with the arrangement of the eight memory elements 10001 to 10005 composed of these two kinds of memory elements (a) and (b), wherein the arrangement is [the memory element 10001, memory element 10002, memory element 10003, memory element 10004, and memory element 10005].

In addition, the memory elements 10006 to 10009 connected to the bit lines in the connecting lines 13a to 13d are each one of the above-mentioned two kinds of memory elements (a) and (b) which have, in a region between the first electrode 106 and the second electrode 107, a semiconductor layer having electric current caused between the first electrode 106 and the second electrode 107, wherein the value of the electric current in the one memory element is higher than in the other. The other configurations are the same as in the memory elements 10001 to 10003 depicted in FIG. 16B.

Here, the connecting lines 13a to 13d are in an uncut state when the receiving cavities 15a to 15d are not opened yet. In this state, a given voltage is applied to the third electrode 103 of each of the memory elements 10006 to 10009 via the word line 100c when the peripheral circuit 1001 selects the memory element 10009 as an object for information readout. At this time, as above-mentioned, this causes electric current between the first electrode 106 and the second electrode 107 in each of the memory elements 10006 to 10009 having a semiconductor layer. This electric current is detected by the peripheral circuit 1002 via the connecting lines 13a to 13d. In this case, information read out of the memory elements 10006 to 10009 is defined as, for example, "1".

On the other hand, when the receiving cavities 15a to 15d are opened, the connecting lines 13a to 13d result in being cut at their parts corresponding to the receiving cavities 15a to 15d. When, in this state, the peripheral circuit 1001 selects the memory elements 10006 to 10009 as objects out of which information is read, the memory elements 10006 to 10009 are provided with an electric current flow as above-mentioned, but the peripheral circuit 1002 is unable to detect this electric current flow. Therefore, when viewed from the peripheral circuit 1002, this results in the same state as in which the electric current caused in each of the memory elements 10006 to 10009 is smaller than before the connecting lines 13a to 13d are cut respectively. This means substantially the same thing as that the memory elements 10006 to 10009 are each one of the above-mentioned two kinds of memory elements (a) and (b) which has a semiconductor layer having electric current caused between the first electrode 106 and the second electrode 107, wherein the value of the electric current in the one memory element is lower than in the other. That is, the information recorded in the memory elements 10006 to 10009 can be said to have varied between before and after the receiving cavities 15a to 15d are opened. In this case, information read out of the memory elements 10006 to 10009 is defined as, for example, "0".

For example, in cases where unique information of the memory array 1000 has been recorded in the memory elements 10001 to 10005, the information recorded in the memory array 1000 before the receiving cavities 15a to 15d are opened is [unique information, 1,1,1,1] in accordance with the arrangement of the memory elements 10001 to 10009. On the other hand, the information recorded in the memory array 1000 after the receiving cavities 15a to 15d are all opened is [unique information, 0,0,0,0] in accordance with the above-mentioned arrangement.

In the above-mentioned manner, information read out of the memory array 1000 (that is, information previously recorded in the memory array 1000) is varied between before and after the connecting lines 13a to 13d are cut as a result of opening the receiving cavities 15a to 15d, thereby enabling the wireless communication device 16D having the memory array 1000 in the memory unit 141F to maintain the information unique to the memory array 1000 and, at the same time, transmit, to an external device, the unique information and the information that differs between before and after the connecting lines 13 are cut. This results in enabling the external device to sense whether the plurality of receiving cavities 15a to 15d are opened, and the sensing can thus serve for management.

In addition, examples of memory arrays employed for the memory unit 141 (see FIG. 10) of the wireless communication device 16 include memory arrays having the below-mentioned structure, other than in depicted in FIGS. 14B, 14C, 15B, 16A, 16B, and 17.

(Seventh Configuration Example of Wireless Communication Device)

Figure 18A:
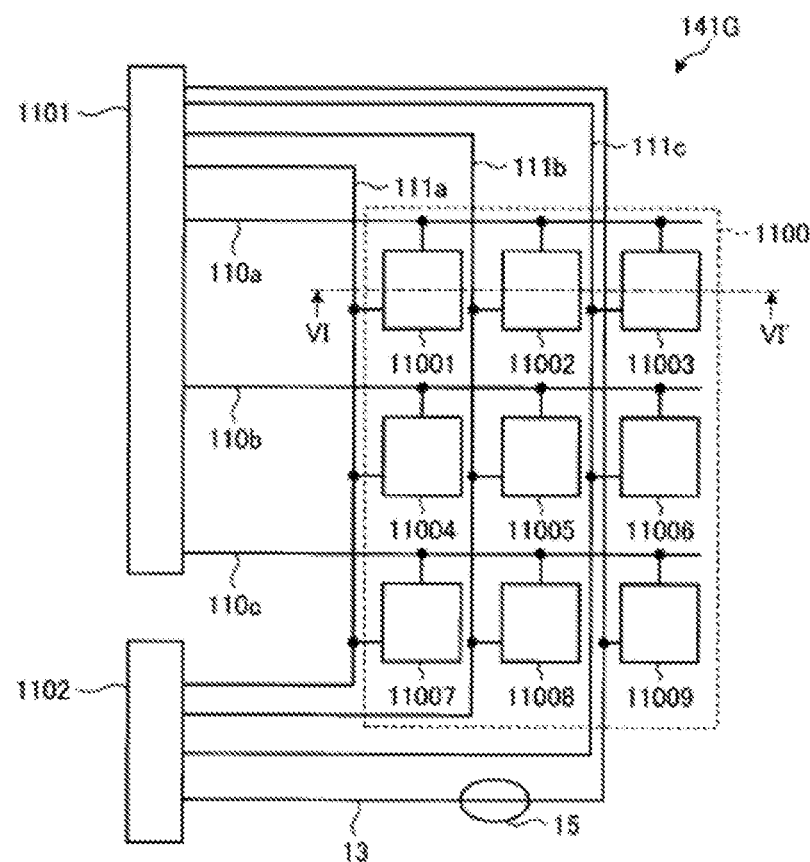
FIG. 18A is a diagram depicting a configuration example of a memory unit employed for a seventh example of the wireless communication device according to the third embodiment of the present invention.

FIG. 18A is, in reference to the package depicted in FIG. 1A, a diagram depicting a configuration example of a memory unit employed for a seventh example of a wireless communication device according to the third embodiment of the present invention. In this regard, the wireless communication device in this seventh example includes, as an example of the memory unit 141, a memory unit 141G having a memory array 1100, and is configured in the same manner as the wireless communication device 16C depicted in FIG. 14A except that the connecting line 13 is connected to the memory array 1100, although the configuration is not depicted in FIG. 18A. FIG. 18A illustrates a memory array 1100, which is an arrangement of nine memory elements 11001 to 11009, as a memory array employed for the memory unit 141G in this seventh example, but without limitation to this, the memory unit 141G may have a memory array formed by arranging a plurality of (two or more) memory elements.

As depicted in FIG. 18A, the memory unit 141G has: a memory array 1100, peripheral circuits 1101 and 1102, such as a decoder, which read information out of the memory array 1100; three word lines 110a to 110c; three bit lines 111a to 111c; and a connecting line 13. The memory array 1100 has nine memory elements 11001 to 11009. The connecting line 13 is connected to the memory element 11009 of the memory array 1100 and the peripheral circuits 1101 and 1102, passing above the sealed opening portion of the receiving cavity 15. That is, the connecting line 13 in the memory unit 141G is constituted by the bit line connected to the memory element 11009 and with the wire passing above the opening portion of the above-mentioned receiving cavity 15, and functions as bit line. In this regard, the wiring structure of the memory unit 141G, the arrangements of the memory elements 11001 to 11009 and the peripheral circuits 1101 and 1102, and the like are not limited to those illustrated in FIG. 18A.

The word lines 110a to 110c are an example of the above-mentioned at least one second wire. The word lines 110a to 110c, the longitudinal direction of which is predetermined, are arranged so as to be spaced from each other. Specifically, the word line 110a is connected to the peripheral circuit 1101 and the memory elements 11001 to 11003. The word line 110b is connected to the peripheral circuit 1101 and the memory elements 11004 to 11006. The word line 110c is connected to the peripheral circuit 1101 and the memory elements 11007 to 11009. The bit lines 111a to 111c and the bit line contained in the connecting line 13 are an example of the above-mentioned plurality of first wires. The bit lines 111a to 111c and the bit line contained in the connecting line 13 are arranged so as to be spaced from each other, wherein the longitudinal direction of the lines intersects each of the word lines 110a to 110c. In addition, the word lines 110a to 110c are disposed so as to intersect the bit lines 111a to 111c and the bit line in the connecting line 13, insulated from each other.

The memory elements 11001 to 11009 are an example of a plurality of memory elements provided so as to correspond to the intersections between the first wires and the second wires. Specifically as depicted in FIG. 18A, the memory elements 11001 to 11008 are arranged in eight regions defined by the intersections between the word lines 110a to 110c and the bit lines 111a to 111c. The memory element 11009 is arranged in a region defined by the intersection between the word line 110c and the bit line in the connecting line 13.

Figure 18B:
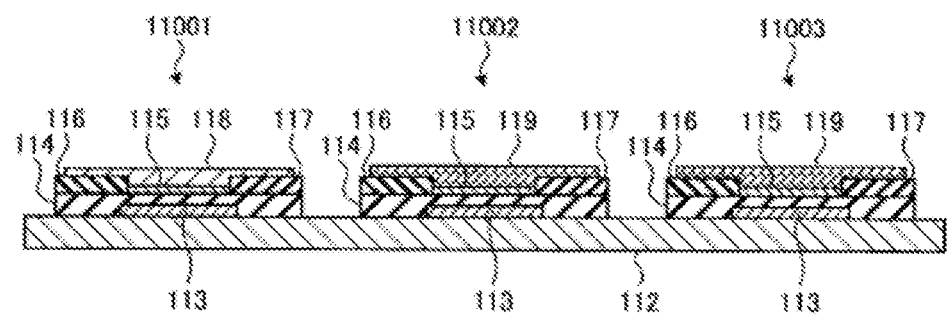
FIG. 18B is a cross-sectional view taken along line VI-VI' in the view of a memory array depicted in FIG. 18A.

FIG. 18B is a cross-sectional view taken along line VI-VI' in the view of the memory array depicted in FIG. 18A. FIG. 18B depicts a configuration example of the memory elements 11001 to 11003 as a representative of two kinds of memory elements constituting the memory array 1100 according to the third embodiment.

As depicted in FIG. 18B, the memory elements 11001 to 11003, which are each an example of one of the above-mentioned two kinds of memory elements, are formed on a substrate 112. The memory elements 11001 to 11003 have a first electrode 116, a second electrode 117, an insulating layer 114, a third electrode 113, and a semiconductor layer 115 on the substrate 112. The third electrode 113 is electrically insulated from the first electrode 116 and the second electrode 117 by the insulating layer 114. The first electrode 116 and the second electrode 117 are, for example, spaced from each other on the insulating layer 114. The semiconductor layer 115 is on the insulating layer 114, and is formed in a region between the first electrode 116 and the second electrode 117. For example, the semiconductor layer 115 is a layer composed of a semiconductor material and formed in a region between the first electrode 116 and the second electrode 117. In this regard, the substrate 112 may be the sheet 11 (specifically the substrate 11b depicted in FIGS. 9A and 9B), or another insulating substrate.

In each of the memory elements 11001 to 11003, the third electrode 113 is, for example, a gate electrode, and is electrically connected, via wiring, to the word line 110a depicted in FIG. 18A. The first electrode 116 is, for example, a drain electrode. The first electrode 116 in the memory element 11001 is electrically connected, via wiring, to the bit line 111a depicted in FIG. 18A. The first electrode 116 in the memory element 11002 is electrically connected, via wiring, to the bit line 111b depicted in FIG. 18A. The first electrode 116 in the memory element 11003 is electrically connected, via wiring, to the bit line 111c depicted in FIG. 18A. The second electrode 117 is, for example, a source electrode. In this regard, the second electrode 117 in each of the memory elements 11001 to 11003 is electrically connected, via wiring, to a reference potential line, which is not particularly shown.

The memory elements 11001 to 11003 have, in a region between the first electrode 116 and the second electrode 117, a first insulating layer 118 or a second insulating layer 119, wherein the electrical characteristics of the semiconductor layer 115 is varied between the insulating layers. The memory elements 11001 to 11003 are distinguished, according to which of the first insulating layer 118 and the second insulating layer 119 the memory elements have, into two different kinds of memory elements having different inter-electrode electrical characteristics of the first electrode 116 and the second electrode 117. For example, of these two kinds of memory elements, the memory element of one kind is the memory element 11001 having a first insulating layer 118, and the memory elements of the other kind are the memory elements 11002 and 11003 having a second insulating layer 119. The memory element 11001 of one kind and the memory elements 11002 and 11003 of the other kind record information, which differs between each other, in accordance with the difference in the electrical characteristics of the semiconductor layer 115 between the first insulating layer 118 and the second insulating layer 119.

The first insulating layer 118 and the second insulating layer 119 are each an example of a coating layer formed in a region between the first electrode 116 and the second electrode 117. Specifically, the first insulating layer 118 and the second insulating layer 119 are each composed of an insulating material applied by a desired coating method so as to come in contact with the opposite side of the semiconductor layer 115 from the insulating layer 114. In addition, the first insulating layer 118 and the second insulating layer 119 each contain a material different between each other. Such a first insulating layer 118 and a second insulating layer 119 in contact with the semiconductor layer 115 vary the electrical characteristics of the semiconductor layer 115 in this contact. This results in making a difference between the electrical characteristics of the semiconductor layer 115 on the first insulating layer 118 and the electrical characteristics of the semiconductor layer 115 on the second insulating layer 119. The reason for this is considered to be as below-mentioned.

When in contact with the air, the semiconductor layer 115 is influenced by oxygen and moisture in the atmosphere with which the semiconductor layer 115 is in contact. In some cases, this results in varying the electrical characteristics of the semiconductor layer 115. However, the first insulating layer 118 or the second insulating layer 119 covering the semiconductor layer 115 eliminates such an influence given to the semiconductor layer 115 by the external environment.

In addition, it is conceivable that a material contained in the first insulating layer 118 has some influence on the electrical characteristics of the semiconductor layer 115 in contact with the first insulating layer 118, and that a material contained in the second insulating layer 119 has some influence on the electrical characteristics of the semiconductor layer 115 in contact with the second insulating layer 119. For example, the first insulating layer 118 in contact with the semiconductor layer 115 as depicted in FIG. 18B eliminates the above-mentioned influence given to the semiconductor layer 115 by the external environment, and in addition, the value of the electric current caused via the semiconductor layer 115 between the first electrode 116 and the second electrode 117 is decreased or increased depending on the kind of the material contained in the first insulating layer 118. This occurs also in cases where the second insulating layer 119 is in contact with the semiconductor layer 115. A difference in the contained material between the first insulating layer 118 and the second insulating layer 119 makes a difference between the degree to which the electrical characteristics of the semiconductor layer 115 of the memory element 11001 vary and the degree to which the electrical characteristics of the semiconductor layer 115 of the memory element 11002 vary. This results in making a difference between the electrical characteristics of the semiconductor layer 115 in the memory element 11001 and the electrical characteristics of the semiconductor layer 115 in the memory element 11002.

The difference in the electrical characteristics of the semiconductor layer 115 between the first insulating layer 118 and the second insulating layer 119 determines information, for example, "0" or "1", recorded in each of the memory element 11001 and the memory element 11002.

Of the nine memory elements 11001 to 11009 constituting the memory array 1100 depicted in FIG. 18A, the memory elements 11001 to 11008 have the same structure as one of the two kinds of memory elements 11001 and 11002 depicted in FIG. 18B. For example, in each of the memory elements 11004 to 11006, the third electrode 113 is electrically connected, via wiring, to the word line 110b. The first electrode 116 in the memory element 11004 is electrically connected, via wiring, to the bit line 111a. The first electrode 116 in the memory element 11005 is electrically connected, via wiring, to the bit line 111b. The first electrode 116 in the memory element 11006 is electrically connected, via wiring, to the bit line 111c. In addition, in each of the memory elements 11007 and 11008, the third electrode 113 is electrically connected, via wiring, to the word line 110c. The first electrode 116 in the memory element 11007 is electrically connected, via wiring, to the bit line 111a. The first electrode 116 in the memory element 11008 is electrically connected, via wiring, to the bit line 111b. In this regard, the second electrode 117 in each of the memory elements 11004 to 11008 is electrically connected, via wiring, to a reference potential line, which is not particularly shown.

In particular, the memory elements 11001 to 11008 each have one of the above-mentioned first insulating layer 118 and the second insulating layer 119, and are composed of the two different kinds of memory elements having different inter-electrode electrical characteristics of the first electrode 116 and the second electrode 117.

That is, assuming that, of the two kinds of memory elements constituting the memory array 1100, a memory element having a first insulating layer 118 as the memory element 11001 does is a memory element (c), and that a memory element having a second insulating layer 119 as the memory element 11002 does is a memory element (d), the first insulating layer 118 and the second insulating layer 119 which have different materials cause the memory element (c) and the memory element (d) to record different information in accordance with the difference in the electrical characteristics of the semiconductor layer 115 between the first insulating layer 118 and the second insulating layer 119. Causing each of the memory elements 11001 to 11008 to be one of the two kinds of memory elements (c) and (d) determines information, for example, "0" or "1", recorded in each of the memory elements 11001 to 11008.

The above-mentioned "difference in the electrical characteristics of the semiconductor layer" means a difference between these memory elements (c) and (d) in the value of the electric current caused between the first electrode 116 and the second electrode 117 when the memory elements (c) and (d) are each selected, that is, when a given voltage is applied to the third electrode 113 of each of the memory elements (c) and (d). Such a difference in electric current makes it possible to distinguish between the "0" state and "1" state of each of the memory element (c) and memory element (d). To carry out this distinction sufficiently, one value is preferably 100 times or more, more preferably 1000 times or more, greater than the other, wherein the values are: the value of electric current caused between the first electrode 116 and second electrode 117 in the memory element which has recorded "1"; and the value of electric current caused between the first electrode 116 and second electrode 117 in the memory element which has recorded "0".

In the memory array 1100, the unique information of the memory array 1100 is determined and recorded in accordance with the arrangement of the eight memory elements 11001 to 11008 composed of these two kinds of memory elements (c) and (d), wherein the arrangement is [the memory element 11001, memory element 11002, memory element 11003, memory element 11004, memory element 11005, memory element 11006, memory element 11007, and memory element 11008].

On the other hand, the memory element 11009 connected to the bit line in the connecting line 13 is one of the above-mentioned two kinds of memory elements (c) and (d) which have, in a region between the first electrode 116 and the second electrode 117, an insulating layer (specifically, a first insulating layer 118 or a second insulating layer 119) with electric current caused through the semiconductor layer 115 between the first electrode 116 and the second electrode 117, wherein the value of the electric current in the one memory element is higher than in the other. The other configurations are the same as in the memory elements 11001 to 11003 depicted in FIG. 18B.

Here, the connecting line 13 is in an uncut state when the receiving cavity 15 is not opened yet. In this state, a given voltage is applied to the third electrode 113 of the memory element 11009 via the word line 110c when the peripheral circuit 1101 selects the memory element 11009 as an object for information read-out. When this occurs, an electric current flow is caused between the first electrode 116 and the second electrode 117 in the memory element 11009 via the semiconductor layer 115 the electrical characteristics of which are influenced by the action of the first insulating layer 118 or the second insulating layer 119. This electric current is detected by the peripheral circuit 1102 via the connecting line 13. In this case, information read out of the memory element 11009 is defined as, for example, "1".

On the other hand, when the receiving cavity 15 is opened, the connecting line 13 results in being cut at its part corresponding to the receiving cavity 15. When, in this state, the peripheral circuit 1101 selects the memory element 11009 as an object for information read-out, the memory element 11009 is provided with an electric current flow as above-mentioned, but the peripheral circuit 1102 is unable to detect this electric current flow. When viewed from the peripheral circuit 1102, this results in the same state as in which the electric current caused in the memory element 11009 is smaller than before the connecting line 13 is cut. This means substantially the same thing as that the memory element 11009 is one of the above-mentioned two kinds of memory elements (c) and (d) which have electric current caused between the first electrode 116 and the second electrode 117, wherein the value of the electric current in the one memory element is lower than in the other. That is, the information recorded in the memory element 11009 can be said to have varied between before and after the receiving cavity 15 is opened. In this case, information read out of the memory element 11009 is defined as, for example, "0".

For example, in cases where unique information of the memory array 1100 has been recorded in the memory elements 11001 to 11008, the information recorded in the memory array 1100 before the receiving cavity 15 is opened is [unique information, 1] in accordance with the arrangement of the memory elements 11001 to 11009. On the other hand, the information recorded in the memory array 1100 after the receiving cavity 15 is opened is [unique information, 0] in accordance with of the above-mentioned arrangement.

In the above-mentioned manner, information read out of the memory array 1100 (that is, information previously recorded in the memory array 1100) is varied between before and after the connecting line 13 is cut as a result of opening the receiving cavity 15, thereby enabling the wireless communication device 16 having the memory array 1100 in the memory unit 141G to maintain the information unique to the memory array 1100 and, at the same time, transmit, to an external device, the unique information and the information that differs between before and after the connecting line 13 is cut. This results in enabling the external device to sense whether any of the plurality of receiving cavities 15 is opened, wherein the sensing is carried out for each receiving cavity 15 and can thus serve for management.

In this regard, the TFT structure of the memory elements 11001 to 11009 employed for the memory array 1100 is, as illustrated in FIG. 18B, what is called a bottom-gate structure. However, the TFT structure that can be employed for the memory array 1100 is not limited to this but may be what is called a top-gate structure.

(Eighth Configuration Example of Wireless Communication Device)

Figure 19:
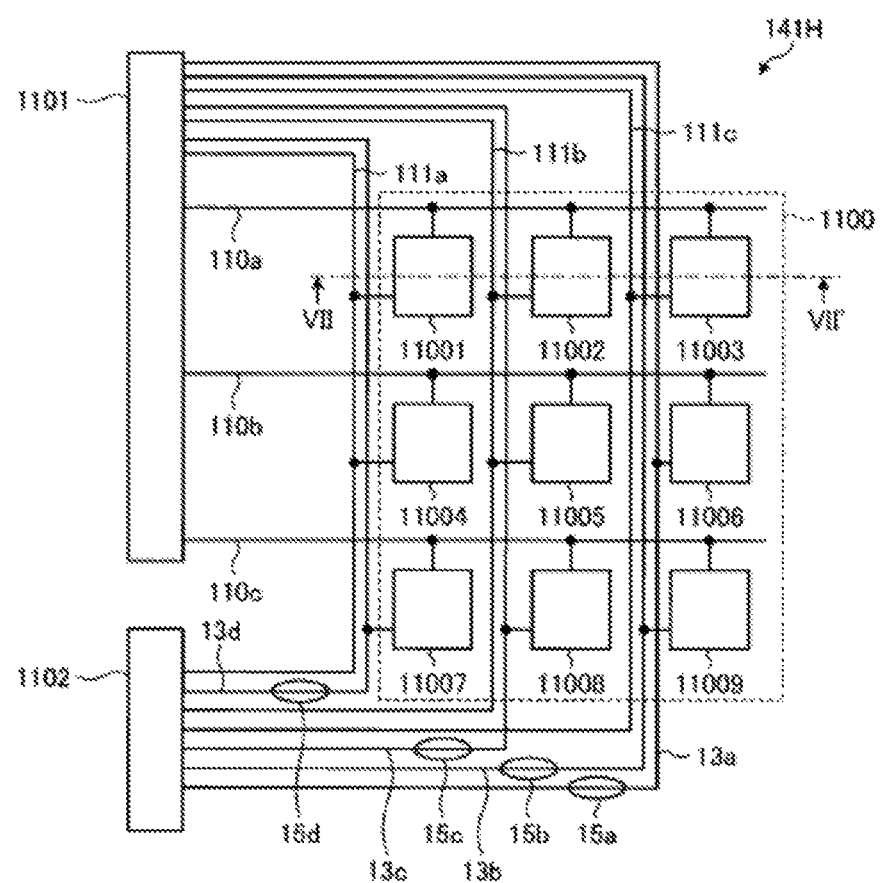
FIG. 19 is a diagram depicting a configuration example of a memory unit employed for an eighth example of the wireless communication device according to the third embodiment of the present invention.

FIG. 19 is, in reference to the package 10A depicted in FIG. 4A, a diagram depicting a configuration example of a memory unit in an eighth configuration example of a wireless communication device according to the third embodiment of the present invention. FIG. 19 illustrates a memory array 1100, which is an arrangement of nine memory elements 11001 to 11009, as a memory array employed for a memory unit 141H of the wireless communication device 16 in this eighth example, but without limitation to this, the memory unit 141H may have a memory array formed by arranging a plurality of (two or more) memory elements.

As depicted in FIG. 19, the memory unit 141H has: a memory array 1100, peripheral circuits 1101 and 1102, such as a decoder, which read information out of the memory array 1100; three word lines 110a to 110c; three bit lines 111a to 111c; and connecting lines 13a to 13d. The memory array 1100 has nine memory elements 11001 to 11009. The connecting line 13 is connected to the memory element 11009 of the memory array 1100 and the peripheral circuits 1101 and 1102, passing above the sealed opening portion of the receiving cavity 15. That is, the connecting lines 13a to 13d in the memory unit 141H are constituted by the bit line connected to the memory element 11009 and by the wires passing above the opening portion of the above-mentioned receiving cavity 15, and function as bit lines. In this regard, the wiring structure of the memory unit 141H, the arrangements of the memory elements 11001 to 11009 and the peripheral circuits 1101 and 1102, and the like are not limited to those illustrated in FIG. 19.

The word lines 110a to 110c are an example of the above-mentioned at least one second wire. The word lines 110a to 110c, the longitudinal direction of which is predetermined, are arranged so as to be spaced from each other. Specifically, the word line 110a is connected to the peripheral circuit 1101 and the memory elements 11001 to 11003. The word line 110b is connected to the peripheral circuit 1101 and the memory elements 11004 to 11006. The word line 110c is connected to the peripheral circuit 1101 and the memory elements 11007 to 11009. The bit lines 111a to 111c and the bit lines contained in the connecting lines 13a to 13d are an example of the above-mentioned plurality of first wires. The bit lines 111a to 111c and the bit lines contained in the connecting lines 13a to 13d are arranged so as to be spaced from each other, wherein the longitudinal direction of the lines intersects each of the word lines 110a to 110c. In addition, the word lines 110a to 110c are disposed so as to intersect the bit lines 111a to 111c and the bit line in the connecting lines 13a to 13d, insulated from each other.

The memory elements 11001 to 11009 are an example of a plurality of memory elements provided so as to correspond to the intersections between the first wires and the second wires. Specifically as depicted in FIG. 19, the memory elements 11001 to 11005 are arranged in five regions defined by the intersections between the word lines 110a to 110c and the bit lines 111a to 111c. The memory element 11006 is arranged in a region defined by the intersection between the word line 110b and the bit line in the connecting line 13a. The memory element 11007 is arranged in a region defined by the intersection between the word line 110c and the bit line in the connecting line 13d. The memory element 11008 is arranged in a region defined by the intersection between the word line 110c and the bit line in the connecting line 13c. The memory element 11009 is arranged in a region defined by the intersection between the word line 110c and the bit line in the connecting line 13b.

The cross-sectional view taken along line VII-VII' in the view of the memory array depicted in FIG. 19 is the same as the cross-sectional view depicted in FIG. 18B. In addition, the configurations of the memory elements and the sense-of-opening method are the same as for the package depicted in FIGS. 18A and 18B. In particular, the memory elements 11001 to 11005 each have one of the first insulating layer 118 and the second insulating layer 119, as illustrated with the above-mentioned semiconductor layers 105 and 108 (see FIG. 18B), and have, among one another, different inter-electrode electrical characteristics of the first electrode 116 and the second electrode 117. This determines information, for example, "0" or "1", recorded in each of the memory elements 11001 to 11005.

In the memory array 1100, the unique information of the memory array 1100 is determined and recorded in accordance with the arrangement of the five memory elements 11001 to 11005 composed of these two kinds of memory elements, wherein the arrangement is [the memory element 11001, memory element 11002, memory element 11003, memory element 11004, and memory element 11005].

On the other hand, the memory elements 11006 to 11009 connected to the bit lines in the connecting lines 13a to 13d are each one of the above-mentioned two kinds of memory elements which have, in a region between the first electrode 116 and the second electrode 117, an insulating layer (specifically, a first insulating layer 118 or a second insulating layer 119) with electric current caused through the semiconductor layer 115 between the first electrode 116 and the second electrode 117, wherein the value of the electric current in the one memory element is higher than in the other. The other configurations are the same as in the memory elements 11001 to 11003 depicted in FIG. 18B.

Here, the connecting lines 13a to 13d are in an uncut state when the receiving cavities 15a to 15d are not opened yet. In this state, a given voltage is applied to the third electrode 113 of each of the memory elements 11006 to 11009 via the word lines 110b to 110c when the peripheral circuit 1101 selects the memory element 11009 as an object for information read-out. When this occurs, an electric current flow is caused between the first electrode 116 and the second electrode 117 in each of the memory elements 11006 to 11009 via the semiconductor layer 115 the electrical characteristics of which are influenced by the action of the first insulating layer 118 or the second insulating layer 119. This electric current is detected by the peripheral circuit 1102 via the connecting line 13. In this case, information read out of the memory elements 11006 to 11009 is defined as, for example, "1".

When the receiving cavities 15a to 15d are opened, the connecting lines 13a to 13d result in being cut at their parts corresponding to the receiving cavities 15a to 15d. When, in this state, the peripheral circuit 1101 selects the memory elements 11006 to 11009 as objects out of which information is read, the memory elements 11006 to 11009 are provided with an electric current flow as above-mentioned, but the peripheral circuit 1102 is unable to detect this electric current flow. Therefore, when viewed from the peripheral circuit 1102, this results in the same state as in which the electric current caused in each of the memory elements 11006 to 11009 is smaller than before the connecting lines 13a to 13d are cut respectively. This means substantially the same thing as that the memory elements 11006 to 11009 are each one of the above-mentioned two kinds of memory elements which have electric current caused between the first electrode 116 and the second electrode 117, wherein the value of the electric current in the one memory element is lower than in the other. That is, the information recorded in the memory elements 11006 to 11009 can be said to have varied between before and after the receiving cavities 15a to 15d are opened. In this case, information read out of the memory elements 11006 to 11009 is defined as, for example, "0".

For example, in cases where unique information of the memory array 1100 has been recorded in the memory elements 11001 to 11005, the information recorded in the memory array 1100 before the receiving cavities 15a to 15d are opened is [unique information, 1,1,1,1] in accordance with the arrangement of the memory elements 11001 to 11005. On the other hand, the information recorded in the memory array 1100 after the receiving cavities 15a to 15d are all opened is [unique information, 0,0,0,0] in accordance with the above-mentioned arrangement.

In the above-mentioned manner, information read out of the memory array 1100 (that is, information previously recorded in the memory array 1100) is varied between before and after the connecting lines 13a to 13d are cut as a result of opening the receiving cavities 15a to 15d, thereby enabling the wireless communication device 16 having the memory array 1100 in the memory unit 141H to maintain the information unique to the memory array 1100 and, at the same time, transmit, to an external device, the unique information and the information that differs between before and after the connecting lines 13a to 13d are cut. This results in enabling the external device to sense whether any of the plurality of receiving cavities 15a to 15d is/are opened, and the sensing can thus serve for management.

Below, the configurations common among the above-mentioned first to eighth examples of the third embodiment will be described in detail. In the description of the electrodes and the wires, the first electrode, the second electrode, and the third electrode in the first to eighth examples of the third embodiment are suitably referred to collectively as an "electrode". The wires on a substrate, including the word lines and the bit lines, in the first to eighth examples of the third embodiment are suitably referred to collectively as a "wire". In the description of the semiconductor layers, the semiconductor layers in the first to fourth examples, seventh example, and eighth example of the third embodiment and the first semiconductor layer and second semiconductor layer in the fifth and sixth examples of the third embodiment are suitably referred to collectively as a "semiconductor layer".

A material to be used for the electrodes and the wires may be any conducting material that can be generally used as an electrode. Examples of such conducting materials that can be used include the above-mentioned same materials as for the connecting line 13.

In addition, the width and thickness of an electrode and the spacing between electrodes (for example, a spacing between the first electrode and the second electrode) are arbitrarily determined. Specifically, the width of an electrode is preferably 5 µm to 1 mm. The thickness of an electrode is preferably 0.01 µm to 100 µm. The spacing between the first electrode and the second electrode is preferably 1 µm to 500 µm. However, the dimensions are not limited to the above-mentioned ones.

Furthermore, the width and thickness of a wire are arbitrarily determined. Specifically, the thickness of a wire is preferably 0.01 µm to 100 µm. The width of a wire is preferably 5 µm to 500 µm. However, the dimensions are not limited to the above-mentioned ones.

The forming methods and patterning methods that can be used for the electrodes and the wires are the above-mentioned same methods as for the connecting line 13. In this regard, the electrode patterns and the wire patterns may be formed in separate processes, or at least two of a plurality of electrode patterns and wire patterns may be formed in one process. Electrode patterns and wire patterns are preferably processed in one process from the viewpoint of reduction in fabricating processes, easiness of pattern connection, and accuracy.

Insulating materials that can be used for an insulating layer are the above-mentioned same materials as used for the gate insulating layer 23. In addition, methods that can be used to form an insulating layer are the above-mentioned same methods as used for the gate insulating layer 23.

Semiconductor materials that can be used for a semiconductor layer are the above-mentioned same materials as used for the semiconductor layer 24. Among the same materials as for the semiconductor layer 24, the semiconductor material(s) preferably contained in a semiconductor layer is/are one or more selected from the group consisting of CNTs, graphene, fullerene, and organic semiconductors, from the viewpoint of the capability to form a semiconductor layer by a coating method. In addition, the semiconductor layer more preferably contains CNTs as a semiconductor material from the viewpoint of: the capability to form a semiconductor layer at a low temperature of 200° C. or less; high semiconductor characteristics; and the like.

Among the CNTs as a semiconductor material, a CNT composite in which a conjugated polymer is adhered to at least a part of the surface of the CNT is particularly preferable. This is because the CNTs are enabled to be uniformly dispersed in a solution for formation of a semiconductor layer without impairing the high electrical characteristics retained by CNTs. Using a solution having CNTs uniformly dispersed therein makes it possible that a film having CNTs uniformly dispersed therein is formed as the semiconductor layer by a coating method such as an inkjet method.

In the fifth and sixth examples of a wireless communication device according to the third embodiment of the present invention, it is preferable, for example, that organic semiconductor polymers such as polythiophenes, polypyrroles, and polyanilines are used as semiconductor materials for the first semiconductor layer, and that CNTs are used as semiconductor materials for the second semiconductor layer. This enables the value of electric current caused between the first electrode and the second electrode to differ between the memory element (a) and the memory element (b), when a given voltage is applied to the third electrode of each of the memory elements (a) and (b).

The first insulating layer and second insulating layer (see the first insulating layer 118 and second insulating layer 119 illustrated in FIG. 18B) in the seventh and eighth examples of a wireless communication device according to the third embodiment of the present invention will be described. Insulating materials to be used for the first insulating layer and the second insulating layer are not limited to any particular ones as long as the materials can vary the electrical characteristics of the semiconductor layer. In addition, forming the first insulating layer and the second insulating layer makes it possible to protect the semiconductor layer from the external environment including oxygen and moisture.

Examples of insulating materials that can be used for the first insulating layer and the second insulating layer include acrylic resins, epoxy resins, novolac resins, phenol resins, polyimide precursor resins, polyimide resins, polysiloxane resins, fluorine resins, polyvinyl acetal resins, and the like.

An acrylic resin is a resin the repeating units of which contain at least a structure derived from an acrylic monomer. Specific examples of acrylic monomers that can be used include all compounds having a carbon-carbon double bond. Preferable examples of acrylic monomers include: acrylic monomers such as methyl acrylate, acrylate, 2-ethylhexyl acrylate, ethyl methacrylate, n-butyl acrylate, i-butyl acrylate, i-propyl acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylicamide, aminoethyl acrylate, phenyl acrylate, phenoxyethyl acrylate, 1-naphthylacrylate, 2-naphthylacrylate, thiophenol acrylate, and benzyl mercaptan acrylate; these monomers the acrylate of which is replaced with methacrylate; and the like. In this regard, these acrylic monomers may be used singly or in combination of two or more kinds thereof.

An epoxy resin is a resin containing a structure having a prepolymer the molecular structure of which contains two or more epoxy groups. Examples of prepolymers include compounds having a biphenyl backbone or a dicyclopentadiene backbone. In addition, an insulating material to be used for the first insulating layer and the second insulating layer may have a curing agent in addition to an epoxy resin. Examples of curing agents that can be used include phenol novolac resins, bisphenol A novolac resins, aminotriazine compounds, naphthol compounds, diamine compounds, and the like. An insulating material to be used for the first insulating layer and the second insulating layer may further have a curing accelerator such as a metal chelate compound. Examples of metal chelate compounds include triphenylphosphine, benzimidazole compounds, tris(2,4-pentanedionato)cobalt, and the like.

A polyimide precursor resin refers to a resin converted into a polyimide resin by at least one of heat and chemical ring closure reaction. Examples of polyimide precursor resins include polyamic acids, polyamic acid esters, poly(amic acid silyl ester), and the like.

A polyimide precursor resin can be synthesized by polymerization reaction between a diamine compound and an acid dianhydride or a derivative thereof. Examples of derivatives of acid dianhydrides include tetracarboxylic acids, acid chlorides, mono-, di-, tri-, or tetra-esters of tetracarboxylic acids, and the like. Specific examples of esterified structures include structures esterified with a methyl group, ethyl group, n-propyl group, isopropyl group, n-butyl group, sec-butyl group, tert-butyl group, or the like. Methods of polymerization reaction are not limited to any particular ones as long as the methods can produce a polyimide precursor resin of interest, and known reaction methods can be used.

A polysiloxane resin is a polycondensate of a silane compound. Examples of silane compounds include, but are not limited particularly to, diethoxydimethylsilane, diethoxydiphenylsilane, tetramethoxysilane, tetraethoxysilane, vinyltrimethoxysi lane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, γ-methacryloxypropyltrimethoxysilane, and the like. In this regard, these silane compounds may be used singly or in combination of two or more kinds thereof.

Examples of fluorine resins include, but are not limited particularly to, polyvinylidene fluoride (PVDF), poly(vinylidene fluoride-trifluoroethylene) (PVDF-TrFE), poly(vinylidene fluoride-tetrafluoroethylene) (PVDF-TeFE), poly(vinylidene fluoride-chlorotrifluoroethylene) (PVDF-CTFE), poly(vinylidene fluoride-chlorofluoroethylene) (PVDF-CFE), poly(vinylidene fluoride-trifluoroethylene-chlorofluoroethylene) (PVDF-TrFE-CFE), poly(vinylidene fluoride-trifluoroethylene-chlorotrifluoroethylene) (PVDF-TrFE-CTFE), tetrafluoroethylene, poly(vinylidene fluoride-hexafluoropropylene), polytrichlorofluoroethyl ene, poly-chlorotrifluoroethylene, ethylene-chlorotrifluoroethylene copolymers, polyvinyl fluoride, tetrafluoroethylene-perfluorodioxole copolymers, ethylene-tetrafluoroethylene copolymers, perfluoroethylenepropene copolymers, perfluoroalkoxyalkane, and the like. In this regard, these fluorine resins may be used singly or in combination of two or more kinds thereof.

A polyvinyl acetal resin refers to a resin obtained by acetalizing polyvinyl alcohol. Examples of polyvinyl acetal resins include polyvinyl butyral and the like.

Examples of other resins include: styrene derivatives such as styrene, p-methyl styrene, o-methyl styrene, m-methyl styrene, p-hydroxy styrene, o-hydroxy styrene, m-hydroxy styrene, α-methyl styrene, chloromethyl styrene, and hydroxymethyl styrene; resins containing a structure derived from a vinyl monomer, such as 1-vinyl-2-pyrrolidone; resins containing a cyclic hydrocarbon structure, such as cycloolefins; and the like. In this regard, vinyl monomers are not limited to these monomers, and may be used singly or in combination of two or more kinds thereof.

The first insulating layer and the second insulating layer may contain, in addition to the above-mentioned insulating materials, the following: an inorganic material such as silicon oxide, alumina, and zirconia; and/or a compound containing a nitrogen atom, such as an amide compound, imide compound, urea compound, amine compound, imine compound, aniline compound, and nitrile compound. The first insulating layer and the second insulating layer that contain the above-mentioned compound(s) can further vary the electrical characteristics such as the threshold voltage and electric current value of the semiconductor layer.

Specific examples of amide compounds include polyamide, formamide, acetamide, poly-N-vinylacetamide, N,N-dimethylformamide, acetanilide, benzanilide, N-methylbenzanilide, sulfoneamide, nylon, polyvinylpyrrolidone, N-methylpyrrolidone, polyvinylpolypyrrolidone, β-lactam, γ-lactam, δ-lactam, ε-caprolactam, and the like. Examples of imide compounds include polyimide, phthalimide, maleimide, alloxan, succinimide, and the like.

Examples of urea compounds include uracil, thymine, urea, polyurethane, acetohexamide, allantoin, 2-imidazolidinone, 1,3-dimethyl-2-imidazolidinone, dicyandiamidine, citrulline, and the like.

Examples of amine compounds include methylamine, dimethylamine, trimethylamine, ethylamine, diethylamine, triethylamine, diisopropylethylamine, cyclohexylamine, methylcyclohexylamine, dimethylcyclohexylamine, dicyclohexylamine, dicyclohexylmethylamine, tricyclohexylamine, cyclooctylamine, cyclodecylamine, cyclododecylamine, 1-azabicyclo[2.2.2]octane(quinuclidine), 1,8-diazabicyclo[5.4.0]undeca-7-ene(DBU), 1,5-diazabicyclo[4.3.0]nona-5-ene(DBN), 1,5,7-triazabicyclo[4.4.0]deca-5-ene(TBD), 7-methyl-1,5,7-triazabicyclo[4.4.0]deca-5-ene(MTBD), poly(melamine-co-formaldehyde), tetramethylethylenediamine, piperidine, julolidine, phenylalanine, and the like. Examples of imine compounds include imidazole, pyrimidine, poly(melamine-co-formaldehyde)methylaminobenzoic acid, and the like.

Examples of aniline compounds include aniline, diphenylamine, triphenylamine, and the like. Examples of nitrile compounds include acetonitrile, acrylonitrile, and the like.

It is preferable that one of the first insulating layer and the second insulating layer contains a resin having a polar group and that the other does not contain any resin having a polar group. Examples of polar groups include a hydroxyl group, carboxy group, carbonyl group, aldehyde group, amino group, imino group, nitro group, sulfo group, cyano group, glycidyl group, halogen, and the like. In addition, these polar groups may have a substituent on a part thereof.

In the present invention, a resin having a polar group refers to a resin a repeating unit of which has a polar group. In cases where a resin contains a plurality of repeating units, at least one of the plurality of repeating units has only to contain a polar group.

The first insulating layer containing a resin having a polar group and the second insulating layer not containing any resin having a polar group have relative permittivity different between both the insulating layers. This makes it possible that the threshold voltage of each semiconductor layer in contact with each of the first insulating layer and the second insulating layer can vary to a degree to which the threshold voltage differs between both the insulating layers.

The relative permittivity of the insulating materials constituting the first insulating layer and the second insulating layer can be measured in the below-mentioned manner. First, the constituents of each of the first insulating layer and the second insulating layer are determined. This determination can be carried out using one of, or a combination of a plurality of, various organic analysis techniques and inorganic analysis techniques such as elemental analysis, nuclear magnetic resonance spectrometry, infrared spectroscopic analysis, and X-ray photoelectron spectroscopy. Each constituent found by this determination is used as a dielectric material layer to produce a capacitor, to which an AC voltage is then applied at a frequency of 1 kHz for the capacitor to exhibit a capacitance, which is measured. From the measured capacitance (C), capacitor electrode area (S), and dielectric material layer film thickness (d), the relative permittivity ($\varepsilon_r$) is calculated using the following equation (1). Here, the permittivity of vacuum electric constant ($\varepsilon_0$) is calculated as $8.854 \times 10^{-12}$.

$$C = \varepsilon_r \varepsilon_0 S/d \qquad (1)$$

The first insulating layer and the second insulating layer generally have a film thickness of 50 nm to 10 μm, preferably 100 nm to 3 μm. The first insulating layer and the second insulating layer may each be composed of a monolayer or a multilayer. In addition, one layer in each of the first insulating layer and the second insulating layer may be formed of a plurality of insulating materials, or a plurality of layers may be formed by laminating a plurality of insulating materials.

(Ninth Configuration Example of Wireless Communication Device)

Figure 20A:
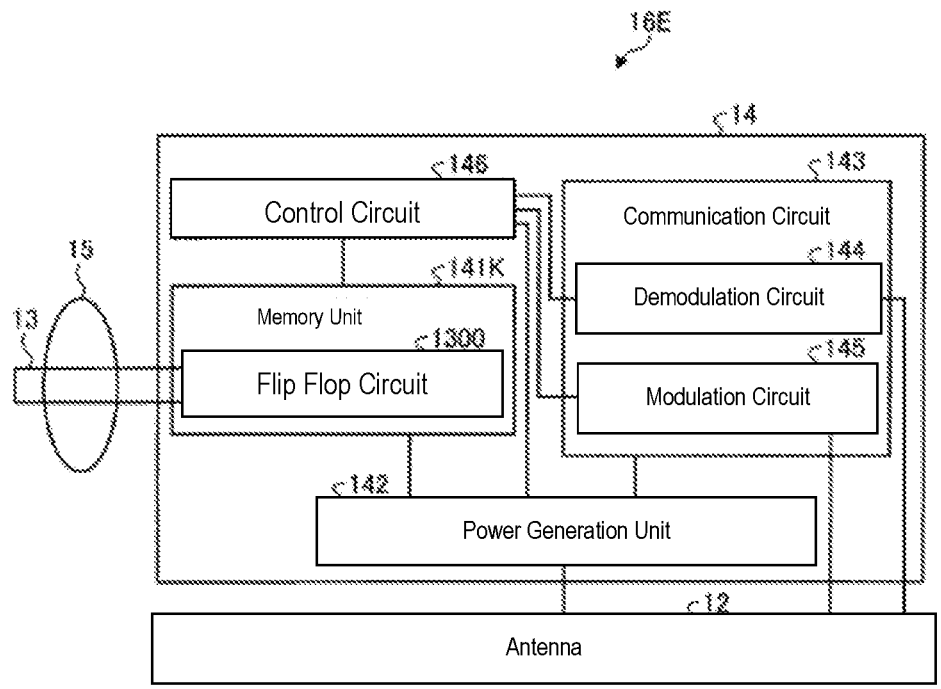
FIG. 20A is a block diagram depicting a ninth configuration example of the wireless communication device according to the third embodiment of the present invention.

Furthermore, a ninth configuration example of a wireless communication device according to the third embodiment of the present invention is, for example, a configuration in which the memory unit has at least a flip flop circuit that records information for sensing whether the receiving cavity 15 is opened. FIG. 20A is a block diagram depicting the ninth configuration example of the wireless communication device according to the third embodiment of the present invention, wherein the wireless communication device is in the package 10 depicted in FIG. 1A. FIGS. 20B to 20E are each a diagram depicting a configuration example of a memory unit employed for the wireless communication device 16E depicted in FIG. 20A.

As depicted in FIG. 20A, the memory unit 141K in the ninth example has a flip flop circuit 1300. As depicted in FIGS. 20B to 20E, the flip flop circuit 1300 is configured with two flip flop circuits 13001 and 13002. Combining the two flip flop circuits 13001 and 13002 makes it possible to create four digital signals: [1000], [1100], [1010], and [1110]. That is, this can generate 2-bit information.

Figure 20B:
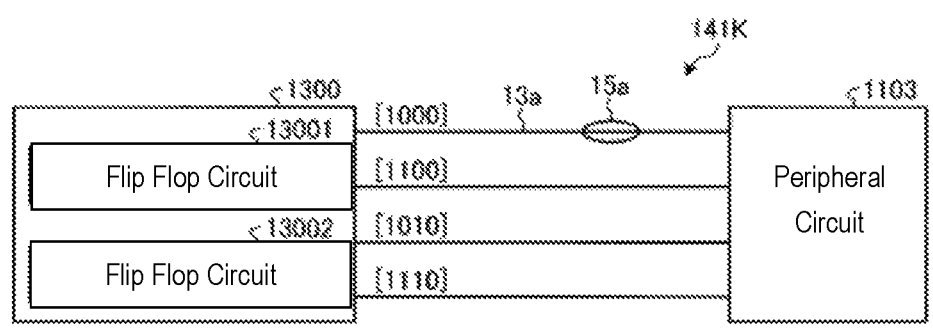
FIG. 20B is a diagram depicting a configuration example of a memory unit of the wireless communication device depicted in FIG. 20A.

FIG. 20B, in which a wire transmitting a digital signal [1000] is a connecting line 13a, will be explained. When a receiving cavity 15a is unopened, a signal [1000,1100,1010,1110] is transmitted from the wireless communication device 16a (see FIG. 1A) composed of a wireless communication device 16E depicted in FIG. 20A. On the other hand, when the receiving cavity 15a is opened, the connecting line 13a that is connected, in the peripheral circuit 1103, to a power circuit or a thin film transistor connected to a reference potential line can cause the digital signal to be [1111]. As a result, a signal [1111,1100,1010,1110] is transmitted from the wireless communication device 16a. That is, the unique information of the receiving cavity 15a can be made [1100,1010,1110], and the information that differs between before and after the connecting line 13a is cut can be transmitted, together with the unique information, to an external device.

Figure 20C:
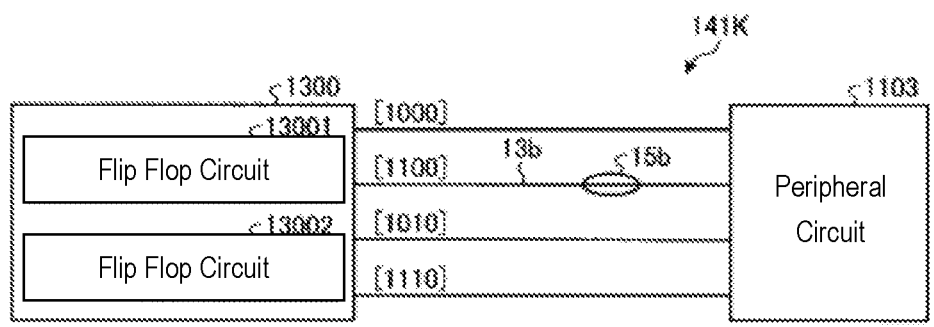
FIG. 20C is a diagram depicting a configuration example of a memory unit of the wireless communication device depicted in FIG. 20A.

FIG. 20C, in which a wire transmitting a digital signal [1100] is a connecting line 13b, will be explained. On the other hand, when the receiving cavity 15b is unopened, a signal [1000,1100,1010,1110] is transmitted from the wireless communication device 16b (see FIG. 1A). When the receiving cavity 15b is opened, the connecting line 13b that is connected, in the peripheral circuit 1103, to a power circuit or a thin film transistor connected to a reference potential line can cause the digital signal to be [1111]. As a result, a signal [1000,1111,1010,1110] is transmitted from the wireless communication device 16b. That is, the unique information of the receiving cavity 15b can be made [1000, 1010,1110], and the information that differs between before and after the connecting line 13b is cut can be transmitted, together with the unique information, to an external device.

Figure 20D:
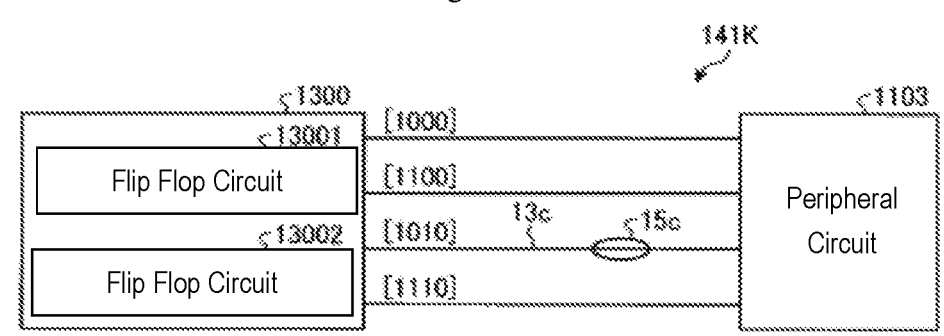
FIG. 20D is a diagram depicting a configuration example of a memory unit of the wireless communication device depicted in FIG. 20A.

FIG. 20D, in which a wire transmitting a digital signal [1010] is a connecting line 13c, will be explained. When the receiving cavity 15c is unopened, a signal [1000, 1100,1010, 1110] is transmitted from the wireless communication device 16c (see FIG. 1A). On the other hand, when the receiving cavity 15c is opened, the connecting line 13c that is connected, in the peripheral circuit 1103, to a power circuit or a thin film transistor connected to a reference potential line can cause the digital signal to be [1010]. As a result, a signal [1000,1100,1111,1110] is transmitted from the wireless communication device 16c. That is, the unique information of the receiving cavity 15c can be made [1000, 1100,1110], and the information that differs between before and after the connecting line 13c is cut can be transmitted, together with the unique information, to an external device.

Figure 20E:
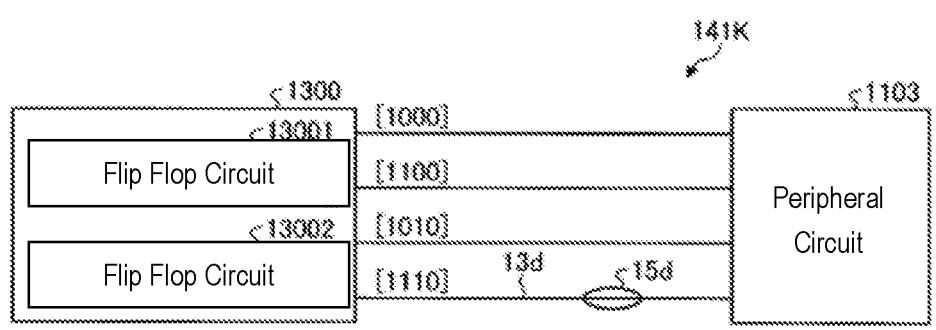
FIG. 20E is a diagram depicting a configuration example of a memory unit of the wireless communication device depicted in FIG. 20A.

FIG. 20E, in which a wire transmitting a digital signal [1110] is a connecting line 13d, will be explained. On the other hand, when the receiving cavity 15d is unopened, a signal [1000,1100,1010,1110] is transmitted from the wireless communication device 16d (see FIG. 1A). When the receiving cavity 15d is opened, the connecting line 13d that is connected, in the peripheral circuit 1103, to a power circuit or a thin film transistor connected to a reference potential line can cause the digital signal to be [1111]. As a result, a signal [1000,1100,1010,1111] is transmitted from the wireless communication device 16d. That is, the unique information of the receiving cavity 15d can be made [1000, 1100,1010], and the information that differs between before and after the connecting line 13d is cut can be transmitted, together with the unique information, to an external device.

This results in enabling the external device to sense whether any of the plurality of receiving cavities 15 is opened, wherein the sensing is carried out for each receiving cavity 15 and can thus serve for management. In this regard, for an increased number of receiving cavities 15, the number of flip flop circuits can be increased, and using n flip flop circuits makes it possible to distinguish $2^n$ receiving cavities 15.

(Tenth Configuration Example of Wireless Communication Device)

Figure 21A:
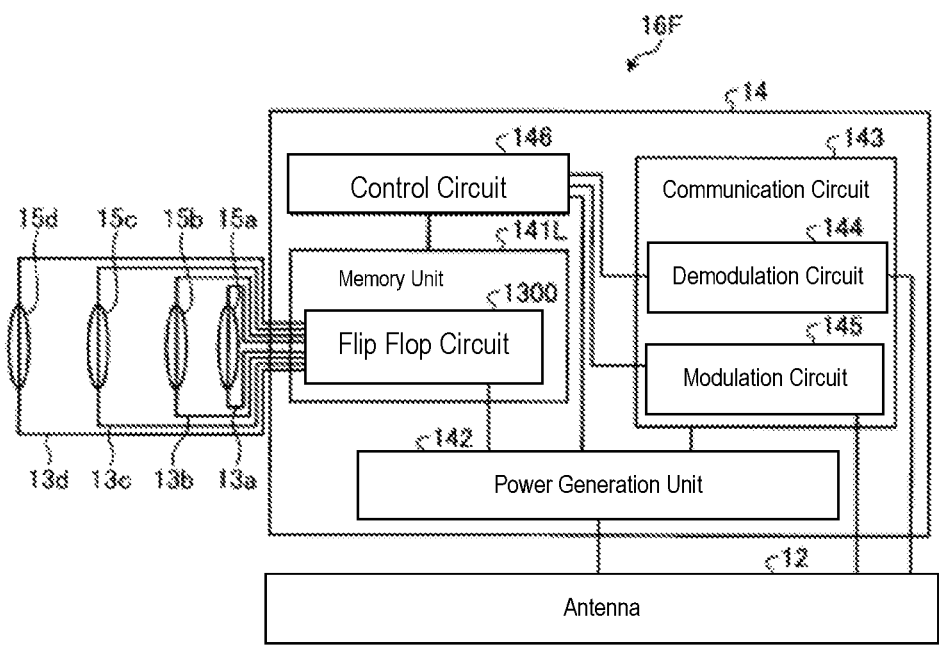
FIG. 21A is a block diagram depicting a tenth configuration example of the wireless communication device according to the third embodiment of the present invention.
Figure 21B:
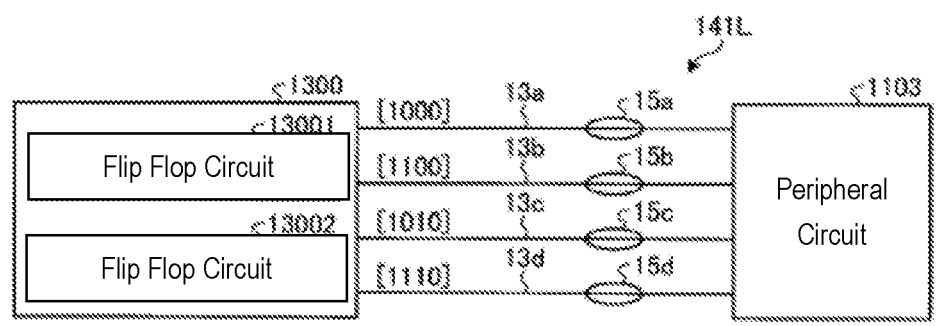
FIG. 21B is a diagram depicting a configuration example of a memory unit of the wireless communication device depicted in FIG. 21A.

In addition, a tenth configuration example of a wireless communication device according to the third embodiment of the present invention is, for example, a configuration in which the memory unit has at least a flip flop circuit that records information for sensing whether the receiving cavity 15 is opened. FIG. 21A is a block diagram depicting the tenth configuration example of the wireless communication device 16F according to the third embodiment of the present invention, wherein the wireless communication device is in the package 10A depicted in FIG. 4A. FIG. 21B is a diagram depicting a configuration example of a memory unit of the wireless communication device depicted in FIG. 21A.

As depicted in FIG. 21A, the memory unit 141L in the tenth example has a flip flop circuit 1300. As depicted in FIG. 21B, the flip flop circuit 1300 is configured with two flip flop circuits 13001 and 13002. Combining the two flip flop circuits 13001 and 13002 makes it possible to create four digital signals: [1000], [1100], [1010], and [1110]. That is, this can generate 2-bit information.

FIG. 21B, in which a wire transmitting a digital signal [1000] is a connecting line 13a, a wire transmitting a digital signal [1100] is a connecting line 13b, a wire transmitting a digital signal [1010] is a connecting line 13c, and a wire transmitting a digital signal [1110] is a connecting line 13d, will be described. When the receiving cavities 15a to 15d are all unopened, a signal [1000,1100,1010,1110] is transmitted from the wireless communication device 16F. On the other hand, when the receiving cavity 15a is opened, the connecting line 13a that is connected, in the peripheral circuit 1103, to a power circuit or a thin film transistor connected to a reference potential line can cause the digital signal to be [1111]. As a result, a signal [1111,1100,1010,1110] is transmitted from the wireless communication device 16F. That is, the information that differs between before and after the connecting line 13a is cut can be transmitted to an external device. Furthermore, when the receiving cavity 15b is opened, a signal [1111,1111,1010,1110] is transmitted from the wireless communication device 16F. Furthermore, when the receiving cavity 15c is opened, a signal [1111,1111,1111, 1110] is transmitted from the wireless communication device 16F. Furthermore, when the receiving cavity 15d is opened, a signal [1111,1111,1111,1111] is transmitted from the wireless communication device 16F.

This results in enabling the external device to sense whether any of the plurality of receiving cavities 15a to 15d is opened, wherein the sensing is carried out for each receiving cavity 15 and can thus serve for management. In this regard, for an increased number of receiving cavities 15, the number of flip flop circuits can be increased, and using n flip flop circuits makes it possible to distinguish $2^n$ receiving cavities 15.

(Eleventh Configuration Example of Wireless Communication Device)

Figure 22A:
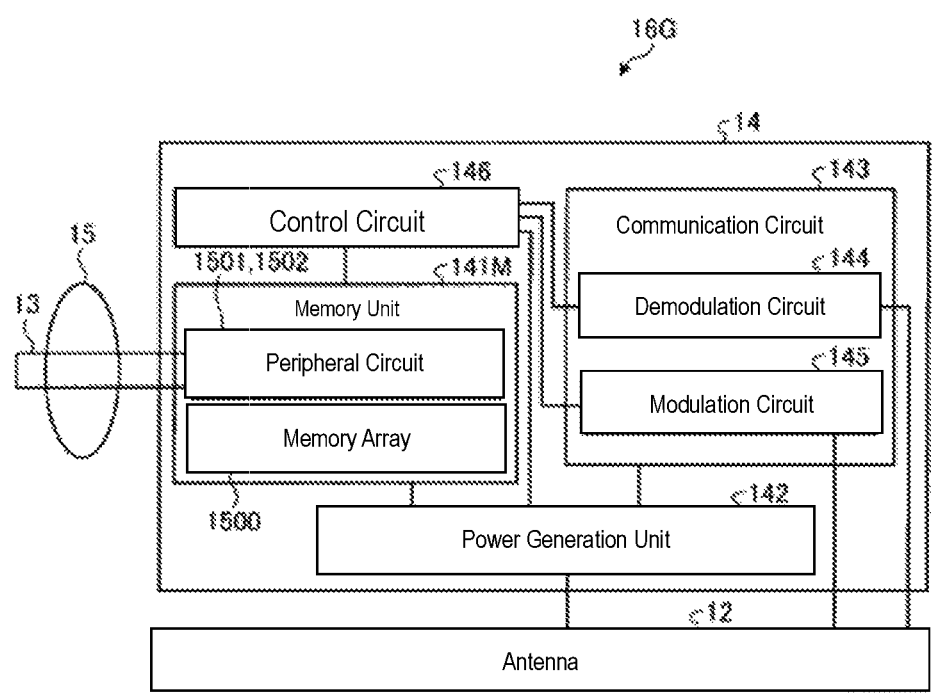
FIG. 22A is a block diagram depicting an eleventh configuration example of the wireless communication device according to the third embodiment of the present invention.
Figure 22B:
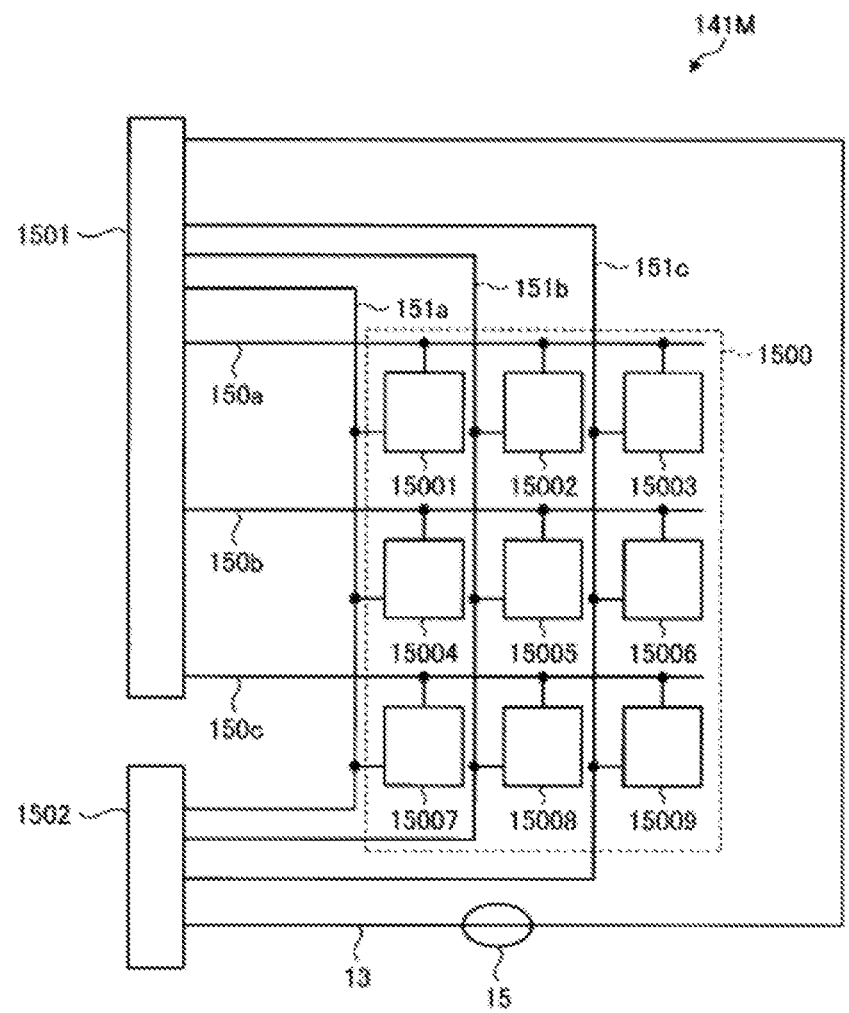
FIG. 22B is a diagram depicting a configuration example of a memory unit of the wireless communication device depicted in FIG. 22A.

In addition, FIG. 22A is a block diagram depicting a first configuration example of a wireless communication device according to an eleventh example of the third embodiment of the present invention, wherein the wireless communication device is in the package depicted in FIG. 1A. FIG. 22B is a diagram depicting a configuration example of a memory unit of the wireless communication device depicted in FIG. 22A.

As depicted in FIG. 22A, a memory unit 141M in the wireless communication device 16G in the eleventh example has a memory array 1500 and peripheral circuits 1501 and 1502. The package 10 depicted in FIG. 1A according to the first embodiment is connected to the peripheral circuits 1501 and 1502. The word lines 150a to 150c are the same as the word lines 90a to 90c respectively, and the bit lines 151a to 151c are the same as the bit lines 91a to 91c respectively. The other configurations are the same as the configurations depicted in FIG. 14A.

In FIG. 22B, unique information of the receiving cavity 15 is recorded in the memory array 1500 composed of memory elements 15001 to 15009. In the peripheral circuit 1501, the connecting line 13 is connected to a thin film transistor connected to a reference potential line, and a signal outputted from the peripheral circuit 1502 can be made "0" when the receiving cavity 15 is unopened. In this case, a signal [unique information, 0] is transmitted from the wireless communication device 16G. On the other hand, a signal outputted from the peripheral circuit 1502 can be made "1" when the receiving cavity 15 is opened. In this case, a signal [unique information, 1] is transmitted from the wireless communication device 16G.

In the peripheral circuit 1501, the connecting line 13 is connected to a thin film transistor connected to a power circuit, and a signal outputted from the peripheral circuit 1502 can be made "1" when the receiving cavity 15 is unopened. In this case, a signal [unique information, 1] is transmitted from the wireless communication device 16G. A signal outputted from the peripheral circuit 1502 can be made "0" when the receiving cavity 15 is opened. In this case, a signal [unique information, 0] is transmitted from the wireless communication device 16G.

In this way, the information that differs between before and after the connecting line 13 is cut can be transmitted, together with the unique information, to an external device. This results in enabling the external device to sense whether any of the plurality of receiving cavities 15 is opened, wherein the sensing is carried out for each receiving cavity 15 and can thus serve for management. In this regard, the structure of the memory array 1500 is not limited to any particular one, but is preferably the structure depicted in each of the third to eighth configuration examples of a wireless communication device according to the third embodiment of the present invention (see FIG. 14C, FIG. 16B, and FIG. 18B) from the viewpoint of the production cost of the memory array 1500.

(Twelfth Configuration Example of Wireless Communication Device)

Figure 23A:
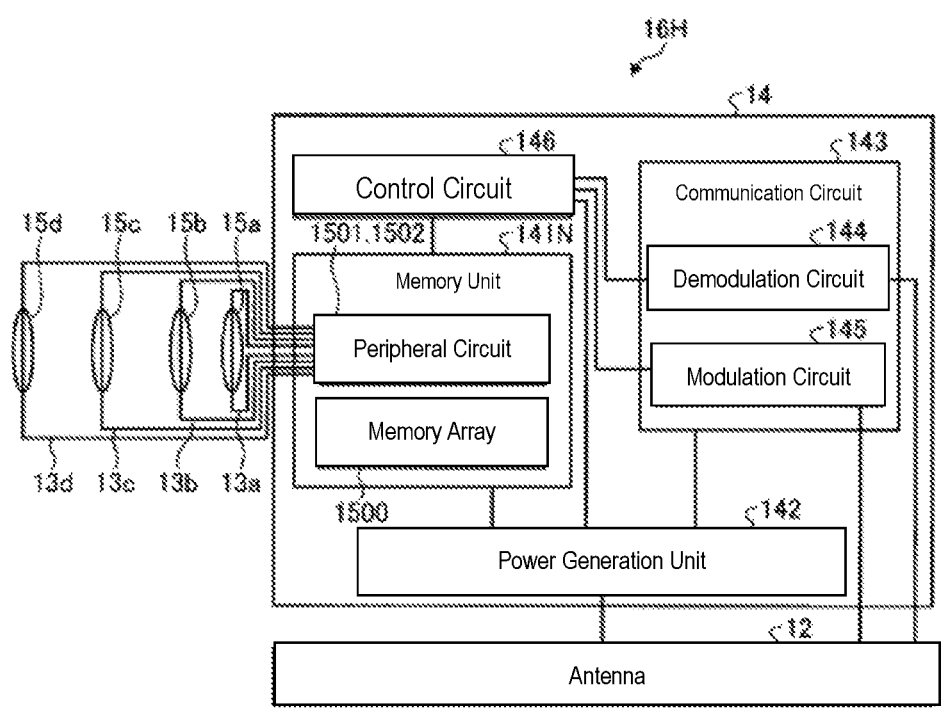
FIG. 23A is a block diagram depicting a twelfth configuration example of the wireless communication device according to the third embodiment of the present invention.
Figure 23B:
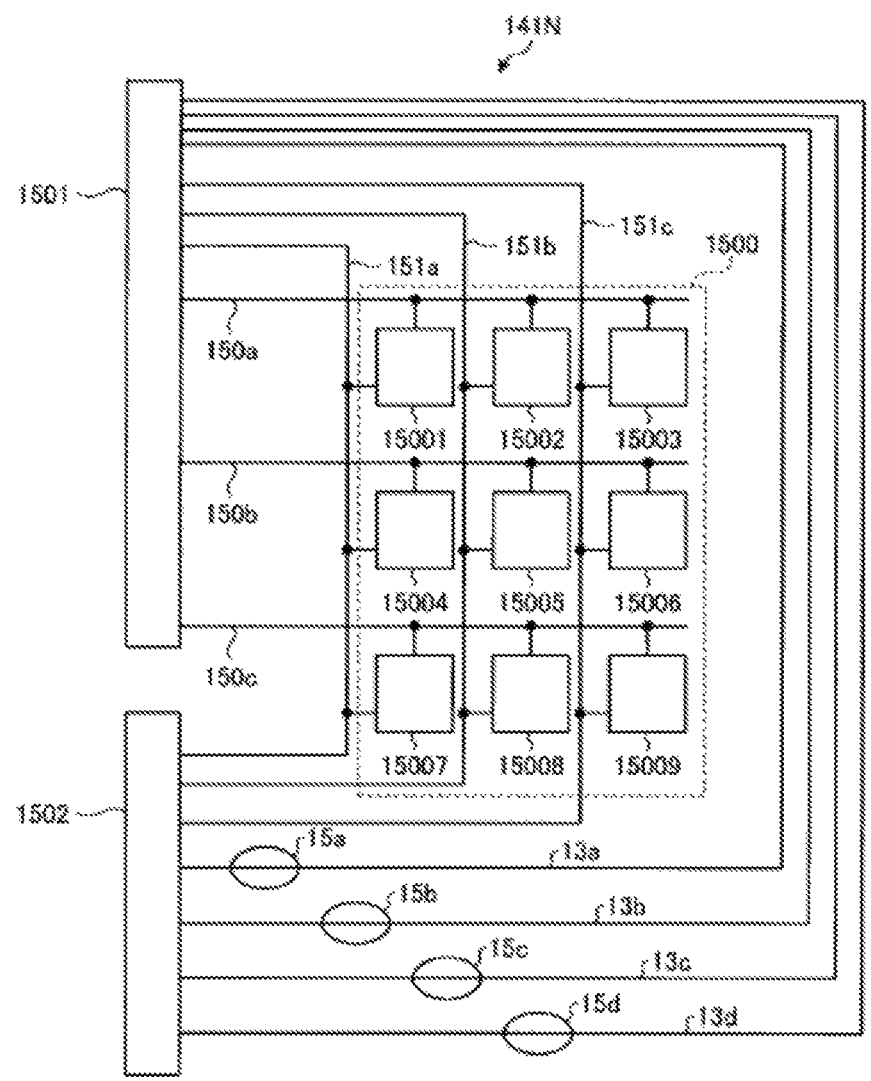
FIG. 23B is a diagram depicting a configuration example of a memory unit of the wireless communication device depicted in FIG. 23A.

FIG. 23A is a block diagram depicting a first configuration example of a wireless communication device according to a twelfth example of the third embodiment of the present invention, wherein the wireless communication device is in the package depicted in FIG. 4A. FIG. 23B is a diagram depicting a configuration example of a memory unit of the wireless communication device depicted in FIG. 23A.

As depicted in FIG. 23A, a memory unit 141N in the wireless communication device 16H in the twelfth example has a memory array 1500 and peripheral circuits 1501 and 1502. The package 10A depicted in FIG. 4A according to the second embodiment is connected to the peripheral circuits 1501 and 1502. The word lines 150*a* to 150*c* are the same as the word lines 90*a* to 90*c* respectively, and the bit lines 151*a* to 151*c* are the same as the bit lines 91*a* to 91*c* respectively. The other configurations are the same as the configurations depicted in FIG. 15A.

In FIG. 23B, unique information of the package is recorded in the memory array 1500 composed of memory elements 15001 to 15009. In the peripheral circuit 1501, the connecting lines 13*a* to 13*d* are connected to a thin film transistor connected to a reference potential line, and a signal outputted from the peripheral circuit 1502 can be made "0" when the receiving cavities 15*a* to 15*d* are unopened. In this case, a signal [unique information, 0,0,0,0] is transmitted from the wireless communication device 16H. On the other hand, a signal outputted from the peripheral circuit 1502 can be made "1" when the receiving cavity 15*a* is opened. In this case, a signal [unique information, 1,0,0,0] is transmitted from the wireless communication device 16H. Subsequently, a signal [unique information, 1,1,0,0] is transmitted from the wireless communication device 16H when the receiving cavity 15*b* is opened. Subsequently, a signal [unique information, 1,1,1,0] is transmitted from the wireless communication device 16H when the receiving cavity 15*c* is opened. Subsequently, a signal [unique information, 1,1,1,1] is transmitted from the wireless communication device 16H when the receiving cavity 15*d* is opened.

In the peripheral circuit 1501, the connecting line 13 is connected to a power circuit, and a signal outputted from the peripheral circuit 1502 can be made "1" when the receiving cavity 15 is unopened. In this case, a signal [unique information, 1,1,1,1] is transmitted from the wireless communication device 16H. On the other hand, a signal outputted from the peripheral circuit 1502 can be made "0" when the receiving cavity 15*a* is opened. In this case, a signal [unique information, 0,1,1,1] is transmitted from the wireless communication device 16H. Subsequently, a signal [unique information, 0,0,1,1] is transmitted from the wireless communication device 16H when the receiving cavity 15*b* is opened. Subsequently, a signal [unique information, 0,0,0,1] is transmitted from the wireless communication device 16H when the receiving cavity 15*c* is opened. Subsequently, a signal [unique information, 0,0,0,0] is transmitted from the wireless communication device 16H when the receiving cavity 15*d* is opened.

In this way, the information that differs between before and after the connecting lines 13*a* to 13*d* are cut can be transmitted, together with the unique information, to an external device. This results in enabling the external device to sense whether any of the plurality of receiving cavities 15 of the package is opened, wherein the sensing can thus serve for management. In this regard, the structure of the memory array 1500 is not limited to any particular one, but is preferably the structure depicted in each of the third to eighth configuration examples of a wireless communication device according to the third embodiment of the present invention (see FIG. 14C, FIG. 16B, and FIG. 18B) in terms of the production cost of the memory array 1500.

(Method of Producing Memory Element in First and Second Examples of Wireless Communication Device)

A method of producing a memory element in the first and second examples of a wireless communication device according to the third embodiment of the present invention will be described. The method of producing a memory element includes at least a coating process in which a coating layer is formed, by a coating method, in a region between the first electrode and the second electrode in the memory element. In the producing method, methods of forming an electrode, an insulating layer, and a semiconductor layer that constitute a memory element to be produced are as above-mentioned. Determining the order of these forming methods suitably makes it possible to produce the memory element in the first and second examples.

An example of a method of producing a memory element in the first and second examples of a wireless communication device according to the third embodiment of the present invention will be specifically described with reference to FIGS. 12B and 12C, taking the memory element 800 depicted in FIGS. 12B and 12C for example. The method of producing a memory element in the first and second examples includes processes of forming a memory element, a word line, and a connecting line 13 as a bit line, the processes including, for example, a process of forming a wire for the first electrode, a process of forming an insulating layer, a process of forming a wire for the second electrode, and a coating process.

Specifically, the process of forming a wire for the first electrode is first carried out. In this process, one word line 80 and a third electrode 82 are simultaneously formed on a substrate 81 by the above-mentioned method, for example, carrying out vacuum evaporation through a mask. The third electrode 82 is connected, via wiring, to the word line 80.

Next, the process of forming an insulating layer is carried out. In this process, an insulating layer 83 is formed on the substrate 81 to correspond to the third electrode 82 by the above-mentioned method, for example, a printing method. The formed insulating layer 83 comes in contact with the third electrode 82 from above, and covers the third electrode 82, which is thus sandwiched between the substrate 81 and the insulating layer 83.

Next, the process of forming a wire for the second electrode is carried out. In this process, the connecting line 13 and the pair of the first electrode 85 and the second electrode 86 are simultaneously formed by the above-mentioned method, for example, using the same material and carrying out vacuum evaporation through a mask. Here, the connecting line 13, the longitudinal direction of which intersects the word line 80, is formed on the substrate 81 in such a manner that the connecting line 13 is formed into a pattern which can be connected to peripheral circuits 801 and 802, passing that part of the substrate which seals the opening portion of a receiving cavity 15. The first electrode 85 is connected, via wiring, to the connecting line 13.

Next, the coating process is carried out. In this process, a coating layer to be produced is a semiconductor layer 84 (see FIG. 12C). In this process, the semiconductor layer 84 is formed, by a coating method, in a region between the first electrode 85 and the second electrode 86. The coating method in this process is not limited to any particular one, and is preferably one selected from the group consisting of an inkjet method, a dispenser method, and a spray method. Among these, an inkjet method is more preferable as a coating method from the viewpoint of printing position accuracy and efficiency of use of raw materials.

The above-mentioned process of forming a wire for the first electrode, process of forming an insulating layer, process of forming a wire for the second electrode, and coating process make it possible to produce, on the substrate 81, the memory element 800 having the TFT structure depicted in FIG. 12C and connected to the word line 80 and the connecting line 13 (see FIG. 12B). In this regard, examples of this substrate 81 include a substrate 11*b* (see FIGS. 9A and 9B) constituting part of the sheet 11 of the package 10.

(Method of Producing Memory Array in Third to Eighth, Eleventh, and Twelfth Examples of Wireless Communication Device)

A method of producing a memory array in the third to eighth, eleventh, and twelfth examples of a wireless communication device according to the third embodiment of the present invention will be described. As above-mentioned, the structures of the memory arrays in the eleventh and twelfth examples are preferably the same as those of the memory arrays in the third to eighth examples. In addition, the method of producing the memory array in the eleventh and twelfth examples is preferably the same as the method of producing the memory array in the third to eighth examples. This producing method includes at least a coating process in which a coating layer is formed, by a coating method, in a region between the first electrode and the second electrode in at least one of a plurality of memory elements. In this producing method, methods of forming an electrode, an insulating layer, and a semiconductor layer that constitute a memory element included in a memory array to be produced are as above-mentioned. Determining the order of these forming methods suitably makes it possible to produce a memory array in the third to eighth, eleventh, and twelfth examples of a wireless communication device according to the third embodiment of the present invention.

First, an example of a method of producing a memory array in the third to eighth, eleventh, and twelfth examples of a wireless communication device according to the third embodiment of the present invention will be specifically described with reference to FIGS. 14B and 14C, taking the memory array 900 depicted in FIG. 14B for example. This method of producing a memory array in the third example includes processes of forming: a plurality of memory elements constituting this memory array; at least one word line; and a plurality of bit lines; the processes including, for example, a process of forming a wire for the first electrode, a process of forming an insulating layer, a process of forming a wire for the second electrode, and a coating process.

Specifically, the process of forming a wire for the first electrode is first carried out. In this process, three word lines 90*a* to 90*c* and a plurality of third electrodes 93 are simultaneously formed on a substrate 92 by the above-mentioned method, for example, carrying out vacuum evaporation through a mask. The plurality of third electrodes 93 are connected, via wiring, to one selected in turn as an object for connection from among the word lines 90*a* to 90*c*. The number of third electrodes 93 to be formed is the same as the number (for example, nine) of the memory elements which are to be produced.

Next, the process of forming an insulating layer is carried out. In this process, a plurality of insulating layers 94 are formed on the substrate 92 to correspond to a plurality of third electrodes 93 by the above-mentioned method, for example, a printing method. The plurality of insulating layers 94 each come in contact with the third electrode 93 from above, and covers the third electrode 93, which is thus sandwiched between the substrate 92 and the insulating layer 94.

Next, the process of forming a wire for the second electrode is carried out. In this process, a plurality of bit lines (for example, the bit lines 91*a* to 91*c* and the connecting line 13 as a bit line) and a plurality of pairs of the first electrode 96 and the second electrode 97 are simultaneously formed by the above-mentioned method, for example, using the same material and carrying out vacuum evaporation through a mask. In this case, the bit lines 91*a* to 91*c* and the connecting line 13 are arranged on the substrate 92 so as to be spaced from each other, wherein the longitudinal direction of the lines intersects at least one word line (for example, the word lines 90*a* to 90*c*). In addition, the connecting line 13 is formed into a pattern which can be connected to peripheral circuits 901 and 902, passing that part of the substrate which seals the opening portion of a receiving cavity 15. Each of the plurality of first electrodes 96 is connected, via wiring, to one selected in turn as an object for connection from among a plurality of bit lines such as the bit lines 91*a* to 91*c* and the connecting line 13. Each number of the first electrodes 96 and second electrodes 97 to be formed is the same as the number (for example, nine) of the memory elements which are to be produced.

Next, the coating process is carried out. In this process, a coating layer to be produced is a semiconductor layer 95. In this process, a memory element for coating is selected from a plurality of memory elements on the substrate 92 according to information to be recorded. Then, the semiconductor layer 95 is formed, by a coating method, in a region between the first electrode 96 and the second electrode 97 in the selected memory element for coating (the memory elements 9001 and 9003 in FIG. 14C). For example, the semiconductor layer 95 is formed by applying a CNT-containing solution to a region between the first electrode 96 and the second electrode 97 of the memory element 9001, and drying the resulting coating, if necessary. On the other hand, the semiconductor layer 95 is not formed in a memory element (the memory element 9002 in FIG. 14C) which is not selected as one for coating from among the plurality of memory elements. In this manner, the plurality of memory elements on the substrate 92 are produced differently as two kinds of memory elements that differ in electrical characteristics (that is, differ in recorded information) according to whether the memory elements have the semiconductor layer 95. This results in making it possible to produce a memory array (for example, the memory array 900 depicted in FIG. 14B) in which information is recorded, wherein the information is determined by any arrangement of these memory elements of two kinds (for example, unique information that differs between/among the plurality of receiving cavities 15, information for sense of opening, and other information).

The coating method in this process is not limited to any particular one, and is preferably one selected from the group consisting of an inkjet method, a dispenser method, and a spray method. Among these, an inkjet method is more preferable as a coating method from the viewpoint of printing position accuracy and efficiency of use of raw materials. In addition, examples of the substrate 92 include a substrate 11*b* constituting part of the sheet 11 of the package 10.

(Example of Method of Producing Memory Array in Fifth and Sixth Examples of Wireless Communication Device)

Next, an example of a method of producing a memory array in the fifth and sixth examples of a wireless communication device according to the third embodiment of the present invention will be specifically described with reference to FIGS. 16A and 16B, taking the memory array 1000 depicted in FIG. 16A for example. This method of producing a memory array in the fifth example includes processes of forming: a plurality of memory elements constituting this memory array; at least one word line; and a plurality of bit lines; the processes including, for example, a process of forming a wire for the first electrode, a process of forming an insulating layer, a process of forming a wire for the second electrode, and a coating process.

Specifically, the process of forming a wire for the first electrode is first carried out. In this process, three word lines 100*a* to 100*c* and a plurality of third electrodes 103 are simultaneously formed on a substrate 102 by the above-mentioned method, for example, carrying out vacuum evaporation through a mask. The plurality of third electrodes 103 are connected, via wiring, to one selected in turn as an object for connection from among the word lines 100*a* to 100*c*. The number of the third electrodes 103 to be formed is the same as the number (for example, nine) of the memory elements which are to be produced.

Next, the process of forming an insulating layer is carried out. In this process, a plurality of insulating layers 104 is formed on the substrate 102 to correspond to a plurality of third electrodes 103 by the above-mentioned method, for example, a printing method. The plurality of insulating layers 104 each come in contact with the third electrode 103 from above, and covers the third electrode 103, which is thus sandwiched between the substrate 102 and the insulating layer 103.

Next, the process of forming a wire for the second electrode is carried out. In this process, a plurality of bit lines (for example, the bit lines 101*a* to 101*c* and the connecting line 13 as a bit line) and a plurality of pairs of the first electrode 106 and the second electrode 107 are simultaneously formed by the above-mentioned method, for example, using the same material and carrying out vacuum evaporation through a mask. In this case, the bit lines 101*a* to 101*c* and the connecting line 13 are arranged on the substrate 102 so as to be spaced from each other, wherein the longitudinal direction of the lines intersects at least one word line (for example, the word lines 100*a* to 100*c*). In addition, the connecting line 13 is formed into a pattern which can be connected to peripheral circuits 1001 and 1002, passing that part of the substrate which seals the opening portion of a receiving cavity 15. Each of the plurality of first electrodes 106 is connected, via wiring, to one selected in turn as an object for connection from among a plurality of bit lines such as the bit lines 101*a* to 101*c* and the connecting line 13. Each number of the first electrodes 106 and second electrodes 107 to be formed is the same as the number (for example, nine) of the memory elements which are to be produced.

Next, the coating process is carried out. In this process, coating layers to be produced are semiconductor layers 105 and 108 which differ in electrical characteristics. In this process, either the semiconductor layer 105 or the semiconductor layer 108, depending on the information to be recorded, is formed, by a coating method, in a region between the first electrode 106 and the second electrode 107 in each of a plurality of memory elements on the substrate 102. For example, the semiconductor layer 105 is formed by applying a CNT-containing solution to a region between the first electrode 106 and the second electrode 107 of each of the memory elements 10001 and 10003, and drying the resulting coating, if necessary. In addition, the semiconductor layer 108 is formed by applying a solution containing poly(3-hexylthiophene) (P3HT) to a region between the first electrode 106 and the second electrode 107 of the memory element 10002, and drying the resulting coating, if necessary. In this manner, the plurality of memory elements on the substrate 102 are produced differently as two kinds of memory elements that differ in electrical characteristics (that is, differ in recorded information) according to which semiconductor layer, 105 or 108, the memory elements have. This results in making it possible to produce a memory array (for example, the memory array 1000 depicted in FIG. 16A) in which information is recorded, wherein the information is determined by any arrangement of these memory elements of two kinds (for example, unique information that differs between/among the plurality of receiving cavities 15, information for sense of opening, and other information).

As with the coating process in the above-mentioned third example, the coating method in this process is preferably one selected from the group consisting of an inkjet method, a dispenser method, and a spray method. Among these, an inkjet method is more preferable from the viewpoint of printing position accuracy and efficiency of use of raw materials.

Examples of methods imparting different electrical characteristics to the different memory elements 10001 and 10002 include the below-mentioned method, in addition to using different semiconductor materials to form the different semiconductor layers 105 and 108. One method is one in which the amount of CNT solution that is applied to form the semiconductor layer 105 is made larger than the amount of CNT solution that is applied to form the semiconductor layer 108, whereby the film thickness of the semiconductor layer 105 is made larger than the film thickness of the semiconductor layer 108. Another method is one in which the same amount of semiconductor material to be applied is used to form each of the semiconductor layer 105 and the semiconductor layer 108, but in which the concentration of the CNT solution used to form the semiconductor layer 105 is made larger than the concentration of the CNT solution used to form the semiconductor layer 108. These methods make it possible to produce, in the same process, an arrangement, that is, a memory array formed by arbitrary combination of a plurality of memory elements of two kinds, which have different types of information recorded, for example, in such a manner that one of the two kinds of information, "0" and "1", is recorded in one memory element 10001, and the other kind of information is recorded in the other memory element 10002. However, any method other than these may be used as long as the method enables the electrical characteristics to differ sufficiently between the semiconductor layers.

(Example of Method of Producing Memory Array in Seventh and Eighth Examples of Wireless Communication Device)

Next, an example of a method of producing a memory array in the seventh and eighth examples of a wireless communication device according to the third embodiment of the present invention will be specifically described with reference to FIGS. 18A and 18B, taking the memory array 1100 depicted in FIG. 18A for example. This method of producing a memory array in the seventh and eighth examples includes processes of forming: a plurality of memory elements constituting this memory array; at least one word line; and a plurality of bit lines; the processes including, for example, a process of forming a wire for the first electrode, a process of forming an insulating layer, a process of forming a wire for the second electrode, a process of forming a semiconductor layer, and a coating process.

Specifically, the process of forming a wire for the first electrode is first carried out. In this process, three word lines 110a to 110c and a plurality of third electrodes 113 are simultaneously formed on a substrate 112 by the above-mentioned method, for example, carrying out vacuum evaporation through a mask. The plurality of third electrodes 113 are connected, via wiring, to one selected in turn as an object for connection from among the word lines 110a to 110c. The number of the third electrodes 113 to be formed is the same as the number (for example, nine) of the memory elements which are to be produced.

Next, the process of forming an insulating layer is carried out. In this process, a plurality of insulating layers 114 are formed on the substrate 112 to correspond to a plurality of third electrodes 113 by the above-mentioned method, for example, a printing method. The plurality of insulating layers 114 each come in contact with the third electrode 113 from above, and covers the third electrode 113, which is thus sandwiched between the substrate 112 and the insulating layer 114.

Next, the process of forming a wire for the second electrode is carried out. In this process, a plurality of bit lines (for example, the bit lines 111a to 111c and the connecting lines 13 as a bit line) and a plurality of pairs of the first electrode 116 and the second electrode 117 are simultaneously formed by the above-mentioned method, for example, using the same material and carrying out vacuum evaporation through a mask. In this case, the bit lines 111a to 111c and the connecting line 13 are arranged on the substrate 112 so as to be spaced from each other, wherein the longitudinal direction of the lines intersects at least one word line (for example, the word lines 110a to 110c). In addition, the connecting line 13 is formed into a pattern which can be connected to peripheral circuits 1101 and 1102, passing that part of the substrate which seals the opening portion of a receiving cavity 15. Each of the plurality of first electrodes 116 is connected, via wiring, to one selected in turn as an object for connection from among a plurality of bit lines such as the bit lines 111a to 111c and the connecting line 13. Each number of the first electrodes 116 and second electrodes 117 to be formed is the same as the number (for example, nine) of the memory elements which are to be produced.

Next, the process of forming a semiconductor layer is carried out. In this process, the semiconductor layer 115 is formed so as to be in contact with the insulating layer 114 in a region between the first electrode 116 and the second electrode 117 in each of a plurality of memory elements to be produced. For example, the semiconductor layer 115 in contact with the top side of the insulating layer 114 is formed by applying a CNT-containing solution to a region between the first electrode 116 and the second electrode 117 that are constituents of each of the memory elements 11001 to 11003, and drying the resulting coating, if necessary.

The coating method in this process is preferably one selected from the group consisting of an inkjet method, a dispenser method, and a spray method in the same manner as in the coating process in the above-mentioned third example. Among these, an inkjet method is more preferable from the viewpoint of printing position accuracy and efficiency of use of raw materials.

Next, the coating process is carried out. In this process, a coating layer to be produced is a first insulating layer 118 or a second insulating layer 119, wherein the insulating layers differ in electrical characteristics. In this process, either the first insulating layer 118 or the second insulating layer 119, depending on the information to be recorded, is formed in a region between the first electrode 116 and the second electrode 117 in each of a plurality of memory elements on the substrate 112 so as to be in contact with the opposite side of the semiconductor layer 115 from the insulating layer 114. For example, the first insulating layer 118 is formed by applying a solution containing an insulating material for formation of the first insulating layer 118 to a region between the first electrode 116 and the second electrode 117 of the memory element 11001 in such a manner that the solution covers the semiconductor layer 115, and drying the resulting coating, if necessary. The second insulating layer 119 is formed by applying a solution containing an insulating material for formation of the second insulating layer 119 to a region between the first electrode 116 and the second electrode 117 of the memory element 11002 in such a manner that the solution covers the semiconductor layer 115, and drying the resulting coating, if necessary. In this manner, the plurality of memory elements on the substrate 112 are produced differently as two kinds of memory elements that differ in electrical characteristics (that is, differ in recorded information) according to which of the first insulating layer 118 and the second insulating layer 119, the memory elements have. This results in making it possible to produce a memory array (for example, the memory array 1100 depicted in FIG. 18A) in which information is recorded, wherein the information is determined by arbitrary arrangement of these memory elements of two kinds (for example, unique information that differs between/among the plurality of receiving cavities 15, information for sense of opening, and other information).

Examples of coating methods in this process include, but are not limited to, an inkjet method, a dispenser method, a spray method, screen printing, gravure printing, flexographic printing, slit coating, and the like.

Any of the above-mentioned methods of producing a memory array in the third to eighth, eleventh, and twelfth examples is advantageous in terms of processes and cost in producing multiple memory arrays that differ in recorded information between/among the memory arrays. The memory arrays that differ in recorded information between/among them differ in the arrangement formed by arbitrary combination of the memory element(s) that record(s) "0" information and the memory element(s) that record(s) "1" information. If memory arrays will be formed so as to differ in the arrangement of memory elements of these two kinds, processes and cost are usually increased, for example, because different photomasks corresponding to different memory arrays are required. The above-mentioned methods of producing a memory array in the third to eighth, eleventh, and twelfth examples make it possible that the position of a memory element which involves forming a coating layer such as a semiconductor layer, a first insulating layer, and a second insulating layer is easily varied from memory array to memory array without using any mask. Thus, it is possible to produce multiple kinds of memory arrays that differ in the arrangement of the memory elements of the two kinds. This makes it possible that multiple memory arrays which differ in recorded information are produced in convenient processes at low cost. Accordingly, a package including a wireless communication device having different IDs for different receiving cavities 15 can be obtained in low-cost production.

(Flip Flop Circuit in Ninth and Tenth Examples of Wireless Communication Device)

Next, a thin film transistor included in each of the flip flop circuits in the ninth and tenth examples of a wireless communication device according to the third embodiment the present invention can be a generally used one, and is not limited to any particular material to be used or any particular shape. In addition, the materials that each electrically connect these circuits may be any of those which are generally used conducting materials. The methods of connecting these circuits may be any of those which can bring about electrical conduction, and the width and thickness of a connecting portion between the circuits can be any width and thickness. As above-mentioned, however, the forming method is preferably a coating method such as printing from the viewpoint of production cost, and the same material as for the above-mentioned memory element is preferably used. From the viewpoint of the element performance, the semiconductor layer in particular preferably contains a carbon nanotube composite in which a conjugated polymer is adhered to at least a part of the surface of a carbon nanotube.

In this regard, the above-mentioned first electrode wire formation process, insulating layer formation process, second electrode wire formation process, semiconductor layer formation process, and coating process in the methods of producing a memory element, memory array, and flip flop circuit in the first to twelfth examples may be included in the functional portion formation step in a method of producing a package according to the present invention.

(Memory Unit)

A memory unit in the first to twelfth examples of a wireless communication device according to the third embodiment of the present invention will be described. As above-mentioned, the memory unit 141 according to the present invention has, as its constituents, at least a memory element (for example, a memory element 800 depicted in FIG. 12B), a memory array (a memory array 900 depicted in FIG. 14B, a memory array 1000 depicted in FIG. 16B, a memory array 1100 depicted in FIG. 18B, or a memory array 900 depicted in FIG. 22B), or a flip flop circuit (for example, flip flop circuits 13001 and 13002 depicted in FIGS. 20B to 20E), and a peripheral circuit (peripheral circuits 801 and 802 depicted in FIG. 12B, peripheral circuits 901 and 902 depicted in FIG. 14B, peripheral circuits 1001 and 1002 depicted in FIG. 16A, peripheral circuits 1101 and 1102 depicted in FIG. 18A, or a peripheral circuit 1103 depicted in FIGS. 20B to 20E).

In a specific example of a peripheral circuit, peripheral circuits 801, 901, 1001, and 1101 have a ring oscillator circuit and a counter circuit, and peripheral circuits 802, 902, 1002, and 1102 have a flip flop circuit. For example, a clock signal generated from a ring oscillator circuit is inputted in a counter circuit. This causes a selection signal to be outputted from a counter circuit to bit lines (for example, bit lines 91a to 91c depicted in FIG. 14B), word lines (for example, word lines 90a to 90c depicted in FIG. 14B), and a connecting line 13 in the memory array. By virtue of such a selection signal output, a memory element for information read-out is sequentially selected in predetermined order from among a plurality of memory elements (for example, memory elements 9001 to 9009 depicted in FIG. 14B) in the memory array. Pieces of information (for example, binary information such as "0" or "1") each recorded in each of the plurality of memory elements are sequentially read in this selection order. The pieces of information arranged in order of read-out are inputted from the memory array into a flip flop circuit as recorded information such as unique information of the memory array. The flip flop circuit stabilizes these pieces of information using a clock signal inputted from the ring oscillator circuit and the information inputted from the memory array. The stabilized pieces of information are outputted, as recorded information of the memory array, from the flip flop circuit and out of the memory circuit.

A thin film transistor included in each of the ring oscillator circuit, the counter circuit, and the flip flop circuit can be a generally used one, and is not limited to any particular material to be used or any particular shape. In addition, the materials that each electrically connect these circuits may be any of those which are generally used conducting materials. The methods of connecting these circuits may be any of those which can bring about electrical conduction, and the width and thickness of a connecting portion between the circuits can be any width and thickness. However, the memory unit is also a constituent of the circuit unit 14 (see, for example, FIG. 14A), and is preferably formed by a coating method such as printing from the viewpoint of production cost, as above-mentioned. In this manner, at least one constituent of the memory unit as a memorizing method is preferably formed by a coating method such as printing, from the viewpoint of production cost. More preferably, all constituents of the memory unit are formed by a coating method such as printing.

Fourth Embodiment

Figure 24A:
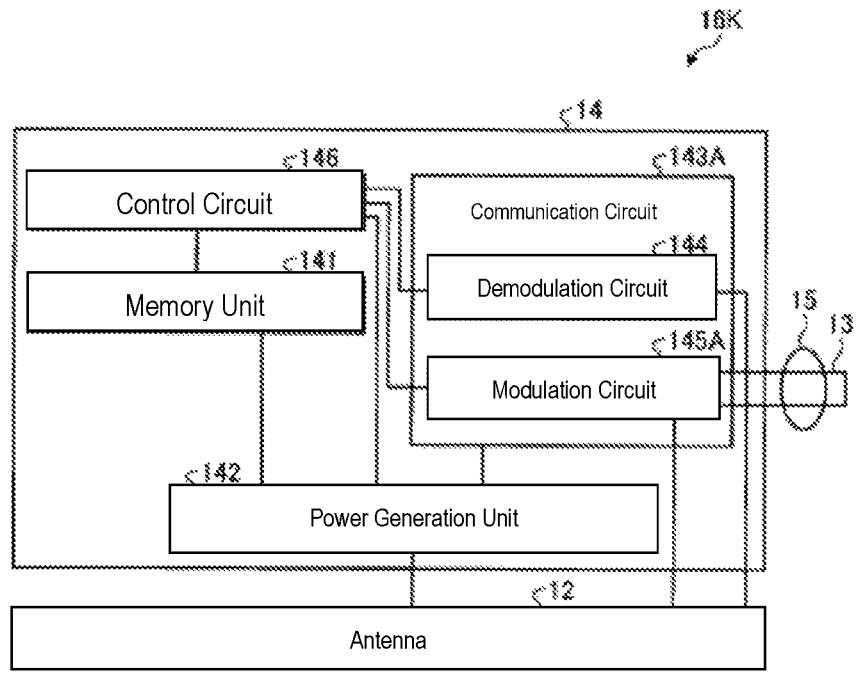
FIG. 24A is a block diagram depicting a configuration example of a wireless communication device according to a fourth embodiment of the present invention.
Figure 24B:
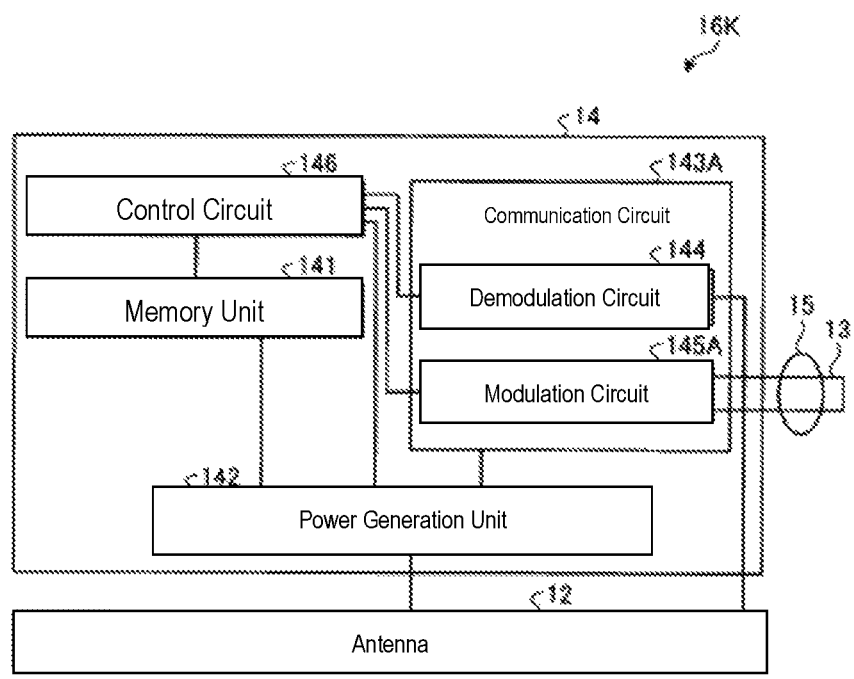
FIG. 24B is a block diagram depicting another configuration example of the wireless communication device according to the fourth embodiment of the present invention.

A fourth embodiments of a wireless communication device employed for a package according to the present invention will be described. FIGS. 24A and 24B are block diagrams depicting a configuration example of a wireless communication device according to the fourth embodiment of the present invention, wherein the wireless communication device is in the package 10 depicted in FIG. 1A. A wireless communication device 16K according to the fourth embodiment is an example of a wireless communication device (for example, a wireless communication device 16 depicted in FIG. 10) employed for a package according to the present invention.

As depicted in FIGS. 24A and 24B, the wireless communication device 16K has a circuit unit 14 including a communication circuit 143A in place of a communication circuit 143 of the wireless communication device 16 depicted in FIG. 10. The communication circuit 143A has a modulation circuit 145A in place of the modulation circuit 145 of the wireless communication device 16. A connecting line 13 is electrically connected to this modulation circuit 145A. In the wireless communication device 16K illustrated in FIG. 24A, the modulation circuit 145A and an antenna 12 are connected via wiring. In the wireless communication device 16K illustrated in FIG. 24B, the modulation circuit 145A and an antenna 12 are connected via wiring and a power generation unit 142. According to the wireless communication device 16K having such a configuration, the state of modulation of a signal transmitted to an external device such as reader is varied between before and after the connecting line 13 is cut as a result of opening a receiving cavity 15, thereby transmitting, to an external device, a signal including information that differs according to whether the receiving cavity 15 is opened, and making it possible to sense whether the receiving cavity 15 is opened. The other constituents are the same as those of the above-mentioned wireless communication device 16, and the same configuration parts are indicated by the same reference signs.

The modulation circuit 145A modulates a signal including information to be transmitted from the wireless communication device 16K to an external device, in such a manner that the signal differs between before and after the connecting line 13 is cut as a result of opening the receiving cavity 15. Specifically, the modulation circuit 145A places information on a carrier wave in accordance with control by the control circuit 146, wherein the information is information (for example, digital information according to an arrangement of "0" and "1") read out of the memory unit 141 and is placed as information for transmission. In this case, the modulation circuit 145A carries out modulation by which the amplitude, frequency, and phase of the carrier wave are varied on the basis of the information for transmission, thereby generating a modulated wave signal including the information for transmission. The modulated wave signal generated by the modulation circuit 145A is wirelessly transmitted from the antenna 12 to an external device. As a result, the wireless communication device 16K can transmit, to an external device, the transmission object information using the carrier wave as a medium.

In particular, in the fourth embodiment, the modulation circuit 145A causes the state of modulation of the amplitude, frequency, phase, and the like of the modulated carrier wave to vary between before and after the connecting line 13 is cut as a result of opening the receiving cavity 15. This causes the modulation circuit 145A to generate a modulated wave signal in such a manner that the state of modulation differs between before and after the connecting line 13 is cut. Thus, the information for transmission results in differing between before and after the connecting line 13 is cut. The wireless communication device 16K transmits, to an external device, a modulated wave signal resulting from such modulation carried out by the modulation circuit 145A, thus making it possible to transmit, to an external device, information that differs before and after the connecting line 13 is cut, that is, differs according to whether the receiving cavity 15 is opened. In this regard, the state of modulation that differs between before and after the connecting line 13 is cut may be that of any of the amplitude, frequency, and phase of the signal (transmitted signal) including information for transmission.

Figure 24C:
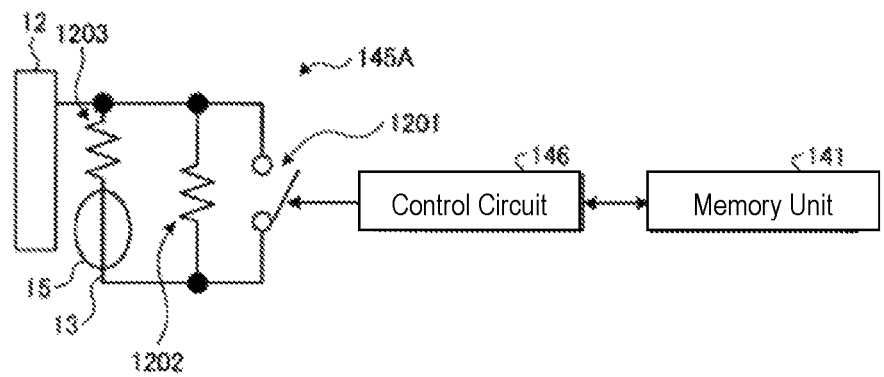
FIG. 24C is a diagram depicting a configuration example of a modulation circuit employed for the wireless communication device according to the fourth embodiment of the present invention depicted in FIG. 24A.

FIG. 24C is a diagram depicting a configuration example of a modulation circuit employed for the wireless communication device according to the fourth embodiment of the present invention depicted in FIG. 24A. FIG. 24C depicts an example of the modulation circuit 145A, wherein, in the example, the state of modulation of the amplitude of a transmitted signal is varied between before and after the connecting line 13 is cut as a result of opening the receiving cavity 15, but the configuration of the modulation circuit 145A is not limited to this.

As depicted in FIG. 24C, the modulation circuit 145A has a switch circuit 1201 and a plurality of (two in FIG. 24C) resistance elements 1202 and 1203. The switch circuit 1201 is controlled by a control circuit 146 for opening and closing. The resistance elements 1202 and 1203 are each configured with, for example, a load resistance, and connected (for example, connected in parallel) to the switch circuit 1201 via wiring. These switch circuit 1201 and resistance elements 1202 and 1203 are connected to an antenna 12 via wiring. In addition, the resistance elements 1202 and 1203 are connected to each other in parallel via wiring such as the connecting line 13. The impedance of the resistance elements 1202 and 1203 connected in parallel is set so as to be the same as the impedance of the antenna 12.

Furthermore, in the fourth embodiment, the connecting line 13 is connected to both of the resistance elements 1202 and 1203 before the connecting line 13 is cut as a result of opening the receiving cavity 15, and the connecting line 13 is connected to one resistance element 1202 and disconnected from the other resistance element 1203 after the connecting line 13 is cut as a result of opening the receiving cavity 15. That is, the connecting line 13 is connected to at least one of these resistance elements 1202 and 1203.

Here, the connecting line 13 is in an uncut state when the receiving cavity 15 is not opened yet. If the switch circuit 1201 is opened in this state, the impedance of the antenna 12 and the impedance of the resistance elements 1202 and 1203 are the same, as above-mentioned, a carrier wave transmitted from an external device such as a reader is not reflected in the modulation circuit 145A. In this case, the modulation circuit 145A can modulate the amplitude of the reflected wave into zero. In this case, the modulation circuit 145A modulates the carrier wave in such a manner that transmission object information which has been read out of the memory unit 141 is made "0". On the other hand, if the switch circuit 1201 is short-circuited (closed), the total reflection of the above-mentioned carrier wave is caused in the modulation circuit 145A. In this case, the modulation circuit 145A does not cause the modulation of the amplitude of the reflected wave. In this case, the modulation circuit 145A modulates the carrier wave in such a manner that transmission object information which has been read out of the memory unit 141 is made "1". In this manner, the amplitude of a carrier wave is modulated by the modulation circuit 145A in such a manner that transmission object information is made "0" or "1", and utilizing the modulation makes it possible that information recorded in the memory unit 141 is modulated into digital information corresponding to the state shown before the connecting line 13 is cut, and then, that the digital information is transmitted from the wireless communication device 16K to an external device.

On the other hand, when the receiving cavity 15 is opened, the connecting line 13 results in being cut at its part corresponding to the receiving cavity 15. In this state, the impedance of the resistance elements 1202 and 1203 results in varying, and owing to this, the impedance of the antenna 12 and the impedance of the resistance elements 1202 and 1203 result in becoming not the same. As a result, even if the switch circuit 1201 is opened, the above-mentioned carrier wave is reflected in the modulation circuit 145A, and thus, the amplitude of the reflected wave is not zero. In this case, the amplitude of the modulated wave signal on which transmission object information read out of the memory unit 141 is placed turns into a lowered state. That is, the modulation circuit 145A modulates a signal including transmission object information in such a manner that the signal differs between before and after the connecting line 13 is cut as a result of opening the receiving cavity 15. The wireless communication device 16K transmits, to an external device, the modulated wave signal including this transmission object information. In this manner, the amplitude of the modulated wave signal transmitted from the wireless communication device 16K to an external device after the receiving cavity 15 is opened is varied, compared with the amplitude shown before the receiving cavity 15 is opened. Sensing this variation in the amplitude using an external device makes it possible to sense whether the receiving cavity 15 is opened.

Figure 24D:
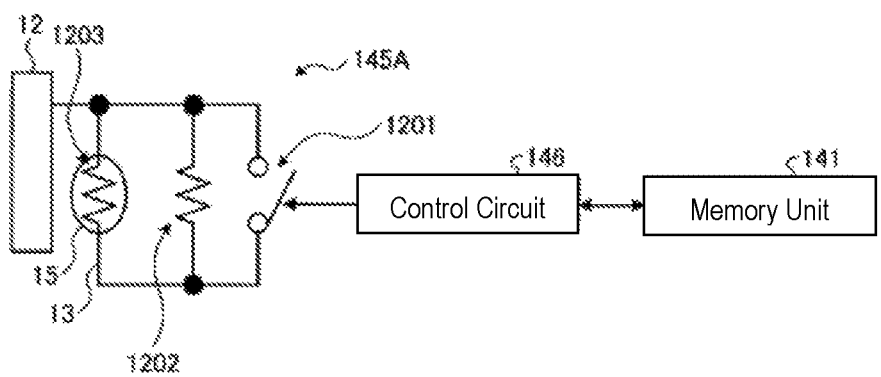
FIG. 24D is a diagram depicting another example of the configuration of a resistance element employed for the modulation circuit in the fourth embodiment of the present invention depicted in FIG. 24C.

In this regard, the configuration of the resistance elements 1202 and 1203 in the modulation circuit 145A is not limited to that depicted in FIG. 24C. FIG. 24D is a diagram depicting another example of the configuration of a resistance element employed for the modulation circuit in the fourth embodiment of the present invention depicted in FIG. 24C. As depicted in FIG. 24D, one (for example, a resistance element 1203) of the two resistance elements 1202 and 1203 in the modulation circuit 145A may be positioned at a part along the connecting line 13 on a substrate, wherein the part seals the opening portion of the receiving cavity 15. According to this configuration, the resistance element 1203, together with the connecting line 13, is cut as a result of opening the receiving cavity 15.

Figure 24E:
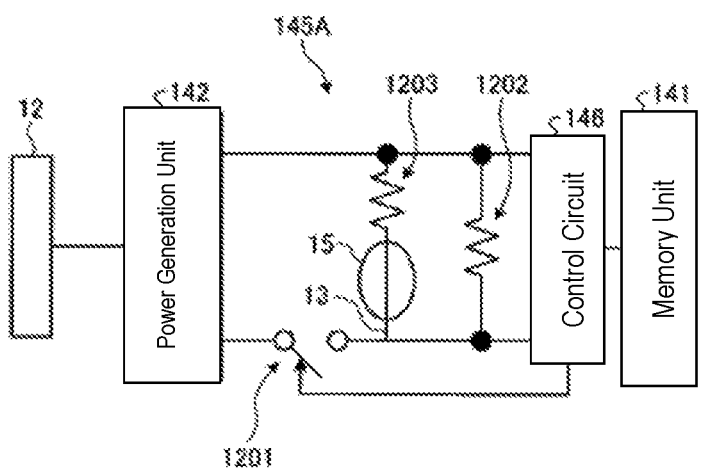
FIG. 24E is a diagram depicting a configuration example of the modulation circuit employed for the wireless communication device according to the fourth embodiment of the present invention depicted in FIG. 24B.

FIG. 24E is a diagram depicting a configuration example of a modulation circuit employed for the wireless communication device according to the fourth embodiment of the present invention depicted in FIG. 24B. FIG. 24E depicts an example of the modulation circuit 145A, wherein, in the example, the state of modulation of the amplitude of a transmitted signal is varied between before and after the connecting line 13 is cut as a result of opening the receiving cavity 15, but the configuration of the modulation circuit 145A is not limited to this.

As depicted in FIG. 24E, the modulation circuit 145A has a switch circuit 1201 and a plurality of (two in FIG. 24E) resistance elements 1202 and 1203. The switch circuit 1201 is controlled by a control circuit 146 for opening and closing. The resistance elements 1202 and 1203 are configured with, for example, a load resistance, and connected (for example, connected in series) to the switch circuit 1201 via wiring. These switch circuit 1201 and resistance elements 1202 and 1203 are connected to a power generation unit 142 via wiring. The power generation unit 142 is connected to an antenna 12 via wiring. In addition, the resistance elements 1202 and 1203 are connected to each other in parallel via wiring such as the connecting line 13. The design is such that the resistance elements 1202 and 1203 connected in parallel cause the impedance of a control circuit 146 and a memory unit 141 to be the same as the impedance of the antenna 12.

Furthermore, in the fourth embodiment, the connecting line 13 is connected to both of the resistance elements 1202 and 1203 before the connecting line 13 is cut as a result of opening the receiving cavity 15, and the connecting line 13 is connected to one resistance element 1202 and disconnected from the other resistance element 1203 after the connecting line 13 is cut as a result of opening the receiving cavity 15. That is, the connecting line 13 is connected to at least one of these resistance elements 1202 and 1203 also in the configuration illustrated in FIG. 24E.

Here, the connecting line 13 is in an uncut state when the receiving cavity 15 is not opened yet. If the switch circuit 1201 is opened in this state, the impedance of the antenna 12 and the impedance of the control circuit 146 and the memory unit 141 are the same, as above-mentioned, a carrier wave transmitted from an external device such as a reader is not reflected in the modulation circuit 145A. In this case, the modulation circuit 145A can modulate the amplitude of the reflected wave into zero. In this case, the modulation circuit 145A modulates the carrier wave in such a manner that transmission object information which has been read out of the memory unit 141 is made "0". On the other hand, if the switch circuit 1201 is short-circuited (closed), the total reflection of the above-mentioned carrier wave is caused in the modulation circuit 145A. In this case, the modulation circuit 145A does not cause the modulation of the amplitude of the reflected wave. In this case, the modulation circuit 145A modulates the carrier wave in such a manner that transmission object information which has been read out of the memory unit 141 is made "1". In this manner, the amplitude of a carrier wave is modulated by the modulation circuit 145A in such a manner that transmission object information is made "0" or "1", and utilizing the modulation makes it possible that information recorded in the memory unit 141 is modulated into digital information corresponding to the state shown before the connecting line 13 is cut, and then, that the digital information is transmitted from the wireless communication device 16K to an external device.

On the other hand, when the receiving cavity 15 is opened, the connecting line 13 results in being cut at its part corresponding to the receiving cavity 15. In this state, the impedance of the resistance elements 1202 and 1203 results in varying, and owing to this, the impedance of the antenna 12 and the impedance of the control circuit 146 and the memory unit 141 result in becoming not the same. As a result, even if the switch circuit 1201 is opened, the above-mentioned carrier wave is reflected in the modulation circuit 145A, and thus, the amplitude of the reflected wave is not zero. In this case, the amplitude of the modulated wave signal on which transmission object information read out of the memory unit 141 is placed turns into a lowered state. That is, the modulation circuit 145A modulates a signal including transmission object information in such a manner that the signal differs between before and after the connecting line 13 is cut as a result of opening the receiving cavity 15. The wireless communication device 16K transmits, to an external device, the modulated wave signal including this transmission object information. In this manner, the amplitude of the modulated wave signal transmitted from the wireless communication device 16K to an external device after the receiving cavity 15 is opened is varied, compared with the amplitude shown before the receiving cavity 15 is opened. Sensing this variation in the amplitude using an external device makes it possible to sense whether the receiving cavity 15 is opened.

Figure 24F:
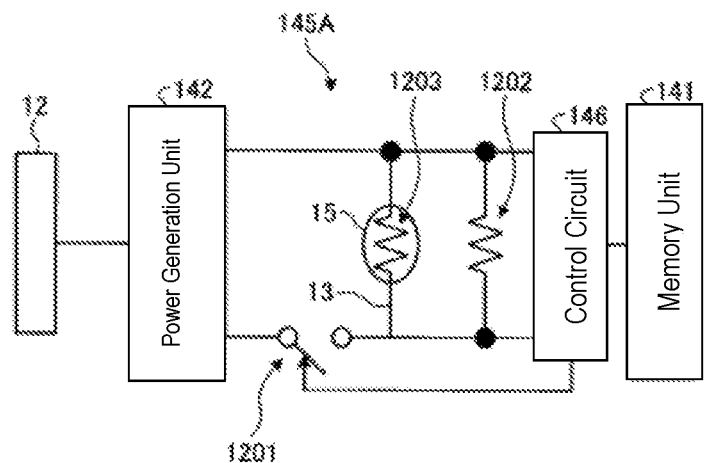
FIG. 24F is a diagram depicting another configuration example of the resistance element employed for the modulation circuit in the fourth embodiment of the present invention depicted in FIG. 24E.

In this regard, the configuration of the resistance elements 1202 and 1203 in the modulation circuit 145A is not limited to that depicted in FIG. 24E. FIG. 24F is a diagram depicting another example of the configuration of a resistance element employed for the modulation circuit in the fourth embodiment of the present invention depicted in FIG. 24E. As depicted in FIG. 24F, one (for example, a resistance element 1203) of the two resistance elements 1202 and 1203 in the modulation circuit 145A may be positioned at a part along the connecting line 13 on a substrate, wherein the part seals the opening portion of the receiving cavity 15. According to this configuration, the resistance element 1203, together with the connecting line 13, is cut as a result of opening the receiving cavity 15.

Another Example of Fourth Embodiment

Figure 25A:
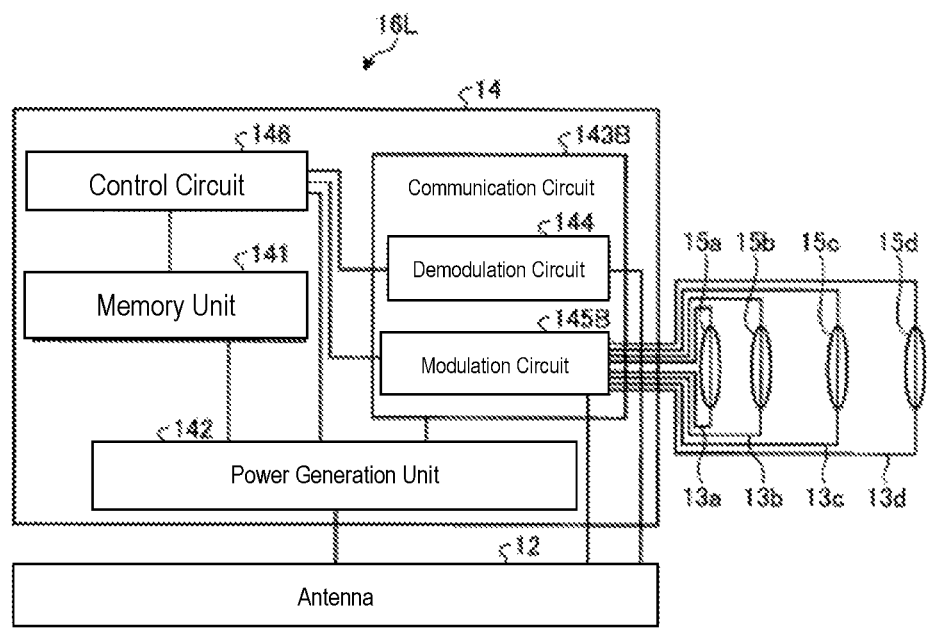
FIG. 25A is a block diagram depicting a configuration example of the wireless communication device according to the fourth embodiment of the present invention.
Figure 25B:
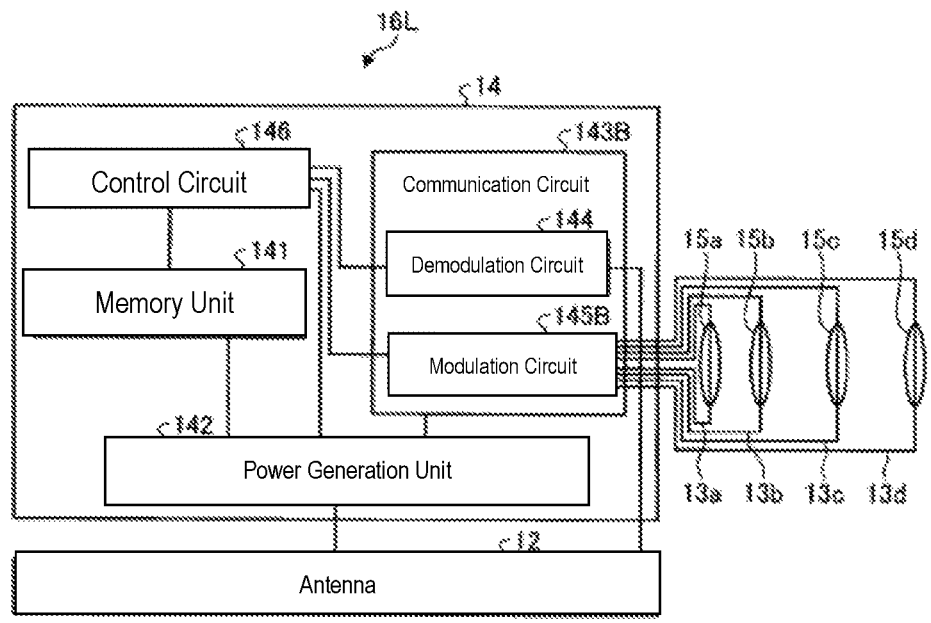
FIG. 25B is a block diagram depicting another configuration example of the wireless communication device according to the fourth embodiment of the present invention.

FIGS. 25A and 25B are block diagrams depicting a configuration example of a wireless communication device according to the fourth embodiment of the present invention, wherein the wireless communication device is in the package 10A depicted in FIG. 4A. FIGS. 25A and 25B are the same as FIGS. 24A and 24B except that connecting lines 13a to 13d are connected to one wireless communication device 16L.

As depicted in FIGS. 25A and 25B, the wireless communication device 16L has a circuit unit 14 including a communication circuit 143B in place of the communication circuit 143 of a wireless communication device 16 depicted in FIG. 10. The communication circuit 143B has a modulation circuit 145B in place of the modulation circuit 145 of the wireless communication device 16.

Figure 25C:
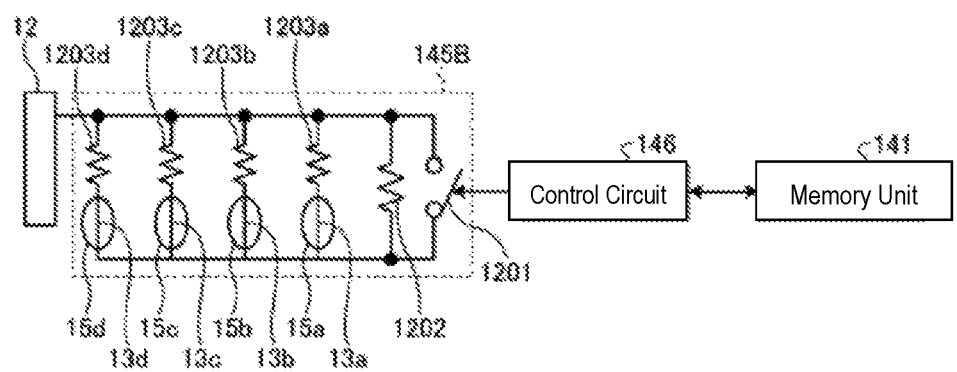
FIG. 25C is a diagram depicting a configuration example of a modulation circuit employed for the wireless communication device according to the fourth embodiment of the present invention depicted in FIG. 25A.

FIG. 25C is a diagram depicting a configuration example of a modulation circuit employed for the wireless communication device 16L according to the fourth embodiment of the present invention depicted in FIG. 25A. FIG. 25C depicts an example of the modulation circuit 145B, wherein, in the example, the state of modulation of the amplitude of a transmitted signal is varied between before and after the connecting lines 13a to 13d are cut as a result of opening the receiving cavities 15a to 15d, but the configuration of the modulation circuit 145B is not limited to this.

As depicted in FIG. 25C, the modulation circuit 145B has a switch circuit 1201 and a plurality of (five in FIG. 25C) resistance elements 1202 and 1203a to 1203d. The switch circuit 1201 is controlled by a control circuit 146 for opening and closing. The resistance elements 1202 and 1203a to 1203d are each configured with, for example, a load resistance, and connected (for example, connected in parallel) to the switch circuit 1201 via wiring. These switch circuit 1201 and resistance elements 1202 and 1203a to 1203d are connected to an antenna 12 via wiring. In addition, the resistance elements 1202 and 1203a to 1203d are connected to each other in parallel via wiring such as the connecting line 13. The impedance of the resistance elements 1202 and 1203a to 1203d connected in parallel is set so as to be the same as the impedance of the antenna 12.

Furthermore, in the fourth embodiment, the connecting lines 13a to 13d are connected to all of the resistance elements 1202 and 1203a to 1203d before any of the connecting lines is cut as a result of opening any of the receiving cavities 15a to 15d, and the connecting lines 13 are connected to one resistance element 1202 and disconnected from any or all of the other resistance elements 1203a to 1203d after any or all of the connecting lines is/are cut as a result of opening any or all of the receiving cavities 15a to 15d.

Here, the connecting lines 13a to 13d are in an uncut state when the receiving cavities 15a to 15d are not opened yet. If the switch circuit 1201 is opened in this state, the impedance of the antenna 12 and the impedance of the resistance elements 1202 and 1203a to 1203d are the same, as above-mentioned, a carrier wave transmitted from an external device such as a reader is not reflected in the modulation circuit 145B. In this case, the modulation circuit 145B can modulate the amplitude of the reflected wave into zero. In this case, the modulation circuit 145B modulates the carrier wave in such a manner that transmission object information which has been read out of the memory unit 141 is made "0". On the other hand, if the switch circuit 1201 is short-circuited (closed), the total reflection of the above-mentioned carrier wave is caused at the modulation circuit 145B. In this case, the modulation circuit 145B does not cause the modulation of the amplitude of the reflected wave. In this case, the modulation circuit 145B modulates the carrier wave in such a manner that transmission object information which has been read out of the memory unit 141 is made "1". In this manner, the amplitude of a carrier wave is modulated by the modulation circuit 145B in such a manner that transmission object information is made "0" or "1", and utilizing the modulation makes it possible that information recorded in the memory unit 141 is modulated into digital information corresponding to the state shown before the connecting lines 13a to 13d are cut, and then, that the digital information is transmitted from the wireless communication device 16L to an external device.

On the other hand, when the receiving cavity 15a is opened, the connecting line 13a results in being cut at its part corresponding to the receiving cavity 15a. In this state, the impedance of the resistance elements 1202 and 1203a to 1203d results in varying, and owing to this, the impedance of the antenna 12 and the impedance of the resistance elements 1202 and 1203a to 1203d result in becoming not the same. As a result, even if the switch circuit 1201 is opened, the above-mentioned carrier wave is reflected in the modulation circuit 145B, and thus, the amplitude of the reflected wave is not zero. In this case, the amplitude of the modulated wave signal on which transmission object information read out of the memory unit 141 is placed turns into a lowered state. When the receiving cavity 15b is then opened, the connecting line 13b results in being cut at its part corresponding to the receiving cavity 15b, and the difference between the impedance of the antenna 12 and the impedance of the resistance elements 1202 and 1203a to 1203d becomes still larger. As a result of this, the amplitude of the modulated wave signal on which transmission object information read out of the memory unit 141 is placed turns into a lowered state. Similarly, when the receiving cavities 15c and 15d are opened in turn, the difference between the impedance of the antenna 12 and the impedance of the resistance elements 1202 and 1203a to 1203d becomes even larger, and the amplitude of the modulated wave signal on which transmission object information read out of the memory unit 141 is placed is decreased stepwise. That is, the modulation circuit 145B transmits, to an external device, different modulated wave signals including the transmission object information, wherein the signals differ according to whether the receiving cavities 15a to 15d are opened. Sensing the state of this amplitude using an external device makes it possible to sense the number of those receiving cavities of the receiving cavities 15a to 15d which are opened.

Figure 25D:
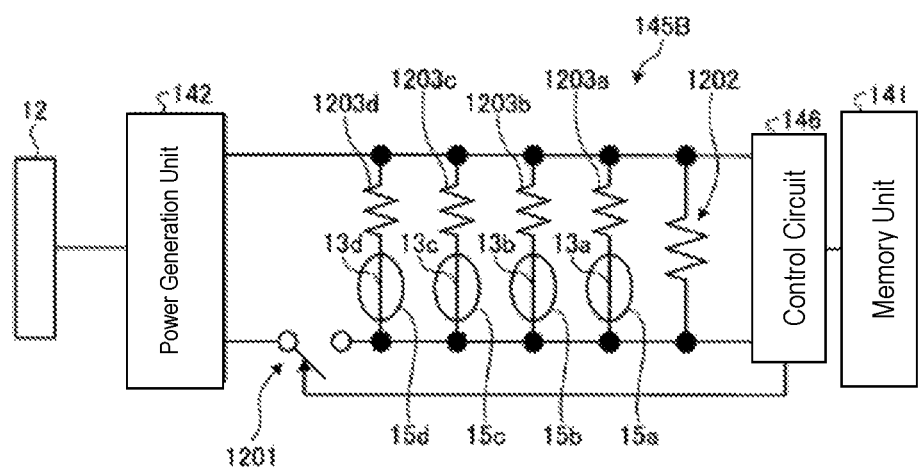
FIG. 25D is a diagram depicting a configuration example of the modulation circuit employed for the wireless communication device according to the fourth embodiment of the present invention depicted in FIG. 25B.

FIG. 25D is a diagram depicting a configuration example of a modulation circuit employed for the wireless communication device according to the fourth embodiment of the present invention depicted in FIG. 25B. FIG. 25D depicts an example of the modulation circuit 145B, wherein, in the example, the state of modulation of the amplitude of a transmitted signal is varied between before and after the connecting lines 13a to 13d are cut as a result of opening the receiving cavities 15a to 15d, but the configuration of the modulation circuit 145B is not limited to this.

As depicted in FIG. 25D, the modulation circuit 145B has a switch circuit 1201 and a plurality of (five in FIG. 25D) resistance elements 1202 and 1203a to 1203d. The switch circuit 1201 is controlled by a control circuit 146 for opening and closing. The resistance elements 1202 and 1203a to 1203d are each configured with, for example, a load resistance, and connected (for example, connected in series) to the switch circuit 1201 via wiring. These switch circuit 1201 and resistance elements 1202 and 1203a to 1203d are connected to a power generation unit 142 via wiring. The power generation unit 142 is connected to an antenna 12 via wiring. In addition, the resistance elements 1202 and 1203a to 1203d are connected to each other in parallel via wiring such as the connecting lines 13a to 13d. The design is such that the resistance elements 1202 and 1203a to 1203d connected in parallel cause the impedance of a control circuit 146 and a memory unit 141 to be the same as the impedance of the antenna 12.

Furthermore, in the fourth embodiment, the connecting lines 13a to 13d are connected to all of the resistance elements 1202 and 1203a to 1203d before the connecting lines are cut as a result of opening the receiving cavities 15*a* to 15*d*, and the connecting lines 13 are connected to one resistance element 1202 and disconnected from the other resistance elements 1203*a* to 1203*d* after the connecting lines are cut as a result of opening the receiving cavities 15*a* to 15*d*.

Here, the connecting lines 13*a* to 13*d* are in an uncut state when the receiving cavities 15*a* to 15*d* are not opened yet. If the switch circuit 1201 is opened in this state, the impedance of the antenna 12 and the impedance of the control circuit 146 and the memory unit 141 are the same, as above-mentioned, a carrier wave transmitted from an external device such as a reader is not reflected in the modulation circuit 145B. In this case, the modulation circuit 145B can modulate the amplitude of the reflected wave into zero. In this case, the modulation circuit 145B modulates the carrier wave in such a manner that transmission object information which has been read out of the memory unit 141 is made "0". On the other hand, if the switch circuit 1201 is short-circuited (closed), the total reflection of the above-mentioned carrier wave is caused at the modulation circuit 145B. In this case, the modulation circuit 145B does not cause the modulation of the amplitude of the reflected wave. In this case, the modulation circuit 145B modulates the carrier wave in such a manner that transmission object information which has been read out of the memory unit 141 is made "1". In this manner, the amplitude of a carrier wave is modulated by the modulation circuit 145B in such a manner that transmission object information is made "0" or "1", and utilizing the modulation makes it possible that information recorded in the memory unit 141 is modulated into digital information corresponding to the state shown before the connecting line 13 is cut, and then, that the digital information is transmitted from the wireless communication device 16C to an external device.

On the other hand, when the receiving cavity 15*a* is opened, the connecting line 13*a* results in being cut at its part corresponding to the receiving cavity 15*a*. In this state, the impedance of the resistance element 1202 and 1203*a* to 1203*d* results in varying, and owing to this, the impedance of the antenna 12 and the impedance of the control circuit 146 and the memory unit 141 result in becoming not the same. As a result, even if the switch circuit 1201 is opened, the above-mentioned carrier wave is reflected in the modulation circuit 145B, and thus, the amplitude of the reflected wave is not zero. In this case, the amplitude of the modulated wave signal on which transmission object information read out of the memory unit 141 is placed turns into a lowered state. That is, the modulation circuit 145B modulates a signal including transmission object information in such a manner that the signal differs between before and after the connecting line 13*a* is cut as a result of opening the receiving cavity 15*a*. When the receiving cavity 15*b* is then opened, the connecting line 13*b* results in being cut at its part corresponding to the receiving cavity 15*b*, and the difference between the impedance of the antenna 12 and the impedance of the control circuit 146 and the memory unit 141 becomes still larger. As a result of this, the amplitude of the modulated wave signal on which transmission object information read out of the memory unit 141 is placed turns into a lowered state. Similarly, when the receiving cavities 15*c* and 15*d* are opened in turn, the difference between the impedance of the antenna 12 and the impedance of the control circuit 146 and the memory unit 141 becomes even larger, and the amplitude of the modulated wave signal on which transmission object information read out of the memory unit 141 is placed is decreased stepwise. That is, the modulation circuit 145B transmits, to an external device, different modulated wave signals including the transmission object information, wherein the signals differ according to whether the receiving cavities 15*a* to 15*d* are opened. Sensing the state of this amplitude using an external device makes it possible to sense the number of those receiving cavities 15 of the receiving cavities 15*a* to 15*d* which are opened.

In addition, in the fourth embodiment, the switch circuit 1201 employed for the modulation circuits 145A and 145B is not limited to any particular one, examples of the switch circuit including a switch element configured with a thin film transistor. A thin film transistor is an example of a transistor having a semiconductor layer. Examples of the structure of this thin film transistor include the same TFT structure as of the thin film transistor 20 depicted in FIG. 8. Materials that can be used for this thin film transistor are the above-mentioned same materials as used for the thin film transistor 20. In particular, the semiconductor layer of this thin film transistor preferably contains, as a semiconductor material, one or more selected from the group consisting of CNTs, graphene, fullerene, and organic semiconductors, from the viewpoint of the capability to form a semiconductor layer out of a semiconductor material by a coating method. In addition, the semiconductor layer of this thin film transistor more preferably contains CNTs as a semiconductor material from the viewpoint of: the capability to form a semiconductor layer at a low temperature of 200° C. or less; high semiconductor characteristics; and the like.

Among the CNTs, a CNT composite in which a conjugated polymer is adhered to at least a part of the surface of the CNT is particularly preferable. This is because the CNTs are enabled to be uniformly dispersed in a solution for formation of a semiconductor layer without impairing the high electrical characteristics retained by CNTs. Using a solution having CNTs uniformly dispersed therein makes it possible that a film having CNTs uniformly dispersed therein is formed as the semiconductor layer by a coating method such as an inkjet method.

A load resistance material employed for the resistance elements 1202 and 1203*a* to 1203*d* may be any conducting material that can be generally used as a resistance element. Examples of such materials include metal oxides such as tin oxide, indium oxide, indium tin oxide (ITO), and ruthenium oxide. In addition, examples of the materials include: metals such as platinum, gold, silver, copper, iron, tin, zinc, aluminum, indium, chromium, lithium, sodium, potassium, cesium, calcium, magnesium, palladium, molybdenum, amorphous silicon, and polysilicon; and alloys of a plurality of metals selected from these; and inorganic compounds such as copper iodide and copper sulfide. In addition, examples of the materials include: polythiophene, polypyrrole, polyaniline, and complexes of polyethylenedioxythiophene and polystyrene sulfonate; and conducting polymers doped with iodine or the like to have higher electrical conductivity. Further examples of the materials include: carbon materials; materials containing organic components and conductors; and the like. However, the load resistance material is not limited to these. These materials may be used singly, or two or more of the materials may be laminated or mixed to be used.

Examples of methods of forming a load resistance include: a method in which a conventional resistance element is mounted; a method in which a pattern of a conducting film is formed by a known photolithographic technique; a method in which a pattern is formed via a mask in desired shape in evaporating or sputtering an electrode substance; a method in which an electrode thin film produced by the above-mentioned method is formed into a pattern by laser processing; a method in which a pattern is formed by photolithographic processing using a photosensitive conducting paste; a method in which a pattern is directly formed by a printing technique; and the like. Examples of methods of forming a conducting film include resistance heating evaporation, electron beam, sputtering, plating, CVD, ion plating coating, inkjet, printing, and the like. Examples of printing techniques in directly forming a load resistance as a pattern include inkjet, screen printing, gravure printing, flexographic printing, and the like. It should be noted that a method of forming a load resistance is not limited to these.

(Cavity Item Management System)

Figure 26:
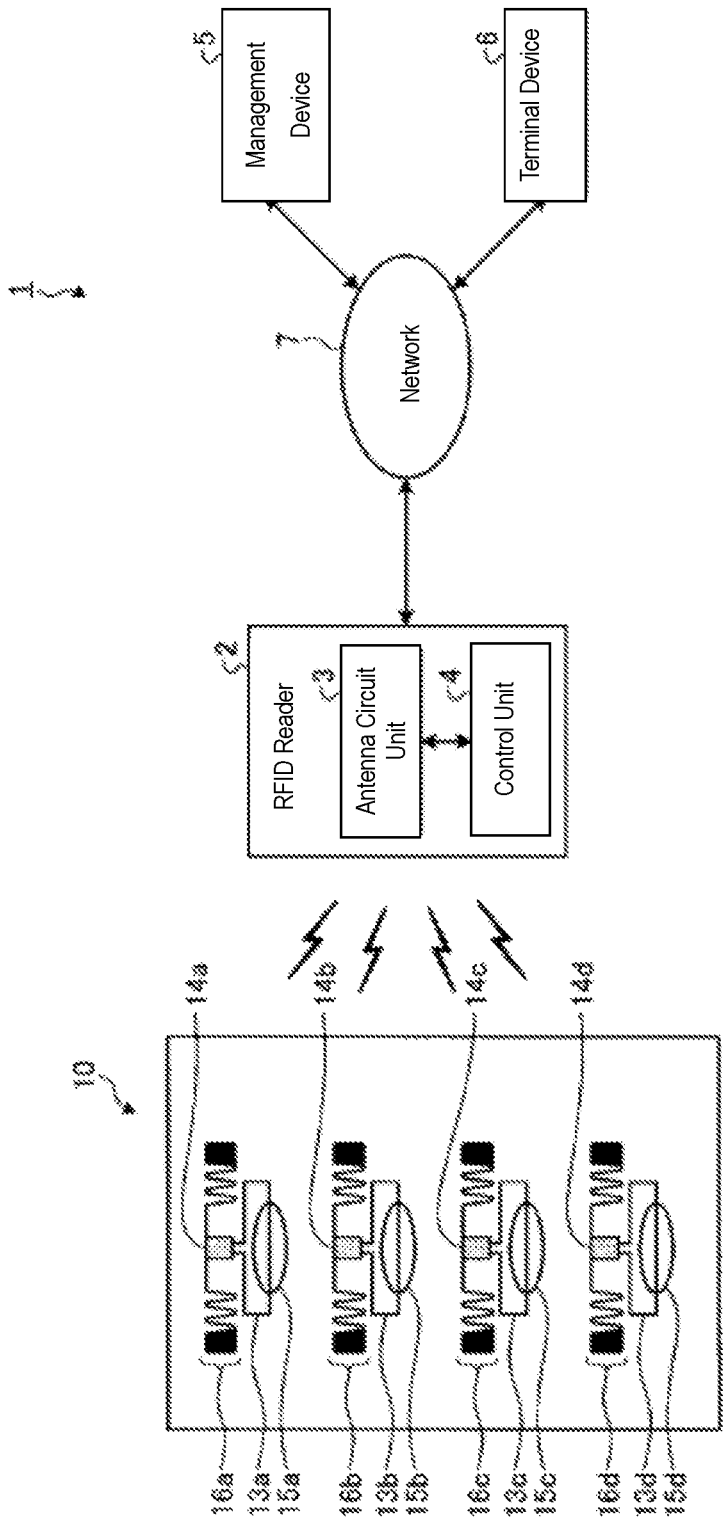
FIG. 26 is a diagram depicting a configuration example of a cavity item management system according to an embodiment of the present invention.

A cavity item management system produced using a package according to the present invention will be described. For example, FIG. 26 is a diagram depicting a configuration example of a cavity item management system according to an embodiment of the present invention, wherein the system is configured with the package 10 depicted in FIG. 1A. As depicted in FIG. 26, this cavity item management system 1 includes: the package 10; an RFID reader 2; a management device 5 communicably connected to the RFID reader 2 via a network 7; and a terminal device 6 communicably connected to the management device 5 via the network 7. In this cavity item management system 1, the RFID reader 2 receives information which is transmitted by wireless communication devices 16a to 16d included in the package 10 (that is, information that differs between before and after receiving cavities 15a to 15d for receiving a cavity item 17 in the package 10 are opened), and the reader reads and senses whether the receiving cavities 15a to 15d are opened, in accordance with a difference in the received information. The management device 5 receives, from the RFID reader 2 via the network 7, the information sensed by the RFID reader 2 and indicating whether the receiving cavities 15a to 15d are opened, and notifies the terminal device 6 of the received sensed information.

As depicted in FIG. 26, the package 10 is an example of a package according to the present invention, and includes, for example, receiving cavities 15a to 15d for receiving a cavity item 17 (see cavity items 17a to 17d depicted in FIGS. 1A to 1C), connecting lines 13a to 13d, and wireless communication devices 16a to 16d. The RFID reader 2 is an example of a reader that reads information from the wireless communication devices 16a to 16d of the package 10 and senses whether the receiving cavities 15a to 15d are opened. For example, the RFID reader 2 in the cavity item management system 1 includes an antenna circuit unit 3 and a control unit 4. The antenna circuit unit 3 is an example of an antenna unit for receiving information transmitted by the wireless communication devices 16a to 16d. In this regard, this reader is not limited to any reader with RFID technology employed therefor, and may be any reader with another communication technology employed therefor. The control unit 4 has both a function that controls wireless communication via the antenna circuit unit 3 and a function that serves as a sensing unit for sensing whether the receiving cavities 15a to 15d for receiving a cavity item 17 in the package 10 are opened.

Specifically, in cases where the wireless communication devices 16a to 16d are passive types of UHF band RFID wireless communication devices, the RFID reader 2 transmits electric waves in the UHF band via the antenna circuit unit 3, and electrifies the circuit units 14a to 14d of the wireless communication devices 16a to 16d in the package 10. In addition, the RFID reader 2 receives information from the circuit units 14a to 14d via the antenna circuit unit 3. In this case, a signal is transmitted from the circuit units 14a to 14d to the RFID reader 2, wherein the signal includes various kinds of information, for example: information which makes it possible to sense whether each of the receiving cavities 15a to 15d is opened; and information recorded in each memory circuit in the circuit units 14a to 14d. Then, the antenna circuit unit 3 in the RFID reader 2 receives information on each of the receiving cavities 15a to 15d from each of the wireless communication devices 16a to 16d, wherein the information differs between before and after each of the receiving cavities 15a to 15d is opened. In accordance with a difference in the information received by the antenna circuit unit 3 (a difference according to whether each of the receiving cavities 15a to 15d is opened), the control unit 4 senses whether each of the receiving cavities 15a to 15d is opened.

For example, in cases where the wireless communication devices 16a to 16d provided in the package 10 are the wireless communication devices according to the third embodiment of the present invention (see FIGS. 10 to 19B), the wireless communication devices 16a to 16d each have a memory unit as a memorizing method, and information read out of each memory unit varies between before and after each of the receiving cavities 15a to 15d is opened. In this regard, information is recorded in a memory element, a memory array, and a flip flop circuit in the memory unit, as above-mentioned. In this case, the difference in information received by the antenna circuit unit 3 from the wireless communication devices 16a to 16d is caused by such a variation in the information in the memory unit as above-mentioned. The control unit 4 senses, according to such a variation in the information in the memory unit, whether each of the receiving cavities 15a to 15d is opened.

In addition, in cases where the wireless communication devices 16a to 16d provided in the package 10 are wireless communication devices according to the fourth embodiment of the present invention (see FIGS. 24A to 24F), the wireless communication devices 16a to 16d each have a modulation circuit in each of the circuit units 14a to 14d, and the degree to which a signal is modulated by the modulation circuit (for example, the degree of modulation of amplitude) is varied between before and after each of the receiving cavities 15a to 15d is opened. In this case, the difference in the information received by the antenna circuit unit 3 from the wireless communication devices 16a to 16d is caused by the above-mentioned difference in the degree of modulation of a signal transmitted by the wireless communication devices 16a to 16d. The control unit 4 senses, according to such a difference in the degree of modulation, whether each of the receiving cavities 15a to 15d is opened.

On the other hand, the RFID reader 2 can receive information from the wireless communication devices 16a to 16d through the antenna circuit unit 3, wherein the information is unique information that separately identifies the wireless communication devices 16a to 16d configured to correspond to the receiving cavities 15a to 15d, and that is received together with information which makes it possible to sense whether each of the receiving cavities 15a to 15d is opened. In addition, the RFID reader 2 transmits information and a signal to the management device 5 via the network 7, wherein the information is information sensed by the control unit 4 and indicating whether the receiving cavities 15a to 15d are opened (the result of sensing whether the receiving cavities 15a to 15d are opened), and wherein the signal includes unique information and the like of each of the wireless communication devices 16a to 16d. The management device 5 receives the signal including the sensed information and the unique information, and obtains the pieces of information included in the received signal. Then, the management device 5 carries out management, on the basis of the obtained pieces of information, in such a manner that the sensed information on whether each of the receiving cavities 15a to 15d is opened corresponds to the unique information of each of the wireless communication devices 16a to 16d. In addition, the management device 5 notifies the terminal device 6 of the individual sensed information via the network 7, wherein the sensed individual information is on whether each of the receiving cavities 15a to 15d is opened. The management device 5 and the terminal device 6 are constituted by a portable type or fixed type of personal computer (PC) and the like, and are communicably connected to each other via the network 7. Examples of the network 7 include various kinds of communication lines such as the Internet, wireless LAN, and telephone lines.

In this regard, using the package 10A depicted in FIG. 4A can also produce the same cavity item management system 1 as above-mentioned.

As described above, a package according to the present invention can transmit, to an external device, information (a signal) that makes it possible to sense whether the receiving cavity 15 is opened, and thus, can be used for a cavity item management system (for example, a cavity item management system 1 depicted in FIG. 26) according to the present invention. In this cavity item management system, the above-mentioned management device 5 and the terminal device 6 may be combined in one device. The cavity item 17 is not limited to any particular kind, and specific examples thereof include pharmaceuticals, food items (flavorings, confectionery, supplements, and the like), cosmetics, electronic components, and jewelry items. In this regard, one package may encapsulate one kind of cavity item 17 or a plurality of kinds of cavity items 17. For example, different pharmaceuticals may be received in different receiving cavities 15 for a patient who takes a plurality of pharmaceuticals. In addition, the number and kind of cavity item(s) 17 received in each receiving cavity 15 are not limited, but a plurality of kinds of cavity items 17 may be received in one receiving cavity 15.

Among these, a pharmaceutical needs to be taken by a patient on schedule as directed by a doctor to maximize the pharmaceutical benefit of the pharmaceutical. However, in cases where a patient herself/himself does not intend to take a pharmaceutical or where a patient has dementia, it is difficult for the patient to take a pharmaceutical regularly. Because of this, it is much hoped that a cavity item management system according to the present invention is employed for a supervised administration system in cases where the cavity item 17 is a pharmaceutical. In view of this, a supervised administration system for pharmaceuticals will be described below as a specific example of a cavity item management system used with a package according to the present invention.

Examples of supervised administration systems for pharmaceuticals include such a system as below-mentioned. For example, the RFID reader 2 in a supervised administration system regularly transmits electric waves to the wireless communication device 16 in the package 10, and, in response to this, the wireless communication device 16 transmits, to the RFID reader 2, information indicating whether the receiving cavity 15 is opened. The RFID reader 2 reads and senses whether the receiving cavity 15 in the package 10 is opened, in accordance with a difference in the information received from the wireless communication device 16. Furthermore, the RFID reader 2 transmits, to the management device 5, the sensed information on whether the receiving cavity 15 is opened, and the management device 5 notifies the terminal device 6 of this sensed information. Examples of this management device 5 include data servers and the like. Examples of this terminal device 6 include PCs, mobile phones, smartphones, tablet types of PCs, and the like. In this regard, the management device 5 and the terminal device 6 may be combined in one device.

According to a supervised administration system in a specific example of the present invention, any opened one of the receiving cavities 15 in the package 10 is regarded as meaning that a pharmaceutical has been administered from the opened one, which had the pharmaceutical therein when not opened. Any unopened receiving cavity 15 is regarded as meaning that a pharmaceutical has not been administered from the receiving cavity. A method of transmitting information from the RFID reader 2 to the management device 5 is not limited to any particular one, but may be carried out using a wireless communication line or a wire communication line for which an electric or optical signal is used. If the management device 5 is installed in a medical institution such as a hospital or a pharmacy, medical personnel such as doctors, nurses, and pharmacists can use the terminal device 6 to monitor the administration situation of patients. In addition, the management device 5 may be installed in a patient' house, and in this case, the patient's family can use the terminal device 6 to monitor the administration situation of the patient, and can rapidly take action if the patient forgets to take a pharmaceutical.

As above-mentioned, information recorded in the memory circuit of the wireless communication device 16 together with information indicating whether the receiving cavity 15 is opened can be transmitted to the RFID reader 2. In cases where the package 10 is one for packaging a pharmaceutical, specific examples of information recorded in the memory circuit of the wireless communication device 16 include information on a pharmaceutical (the product name, the product number, the production date, the expiration date, the production batch, and the like), information on the receiving cavity 15 for receiving a pharmaceutical (the unique ID and the like of each receiving cavity 15), information on a patient (the patient ID, the clinical chart number, the name and treatment history of the patient's disease, and the like), information on medical staff (the hospital ID, the doctor ID, the nurse ID, the pharmacist ID, and the like), a patient's history of taking a pharmaceutical, an electronic certificate of a pharmaceutical, and the like. All these pieces of information do not need to be recorded in the memory circuit of the wireless communication device 16. If at least unique information such as ID numbers that identify the receiving cavities 15 is individually recorded, other pieces of information can be managed on a data server. In cases where the unique information of the receiving cavity 15 is recorded in the memory circuit of the wireless communication device 16, even a memory circuit having a small capacity can cope with such information. Thus, it is preferable that, in a supervised administration system employed with a package according to the present invention, information indicating whether the receiving cavity 15 is opened and unique information of the receiving cavity 15 are transmitted from the package 10 to an external device.

An example in which a supervised administration system in the present invention is used in a medical institution will be described. The package 10 and the RFID reader 2 are installed, for example, on a pharmaceutical cabinet by the side of a bed in a ward. A patient takes a pharmaceutical from the package 10 at a predetermined time, and then, returns the package 10 to a pharmaceutical cabinet. On the other hand, the management device 5 and the terminal device 6 are installed, for example, in a nurse station, and thus, information transmitted from the RFID reader 2 enables medical staff to check the amount of the pharmaceutical taken by the patient. In this regard, this management device 5 has information registered therein, the information including information on patients, information on prescribed pharmaceuticals, and information on doctors, nurses, and pharmacists in attendance. In addition, this management device 5 transmits a read-out direction to the RFID reader 2 in accordance with registered information on a time at which to take a pharmaceutical.

The management device 5 makes a comparison between the residual amount of the pharmaceutical (that is, the number of the unopened receiving cavities 15) transmitted from the RFID reader 2 and the amount of the pharmaceutical that should properly remain in the package 10. If there is a discrepancy between both the amounts, the management device 5 gives an alarm display or sound to send a notice of the fact to a terminal device 6 held by a medical staff member. This enables a nurse to give compliance instructions to a patient without being much later than a predetermined time at which the patient should take a pharmaceutical. While in a nurse station, a nurse can thus monitor information on whether a patient properly takes a pharmaceutical, and accordingly, the nurse's workload can be alleviated. In addition, an RFID reader 2 having an alarm function can notify a patient if she/he has wrongly taken a pharmaceutical, and it is hoped to maximize a therapeutic effect.

Furthermore, the above-mentioned supervised administration system can be used in a clinical trial for a new pharmaceutical which requires strict supervised administration, and thus, the system can prevent a patient from forgetting to take a pharmaceutical. This results in enabling the pharmaceutical benefit of a new pharmaceutical to be evaluated correctly.

Next, an example in which a supervised administration system in the present invention is used in a home will be described. This supervised administration system does not limit the installation place of the package 10 and the RFID reader 2 to anywhere. The package 10 and the RFID reader 2 may be installed at different places as long as information from the package 10 can be read by the RFID reader 2. However, in cases where UHF band RFID communication is used to read information from the package 10, the package 10 and the RFID reader 2 are preferably installed (for example, within 5 m from each other) in the same room such as a bedroom or a dining room. In cases where HF band RFID communication is used to read information from the package 10, the RFID 2 reader and the package 10 are preferably installed in proximity (for example, within 50 cm from each other).

In addition, examples of the management device 5 include home PCs, smartphones, tablet types of PCs, and data servers installed in medical institutions. The management device 5 transmits a read-out direction to the RFID reader 2 in accordance with registered information on a time at which to take a pharmaceutical. In response to this, the RFID reader 2 reads, from the wireless communication device 16, information indicating whether the receiving cavity 15 in the package 10 is opened, and transmits the read information (the sensed information on whether the receiving cavity 15 is opened) to the management device 5. The management device 5 makes a comparison between the information transmitted from the RFID reader 2 (the information indicating the residual amount of the pharmaceutical) and the amount of the pharmaceutical that should properly remain in the package 10. If there is a discrepancy between both these amounts, the management device 5 gives an alarm display or sound to send a notice of the fact to a terminal device 6 held by a family member or a medical staff member. In this manner, a patient can be prompted to take a pharmaceutical. Without visually checking the residual amount of the pharmaceutical in the package 10, a family member or a medical staff member can thus monitor information on whether a patient is properly taking a pharmaceutical. This results in enabling the load on a family member or a medical staff member to be alleviated as well as allowing the therapeutic effect to be maximized, in cases where a patient and her/his family live in different houses, in cases where a patient is reluctant to show the administration situation of a pharmaceutical to her/his family, and in cases where a patient is treated at home.

Next, an example in which a supervised administration system in the present invention is used outside will be described. This supervised administration system makes it possible that the RFID reader 2 is a portable reader such as a smartphone so that the RFID reader 2 can be taken outside along with the package 10. For example, the management device 5 transmits a read-out direction to the RFID reader 2 in accordance with registered information on a time at which to take a pharmaceutical, wherein the management device is, for example, a home PC, a smartphone, a tablet type of PC, or a data server installed in a medical institution. In response to this, the RFID reader 2 reads, from the wireless communication device 16, information indicating whether the receiving cavity 15 in the package 10 is opened, and transmits the read information to the management device 5. The management device 5 makes a comparison between the information transmitted from the RFID reader 2 (the information indicating the residual amount of the pharmaceutical) and the amount of the pharmaceutical that should properly remain in the package 10. If there is a discrepancy between both these amounts, the management device 5 gives an alarm display or sound to send a notice of the fact to a patient herself/himself, her/his family member, or a medical staff member. In this manner, a patient can be prompted to take a pharmaceutical.

(Sense-of-Disconnection Device)

Figure 27:
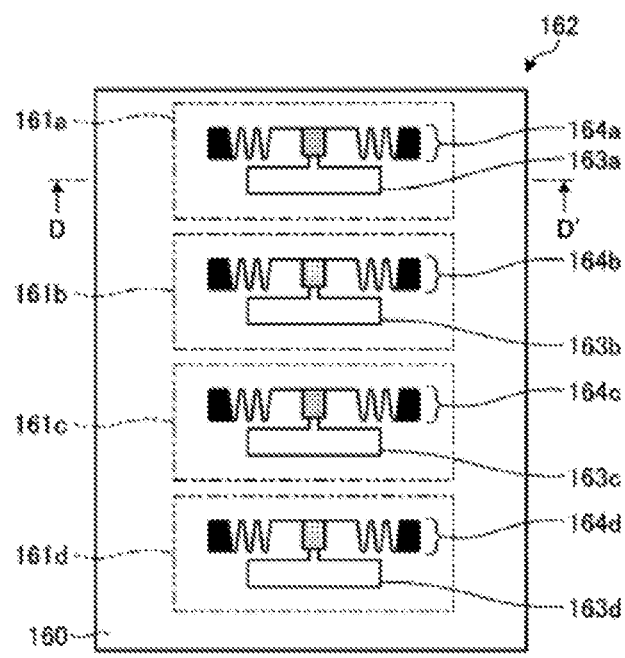
FIG. 27 is a top view depicting a configuration example of a sense-of-disconnection device sheet including a sense-of-disconnection device according to an embodiment of the present invention.

Next, a sense-of-disconnection device according to an embodiment of the present invention will be described. FIG. 27 is a top view depicting a configuration example of a sense-of-disconnection device sheet including a sense-of-disconnection device according to an embodiment of the present invention. As depicted in FIG. 27, this sense-of-disconnection device sheet 162 is a sheet-like device having a plurality of sense-of-disconnection devices (for example, four sense-of-disconnection devices 161*a* to 161*d*) on one substrate 160.

In this embodiment, the sense-of-disconnection device sheet 162 can be produced by forming conducting wires 163*a* to 163*d* and wireless communication devices 164*a* to 164*d* on the substrate 160. These conducting wires 163*a* to 163*d* and wireless communication devices 164*a* to 164*d* can be formed on the substrate 160 by the same process as the above-mentioned functional portion form step (see FIG. 9A and the like). In this case, the conducting wires 163*a* to 163*d* are formed on the substrate 160 so as to have the same wiring pattern as the above-mentioned connecting line 13. The wireless communication devices 164*a* to 164*d* are formed on the substrate 160 so as to be connected to the conducting wires 163*a* to 163*d* respectively.

As above-mentioned, the conducting wires 163a to 163d and the wireless communication devices 164a to 164d formed on the substrate 160 constitute the sense-of-disconnection devices 161a to 161d, which are each an example of a sense-of-disconnection device according to the present invention. That is, as depicted in FIG. 27, the sense-of-disconnection device 161a includes: the conducting wire 163a formed on the substrate 160; and the wireless communication device 164a formed on the substrate 160 so as to be connected to the conducting wire 163a. The wireless communication device 164a has the same function as the above-mentioned wireless communication device 16, and can transmit a signal including information which differs between before and after the conducting wire 163a is cut. In addition, the sense-of-disconnection device 161b includes the conducting wire 163b and the wireless communication device 164b. The sense-of-disconnection device 161c includes the conducting wire 163c and the wireless communication device 164c. The sense-of-disconnection device 161d includes the conducting wire 163d and the wireless communication device 164d. These sense-of-disconnection devices 161b to 161d are configured in the same manner as the above-mentioned sense-of-disconnection device 161a. The wireless communication devices 164b to 164d are the same as the wireless communication device 164a except that previously recorded information is different among the wireless communication devices 164b to 164d.

In addition, the conducting wires 163a to 163d can each be cut using a technique, for example, by cutting the substrate 160. For example, in cases where the substrate 160 is cut along the dashed line D-D' depicted in FIG. 27, the conducting wire 163a is cut together with the substrate 160. Such wire disconnection applies to the other conducting wires 163b to 163d in the same manner. The sense-of-disconnection device 161a is useful for sense of disconnection, i.e., sensing whether the conducting wire 163a is disconnected, because a signal can be transmitted from the wireless communication device 164a, wherein the signal includes information that differs before and after the conducting wire 163a is disconnected. The sense-of-disconnection devices 161b to 161d are as useful for sense of disconnection in the same manner as the sense-of-disconnection device 161a.

Such sense-of-disconnection devices 161a to 161d can be used, for example, as constituent parts of a sense of opening label for sensing whether an openable article is opened. Specifically, the sense-of-disconnection devices 161a to 161d are cut, before usage, from the sense-of-disconnection device sheet 162 so as to have the aspects including the conducting wires 163a to 163d and the wireless communication devices 164a to 164d respectively (the aspects surrounded by two-dot chain lines in FIG. 27). In particular, in cases where the sense-of-disconnection devices 161a to 161d are used for a seal label type of sense-of-opening label, for example, in cases label processing such as forming a sticking layer on the back side of the substrate 160 (the side on which the sense-of-disconnection devices 161a to 161d are not formed) or the front side of the substrate 160 (the side on which the sense-of-disconnection devices 161a to 161d are formed) is carried, the sense-of-disconnection device sheet 162 is then separated into smaller pieces that each correspond to each of the sense-of-disconnection devices 161a to 161d. In addition, in cases where the sense-of-disconnection devices 161a to 161d are used for a film label type of sense-of-opening label, for example, in cases where laminate processing is carried out to sandwich the sense-of-disconnection device sheet 162 between at least two films or covering members such as sheets of paper, the sense-of-disconnection device sheet 162 is then separated into smaller pieces that each correspond to each of the sense-of-disconnection devices 161a to 161d. The film label type of sense-of-opening label thus obtained is processed into an openable article in an aspect in which a sense-of-disconnection device is incorporated in the openable portion, if necessary.

Hereinafter, the sense-of-disconnection devices 161a to 161d are suitably referred to collectively as "the sense-of-disconnection device 161". The sense-of-disconnection device 161 means all or any one of the sense-of-disconnection devices 161a to 161d. In the same manner, the conducting wires 163a to 163d are suitably referred to collectively as "the conducting wire 163". The conducting wire 163 means all or any of the conducting wires 163a to 163d. The wireless communication devices 164a to 164d are suitably referred to collectively as "the wireless communication device 164". The wireless communication device 164 means all or any of the wireless communication devices 164a to 164d.

In this regard, FIG. 27 depicts an example of a sense-of-disconnection device sheet, wherein four sense-of-disconnection devices are formed on one substrate, and wherein the conducting wires (conducting wires for sense-of-disconnection) connected to the wireless communication devices are each provided for each of the sense-of-disconnection devices, but the present invention is not limited to this. The number of sense-of-disconnection devices on the substrate and the number of conducting wires in each of the sense-of-disconnection devices are each not limited to any particular number, but may be an arbitrary number.

A wireless communication device (for example, the wireless communication device 164) of a sense-of-disconnection device according to the present invention is not limited to any particular device as long as the device transmits a signal including information that differs between before and after the conducting wire (for example, the conducting wire 163) connected to the wireless communication device is cut. As with a package according to the present invention, it is preferable, for example, that the wireless communication device has a memorizing method, that the memorizing method has at least one memory element, wherein the conducting wire is connected to the memory element, and wherein the information is read out of the memory element in such a manner that the information differs between before and after the conducting wire is cut. In addition, it is preferable that the wireless communication device has a memorizing method, wherein the memorizing method has at least one flip flop circuit, wherein the conducting wire is connected to the flip flop circuit, and wherein the information is read out of the flip flop circuit in such a manner that the information differs between before and after the conducting wire is cut. In addition, it is preferable that the wireless communication device has a modulation circuit, that the conducting wire is connected to the modulation circuit, and that a signal including information is modulated by the modulation circuit in such a manner that the signal differs between before and after the conducting wire is cut.

As with a package according to the present invention, it is preferable that the memorizing method has a memory array formed by arranging a plurality of memory elements in array, wherein the conducting wire is connected to at least one of the plurality of memory elements, and wherein the information is read out of the memory array in such a manner that the information differs between before and after the conducting wire is cut. Furthermore, it is preferable that the memory array includes: a plurality of first wires; at least one second wire intersecting the plurality of first wires; and the plurality of memory elements which are each provided so as to correspond to each of the intersections between the plurality of first wires and the at least one second wire and which each have: a first electrode and a second electrode which are spaced from each other; a third electrode connected to one of the at least one second wire; and an insulating layer electrically insulating the first electrode and the second electrode from the third electrode; wherein one of the first electrode and the second electrode is connected to one of the plurality of first wires; wherein at least one of the plurality of memory elements has a semiconductor layer in a region between the first electrode and the second electrode; wherein the plurality of memory elements are composed of memory elements of two different kinds having different inter-electrode electrical characteristics of the first electrode and the second electrode; and wherein information recorded in the memory array is determined by an arrangement obtained by arbitrary combination of the memory elements of two kinds. In particular, it is preferable that, of the memory elements of two kinds, the memory element(s) of one kind has/have the semiconductor layer, and the memory element(s) of the other kind does/do not have the semiconductor layer; and wherein the memory element(s) of one kind and the memory element(s) of the other kind each record information which differs between each other according to whether the memory elements of two kinds each have the semiconductor layer.

In this regard, the material of the substrate 160 to be used for the sense-of-disconnection device sheet 162, the material of the conducting wire 163, the shape of the conducting wire 163, and the configuration of the wireless communication device 164 can be the same as in a package according to the present invention. Furthermore, in the wireless communication device 164, the kind and material of the antenna, the structure of the TFT element included in the circuit unit, the material of each of the layers (the insulating layer, the semiconductor layer, the gate electrode, the source and drain electrodes) of the TFT element, the circuit configuration of the memory unit, and the circuit configuration of the modulation circuit can be the same as in a package according to the present invention.

A method of producing the sense-of-disconnection device sheet 162 is not limited to any particular one, but may be the same as the above-mentioned functional portion formation process (see FIG. 9A), and a method of forming the wireless communication device 164 and the conducting wire 163 can also be the same as the method for the above-mentioned package. Because of this, the sense-of-disconnection device sheet according to the present invention illustrated with the sense-of-disconnection device sheet 162 can be produced in convenient processes at low cost. Thus, a sense-of-opening label including a sense-of-disconnection device (for example, the sense-of-disconnection device 161) obtained from such a sense-of-disconnection device sheet can be obtained at low cost.

The configuration of a sense-of-opening label one constituent part of which is the sense-of-disconnection device 161 is not limited to any particular one, and examples of configurations include: a seal label type in which a sticking layer is formed on at least one face of the sense-of-disconnection device sheet 162; and a film label type in which both faces of the sense-of-disconnection device sheet 162 are laminated with a covering member such as a sheet of paper or a film. A seal label type of sense-of-opening label is adhered to an openable article, and used. The sense-of-disconnection device included in the seal label type of sense-of-opening label is configured to be attached to an openable article. The film label type of sense-of-opening label is attached using a technique in which the openable portion of an openable article is covered with the sense-of-opening label, or is integrally formed with the openable portion of an openable article. The sense-of-opening label is then used. Thus, the sense-of-disconnection device included in the film label type of sense-of-opening label is configured to be attached to an openable article.

A method of producing a sense-of-opening label is not limited to any particular one, and examples of such methods include a method of producing a seal label type of sense-of-opening label, in which a tackifier is applied to that side of both front and back sides of the sense-of-disconnection device sheet 162 which does not have the sense-of-disconnection device 161 formed thereon (that is, the back side), an exfoliate paper is laminated on this back side, and a surface sheet on which letters and the like can be printed is laminated, using an adhesive, on the side which has the sense-of-disconnection device 161 formed thereon (that is, the front side), followed by removing the waste matrix, to separate the sheet into smaller units each including at least one sense-of-disconnection device. In this regard, the side to which a tackifier is applied is not limited to the above-mentioned back side, but may be the front side of the sense-of-disconnection device sheet 162. In addition, examples of methods of producing a film label type of sense-of-opening label include a method in which an adhesive is applied to both front and back sides of the sense-of-disconnection device sheet 162, a covering member such as a film or a sheet of paper is laminated on these both sides, and then, the sheet is separated into smaller units each including at least one sense-of-disconnection device.

Figure 28A:
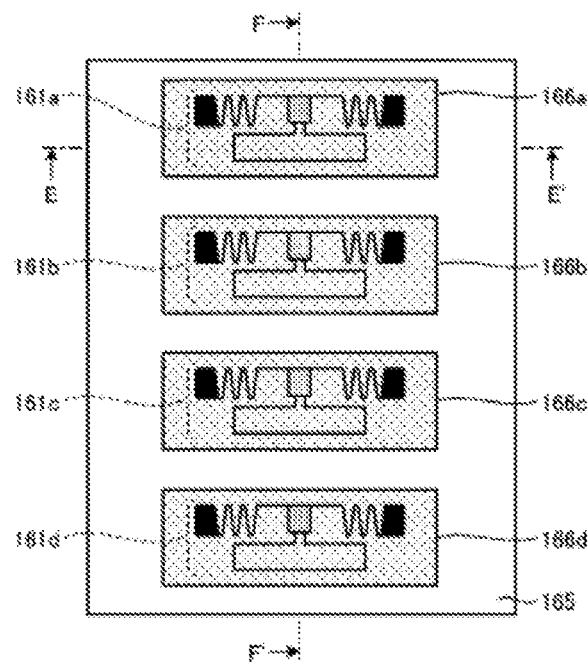
FIG. 28A is a top view depicting a configuration example of a sense-of-opening label according to an embodiment of the present invention.
Figure 28B:
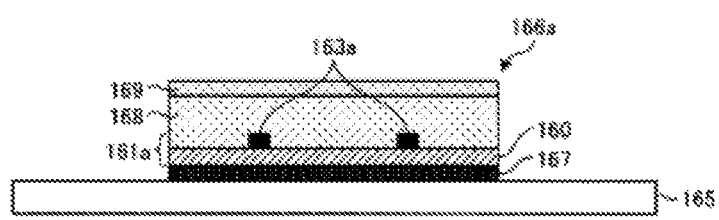
FIG. 28B is a cross-sectional view taken along line E-E' in the view of the sense-of-opening label set depicted in FIG. 28A.
Figure 28C:
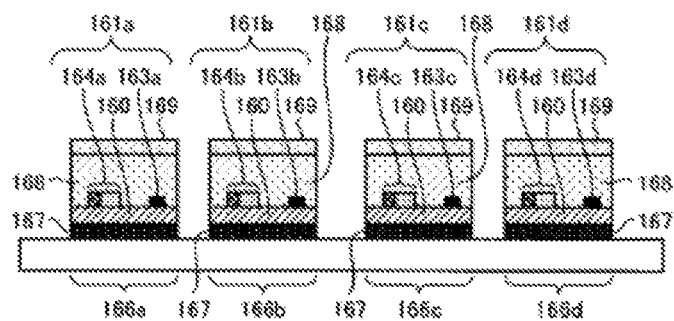
FIG. 28C is a cross-sectional view taken along line F-F' in the view of the sense-of-opening label set depicted in FIG. 28A.

Next, an example of the structure of a sense-of-opening label (a seal label) according to an embodiment of the present invention will be described with reference to FIGS. 28A to 28C. FIG. 28A is a top view depicting a configuration example of a sense-of-opening label according to an embodiment of the present invention. FIG. 28A depicts a sheet structure, that is, a sense-of-opening label set, in which one or more smaller unit sense-of-opening labels of a seal label type (for example, four sense-of-opening labels 166a to 166d) are formed on one exfoliate paper 165. FIG. 28B is a cross-sectional view taken along line E-E' in the view of the sense-of-opening label set depicted in FIG. 28A. FIG. 28C is a cross-sectional view taken along line F-F' in the view of the sense-of-opening label set depicted in FIG. 28A.

As depicted in FIGS. 28A to 28C, the sense-of-opening label 166a includes a sense-of-disconnection device 161a, a sticking layer 167, an adhesion layer 168, and a surface sheet 169. The sense-of-disconnection device 161a includes a substrate 160 and a conducting wire 163a and a wireless communication device 164a which are formed on the surface of this substrate 160. The sticking layer 167 is formed on the back side of the substrate 160 of the sense-of-disconnection device 161a. That is, the sticking layer 167 is between the back side of the substrate 160 and the surface of the exfoliate paper 165 so that sense-of-opening label 166a can be detachably adhered to the exfoliate paper 165. This sticking layer 167 allows the substrate 160 to be configured to be attached to an openable article for which the sense-of-opening label 166a is intended. In addition, the conducting wire 163a is configured to be cut at the same time when the substrate 160 is cut as a result of opening the openable article to which the sense-of-opening label 166a is attached. The adhesion layer 168 is formed on the surface of the substrate 160 in such a manner that the conducting wire 163a and wireless communication device 164a of the sense-of-disconnection device 161a can be buried in the adhesion layer 168. The surface sheet 169 is formed on the adhesion layer 168. The surface sheet 169 is used, for example, to print a product name thereon.

In addition, the sense-of-opening label 166b has the same configuration as the above-mentioned sense-of-opening label 166a except that the sense-of-opening label 166b includes the sense-of-disconnection device 161b in place of the sense-of-disconnection device 161a. The sense-of-opening label 166c has the same configuration as the above-mentioned sense-of-opening label 166a except that the sense-of-opening label 166c includes the sense-of-disconnection device 161c in place of the sense-of-disconnection device 161a. The sense-of-opening label 166d has the same configuration as the above-mentioned sense-of-opening label 166a except that the sense-of-opening label 166d includes the sense-of-disconnection device 161d in place of the sense-of-disconnection device 161a.

As depicted in FIGS. 28A and 28C, the sense-of-opening labels 166a to 166d are smaller pieces so as to be mutually separate objects. Because of this, the sense-of-opening labels 166a to 166d can each be peeled from the exfoliate paper 165 and used.

Figure 29A:
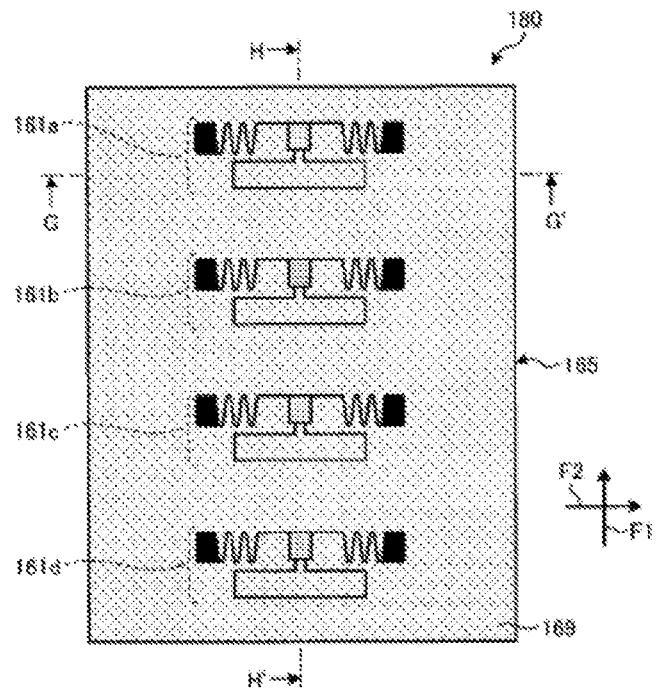
FIG. 29A is a top view depicting a configuration example of a sense-of-opening label sheet according to an embodiment of the present invention, wherein the label sheet remains to be separated into smaller sense-of-opening labels of a seal label type.
Figure 29B:
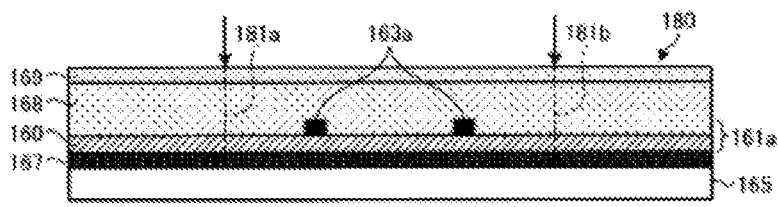
FIG. 29B is a cross-sectional view taken along line G-G' in the view of the sense-of-opening label sheet depicted in FIG. 29A.
Figure 29C:
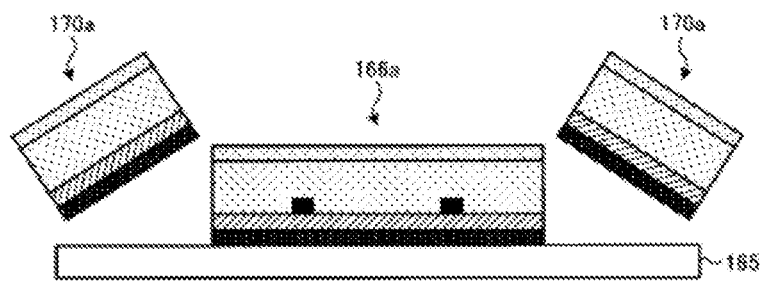
FIG. 29C is a schematic view describing a step of separating a sense-of-opening label sheet into smaller pieces, as viewed in a first direction.
Figure 29D:
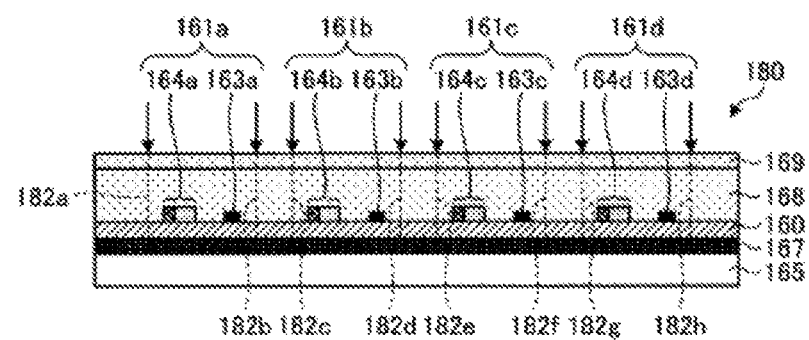
FIG. 29D is a cross-sectional view taken along line H-H' in the view of the sense-of-opening label sheet depicted in FIG. 29A.
Figure 29E:
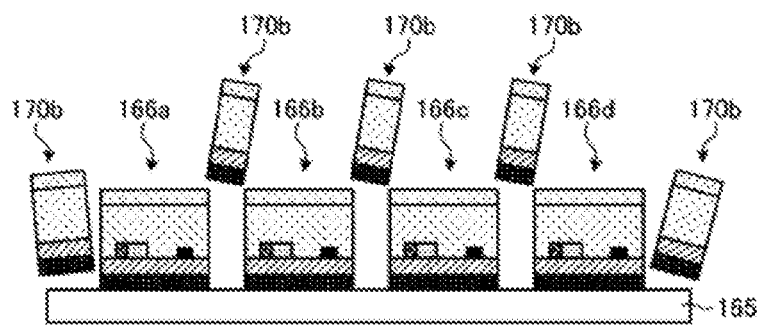
FIG. 29E is a schematic view describing a step of separating a sense-of-opening label sheet into smaller pieces, as viewed in a second direction.

Next, a method of forming a sense-of-opening label as a smaller piece will be described with reference to FIGS. 29A to 29E. FIG. 29A is a top view depicting a configuration example of a sense-of-opening label sheet according to an embodiment of the present invention, wherein the label sheet remains to be separated into smaller sense-of-opening labels of a seal label type. FIG. 29B is a cross-sectional view taken along line G-G' in the view of the sense-of-opening label sheet depicted in FIG. 29A. FIG. 29C is a schematic view describing a step of separating a sense-of-opening label sheet into smaller pieces, as viewed in a first direction. FIG. 29D is a cross-sectional view taken along line H-H' in the view of the sense-of-opening label sheet depicted in FIG. 29A. FIG. 29E is a schematic view describing a step of separating a sense-of-opening label sheet into smaller pieces, as viewed in a second direction.

As depicted in FIGS. 29A, 29B, and 29D, the sense-of-opening label sheet 180 is configured with sense-of-disconnection devices 161a to 161d which remain to be separated into smaller pieces (that is, the sense-of-disconnection device sheet 162 depicted in FIG. 27), a sticking layer 167, an adhesion layer 168, and a surface sheet 169. In the sense-of-opening label sheet 180, the sense-of-disconnection devices 161a to 161d are arranged to form a column in the first direction F1 and a row in the second direction F2. The sticking layer 167 is formed on the back side of the substrate 160 on the front side of which these sense-of-disconnection devices 161a to 161d are provided. This substrate 160 is adhered to the exfoliate paper 165 via the sticking layer 167. In addition, the surface sheet 169 is adhered at the top of the sense-of-opening label sheet 180 via the adhesion layer 168.

In the process of separating the sense-of-opening label sheet 180 into smaller pieces, those sheet portions 181a and 181b of the sense-of-opening label sheet 180 which are shown by the arrows are cut using a cutter along the first direction F1 as depicted in FIG. 29B. Specifically, the sheet portions 181a and 181b of the sense-of-opening label sheet 180 are the portions that sandwich the sense-of-disconnection devices 161a to 161d (represented by the sense-of-disconnection device 161a in FIG. 29B) along the first direction F1. These sheet portions 181a and 181b are cut, using a cutter, over the range from the surface sheet 169 to the sticking layer 167. As depicted in FIG. 29C, waste matrices 170a in the first direction F1 are then removed from the exfoliate paper 165.

In the process of separating the sense-of-opening label sheet 180 into smaller pieces, those sheet portions 182a to 182h of the sense-of-opening label sheet 180 which are shown by the arrows are cut using a cutter along the second direction F2 as depicted in FIG. 29D. Specifically, the sheet portions 182a to 182h of the sense-of-opening label sheet 180 are the portions that sandwich the sense-of-disconnection devices 161a to 161d along the second direction F2. These sheet portions 182a to 182h are cut, using a cutter, over the range from the surface sheet 169 to the sticking layer 167. As depicted in FIG. 29E, waste matrices 170b in the second direction F2 are then removed from the exfoliate paper 165.

As above-mentioned, in the process of separating the sense-of-opening label sheet 180 into smaller pieces, removing the waste matrices 170a and 170b in the first direction F1 and the second direction F2 enables the sense-of-opening label sheet 180 to be separated into smaller pieces as the sense-of-opening labels 166a to 166d of a seal label type. As depicted in FIGS. 28A to 28C, the smaller pieces as the sense-of-opening labels 166a to 166d result in being mutually separate objects and being each adhered to the exfoliate paper 165 via the sticking layer 167.

Figure 29F:
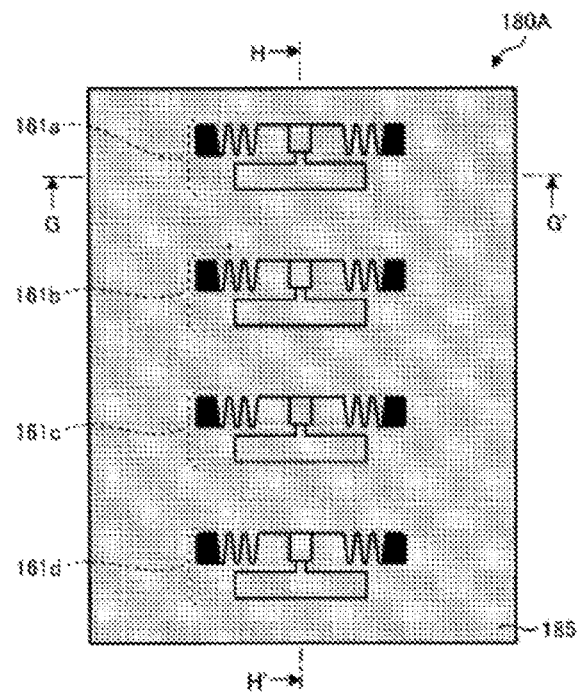
FIG. 29F is a top view depicting a configuration example of a sense-of-opening label sheet according to an embodiment of the present invention, wherein the label sheet remains to be separated into smaller sense-of-opening labels of a film label type.
Figure 29G:
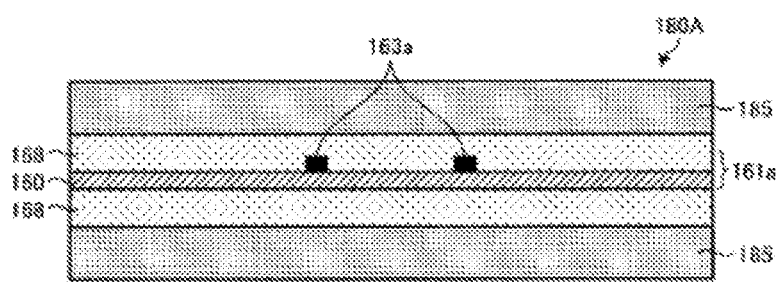
FIG. 29G is a cross-sectional view taken along line G-G' in the view of the sense-of-opening label sheet depicted in FIG. 29F.
Figure 29H:
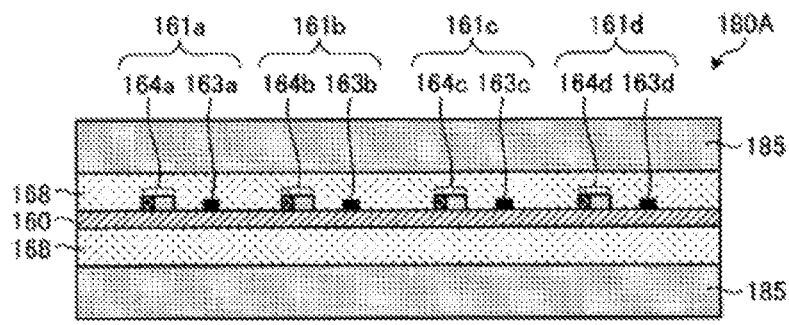
FIG. 29H is a cross-sectional view taken along line H-H' in the view of the sense-of-opening label sheet depicted in FIG. 29F.

The above-mentioned seal label type of sense-of-opening label is an example of a sense-of-opening label according to the present invention. That is, examples of sense-of-opening labels according to the present invention include a film label type of sense-of-opening label other than the seal label type. FIG. 29F is a top view depicting a configuration example of a sense-of-opening label sheet according to an embodiment of the present invention, wherein the label sheet remains to be separated into smaller sense-of-opening labels of a film label type. FIG. 29G is a cross-sectional view taken along line G-G' in the view of the sense-of-opening label sheet depicted in FIG. 29F. FIG. 29H is a cross-sectional view taken along line H-H' in the view of the sense-of-opening label sheet depicted in FIG. 29F.

As depicted in FIG. 29F to 29H, the sense-of-opening label sheet 180A is configured with sense-of-disconnection devices 161a to 161d which remain to be separated into smaller pieces (that is, the sense-of-disconnection device sheet 162 depicted in FIG. 27), adhesion layers 168 on both the front and back sides of a substrate 160, and covering members 185 on both the front and back sides of the substrate 160. As above-mentioned, the substrate 160 results in having the sense-of-disconnection devices 161a to 161d formed thereon.

In the sense-of-opening label sheet 180A, the sense-of-disconnection devices 161a to 161d are formed in the same manner as in the sense-of-opening label sheet 180 depicted in FIG. 29A. The adhesion layers 168 are formed on both the front and back sides of the substrate 160 by coating and the like. The covering members 185 are adhered to both the front and back sides of the substrate 160 via the adhesion layers 168. This allows the sense-of-disconnection devices 161a to 161d (that is, the sense-of-disconnection device sheet 162) on the substrate 160 to be sandwiched and laminated between the covering members 185 at both these sides. This results in producing the sense-of-opening label sheet 180A including at least one sense-of-opening label of a film label type.

A film label type of sense-of-opening label according to an embodiment of the present invention can be obtained, for example, in the above-mentioned process of separating the sense-of-opening label sheet 180A into smaller pieces. In the process of separating the sense-of-opening label sheet 180A into smaller pieces, the sense-of-opening label sheet 180A is cut into units each including a sense-of-disconnection device. This enables the sense-of-opening label sheet 180A to be separated into smaller pieces as sense-of-opening labels of a film label type. From this sense-of-opening label sheet 180A, for example, four sense-of-opening labels each including each of the sense-of-disconnection devices 161a to 161d can be obtained as sense-of-opening labels of a film label type.

Such a film label type of sense-of-opening label is attached to an openable article so as to cover at least a part of the openable portion of the openable article. That is, such a film label type of sense-of-opening label is attached to an openable article so that the openable portion cannot be opened without disconnecting the sense-of-disconnection device in the sense-of-opening label. Alternatively, a film label type of sense-of-opening label is integrally formed with the openable portion of an openable article. In this case, the covering member that laminates the sense-of-disconnection device in the film label type of sense-of-opening label is a member constituting part of the openable article. A film label type of sense-of-opening label is produced by separating a sense-of-opening label sheet into smaller pieces as above-mentioned, and then, processed into an openable article itself in an aspect in which a sense-of-disconnection device is incorporated in the openable portion.

As described above, a sense-of-opening label produced using a sense-of-disconnection device according to the present invention can transmit, to an external device, information that differs between before and after a conducting wire is disconnected, that is, information (a signal) that can sense whether a conducting wire is disconnected. For example, a sense of opening for an openable article such as a bag or a box can be obtained using a seal label type of sense-of-opening label adhered onto an opening cut-off line or an opening and closing portion of the openable article in such a manner that the conducting wire 163 together with the seal label type of sense-of-opening label is cut as a result of opening the openable article. Alternatively, a sense of opening for an openable article can be obtained by a film label type of sense-of-opening label adhered onto the openable portion of the openable article or integrally formed with the openable portion in such a manner that the conducting wire 163 together with the film label type of sense-of-opening label is cut as a result of opening the openable article.

Figure 30:
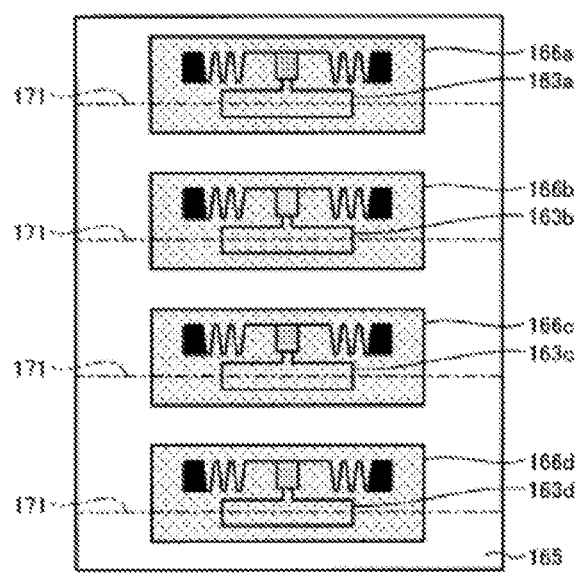
FIG. 30 is a top view depicting a configuration example of a sense-of-opening label according to a variation of an embodiment of the present invention.

In this regard, whether the above-mentioned sense-of-opening label is a seal label type or a film label type, the sense-of-opening label preferably has an incision previously processed therein so that the sense-of-opening label together with the conducting wire can be easily cut as a result of opening an openable article such as a bag or a box. FIG. 30 is a top view depicting a configuration example of a sense-of-opening label according to a variation of an embodiment of the present invention. As depicted in FIG. 30, sense-of-opening labels 166a to 166d on an exfoliate paper 165 each preferably have a cut-off line 171 formed so as to pass over each of the conducting wires 163a to 163d. For example, the cut-off line 171 can be formed by making a perforation, a V-shaped incision, or the like in the substrate 160 of the sense-of-opening labels 166a to 166d and along a pathway passing each of the conducting wires 163a to 163d. In this regard, FIG. 30 illustrates a seal label type of sense-of-opening label having a cut-off line formed therein, but without limitation to this, a film label type of sense-of-opening label may have a cut-off line formed therein.

Hereinafter, the sense-of-opening labels 166a to 166d are suitably referred to collectively as "the sense-of-opening label 166". The sense-of-opening label 166 means all or any of the sense-of-opening labels 166a to 166d. In addition, the sense-of-opening label 166 may be either sense-of-opening label, a seal label type or a film label type.

(Applications for Sense-of-Opening Label)

Figure 31A:
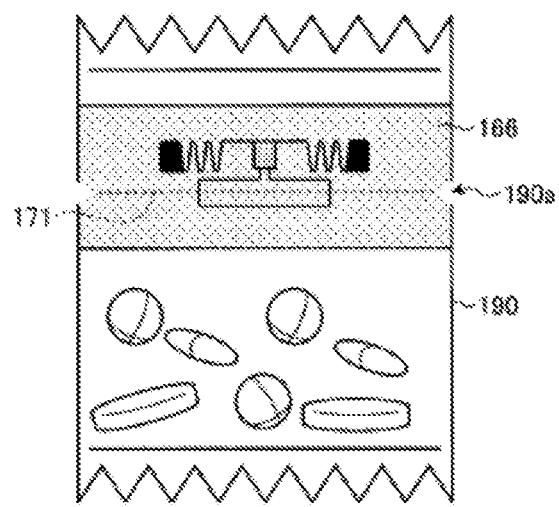
FIG. 31A is a schematic view depicting a first usage example of a sense-of-opening label according to an embodiment of the present invention.
Figure 31B:
FIG. 31B is a schematic view depicting a second usage example of a sense-of-opening label according to an embodiment of the present invention.
Figure 31C:
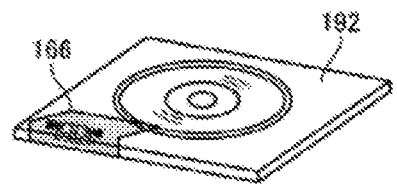
FIG. 31C is a schematic view depicting a third usage example of a sense-of-opening label according to an embodiment of the present invention.
Figure 31D:
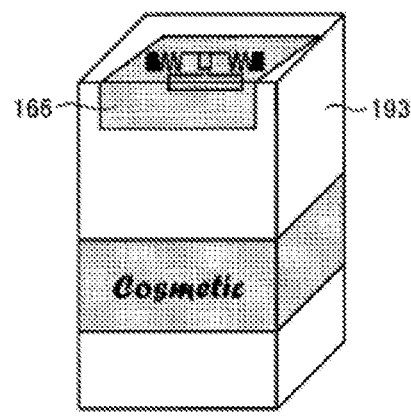
FIG. 31D is a schematic view depicting a fourth usage example of a sense-of-opening label according to an embodiment of the present invention.
Figure 31E:
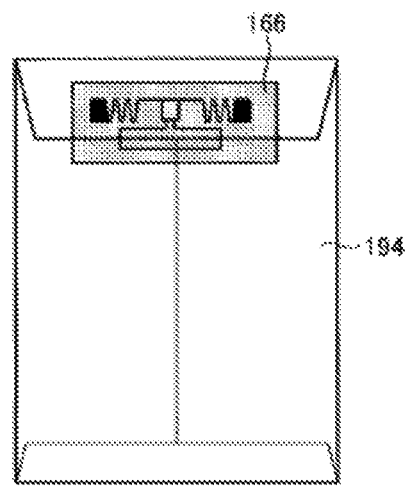
FIG. 31E is a schematic view depicting a fifth usage example of a sense-of-opening label according to an embodiment of the present invention.
Figure 31F:
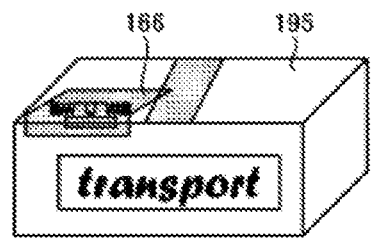
FIG. 31F is a schematic view depicting a sixth usage example of a sense-of-opening label according to an embodiment of the present invention.
Figure 31G:
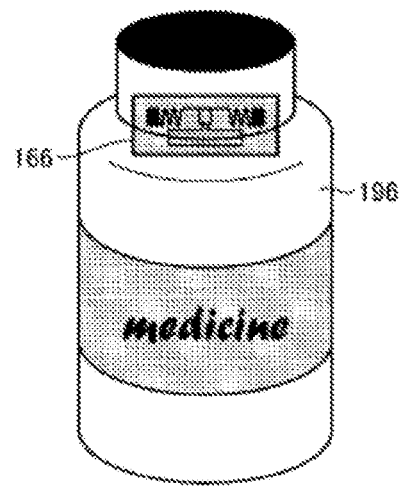
FIG. 31G is a schematic view depicting a seventh usage example of a sense-of-opening label according to an embodiment of the present invention.
Figure 31H:
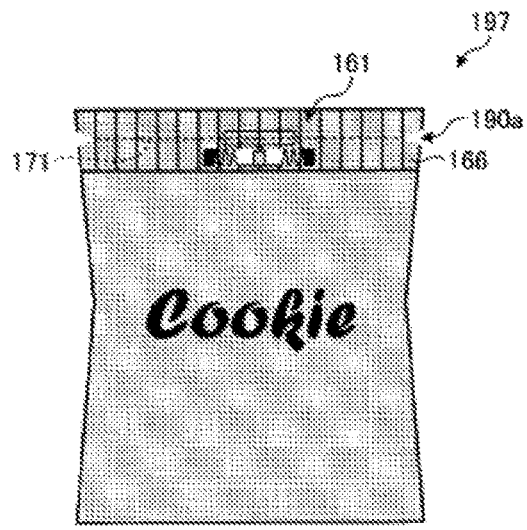
FIG. 31H is a schematic view depicting an eighth usage example of a sense-of-opening label according to an embodiment of the present invention.
Figure 31I:
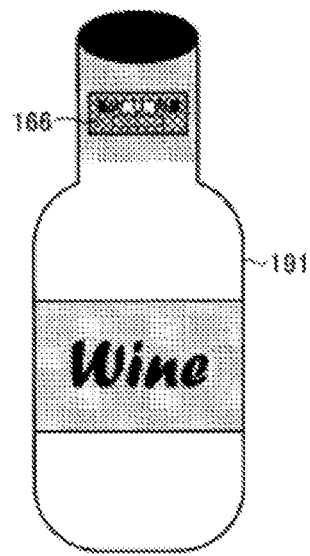
FIG. 31I is a schematic view depicting a ninth usage example of a sense-of-opening label according to an embodiment of the present invention.

Next, applications in which a sense-of-opening label according to an embodiment of the present invention can be used will be described. FIG. 31A is a schematic view depicting a first usage example of a sense-of-opening label according to an embodiment of the present invention. FIG. 31B is a schematic view depicting a second usage example of a sense-of-opening label according to an embodiment of the present invention. FIG. 31C is a schematic view depicting a third usage example of a sense-of-opening label according to an embodiment of the present invention. FIG. 31D is a schematic view depicting a fourth usage example of a sense-of-opening label according to an embodiment of the present invention. FIG. 31E is a schematic view depicting a fifth usage example of a sense-of-opening label according to an embodiment of the present invention. FIG. 31F is a schematic view depicting a sixth usage example of a sense-of-opening label according to an embodiment of the present invention. FIG. 31G is a schematic view depicting a seventh usage example of a sense-of-opening label according to an embodiment of the present invention. FIG. 31H is a schematic view depicting an eighth usage example of a sense-of-opening label according to an embodiment of the present invention. FIG. 31I is a schematic view depicting a ninth usage example of a sense-of-opening label according to an embodiment of the present invention. Below, with reference to FIGS. 31A to 31I, the above-mentioned sense-of-opening label 166 is described as an example of a sense-of-opening label according to the present invention, and applications for the sense-of-opening label will specifically be described.

Examples of applications in which the sense-of-opening label can be used include, but are not limited particularly to, pharmaceuticals, food items (flavorings, confectionery, supplements, and the like), cosmetics, electronic components, transport boxes, CD cases, and postal envelopes. For example, according to a first usage example depicted in FIG. 31A, the sense-of-opening label 166 can be employed for a medicine bag 190 for encapsulating a pharmaceutical such as a pharmaceutical. Specifically, the sense-of-opening label 166 is of a seal label type, and adhered to the openable portion of the medicine bag 190. In this case, the cut-off line 171 of the sense-of-opening label 166 is preferably positioned so as to be in line with the incision portion 190a for opening the medicine bag 190.

In addition, according to a second usage example depicted in FIG. 31B, the sense-of-opening label 166 can be employed for a wine bottle 191. The sense-of-opening label 166 in this second usage example is of a film label type, and attached to the wine bottle 191 so as to cover the openable portion of the wine bottle 191. According to a third usage example depicted in FIG. 31C, the sense-of-opening label 166 can be employed for a CD case 192. The sense-of-opening label 166 in this third usage example is of a seal label type, and adhered to the opening and closing lid portion of the CD case 192. According to a fourth usage example depicted in FIG. 31D, the sense-of-opening label 166 can be employed for a cosmetic box 193. The sense-of-opening label 166 in this fourth usage example is of a seal label type, and adhered to the opening and closing lid portion of the cosmetic box 193. According to a fifth usage example depicted in FIG. 31E, the sense-of-opening label 166 can be employed for an envelope 194. The sense-of-opening label 166 in this fifth usage example is of a seal label type, and adhered to the openable portion of the envelope 194.

According to a sixth usage example depicted in FIG. 31F, the sense-of-opening label 166 can be employed for a transport box 195. The sense-of-opening label 166 in this sixth usage example is of a seal label type, and adhered to the opening and closing lid portion of the transport box 195. According to a seventh usage example depicted in FIG. 31G, the sense-of-opening label 166 can be employed for a medicine bottle 196. The sense-of-opening label 166 in this seventh usage example is of a seal label type, and adhered to the opening and closing lid portion of the medicine bottle 196. According to an eighth usage example depicted in FIG. 31H, the sense-of-opening label 166 can be employed for a confectionery bag 197. The sense-of-opening label 166 in this eighth usage example is of a film label type, and is integrally formed with the confectionery bag 197 in an aspect in which the sense-of-disconnection device 161 is incorporated in the openable portion. That is, the sense-of-opening label 166 in this eighth usage example is the confectionery bag 197 itself the openable portion of which is the sense-of-disconnection device 161. Such a sense-of-opening label 166 in the eighth usage example preferably has a cut-off line 171 and an incision portion 190*a* formed therein in the same manner as in the first usage example depicted in FIG. 31A. According to a ninth usage example depicted in FIG. 31I, the sense-of-opening label 166 can be employed for a wine bottle 191. The sense-of-opening label 166 in this ninth usage example is of a seal label type, and adhered to the openable portion of the wine bottle 191.

In this regard, FIGS. 31A to 31I depict typical usage examples of the sense-of-opening label 166, but an item (openable article) for which the sense-of-opening label 166 is employed and a position at which the sense-of-opening label 166 is attached are not limited to the above-mentioned ones. In addition, the form of the sense-of-opening label is not limited to either a seal label type or a film label type, but may be any other type.

(Sense-of-Opening System)

Figure 32:
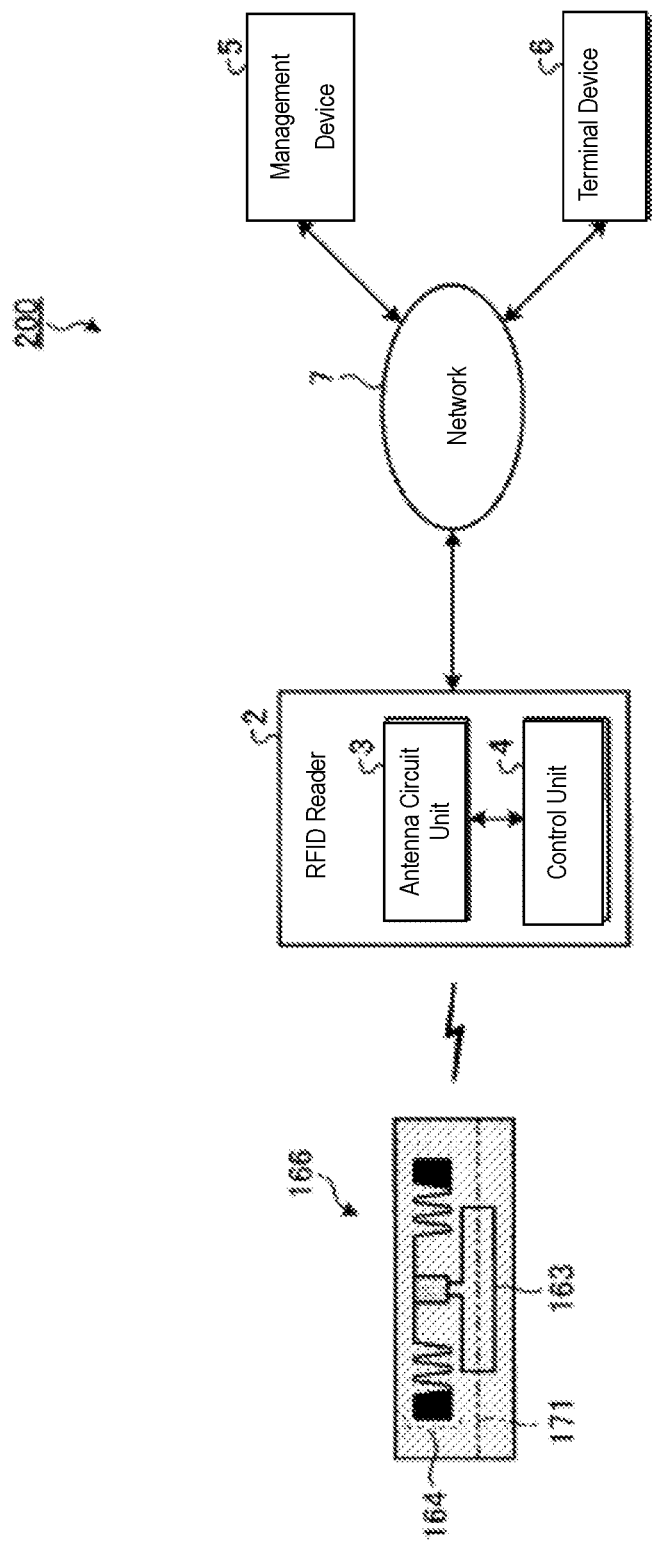
FIG. 32 is a diagram depicting a configuration example of a sense-of-opening system according to an embodiment of the present invention.

Next, a sense-of-opening system configured using a sense-of-opening label according to an embodiment of the present invention will be described. FIG. 32 is a diagram depicting a configuration example of a sense-of-opening system according to an embodiment of the present invention. As depicted in FIG. 32, this sense-of-opening system 200 includes the sense-of-opening label 166 in place of the package 10 of the above-mentioned cavity item management system 1 (see FIG. 26). This sense-of-opening label 166 has a cut-off line 171 positioned in line with the openable portion of an openable article, or is integrally formed with the openable article, although such an openable article is not shown in FIG. 32. The other constituents are the same as those of the above-mentioned cavity item management system 1, and the same configuration parts are indicated by the same reference signs.

In this sense-of-opening system 200, an RFID reader 2 receives information transmitted by a wireless communication device 164 included in the sense-of-opening label 166. This information is information that differs between before and after a conducting wire 163 of the sense-of-opening label 166 is disconnected, that is, information that differs between before and after an openable article (container) which the sense-of-opening label 166 is mounted on or integrally formed with is opened. The RFID reader 2 reads and senses whether this openable article is opened, in accordance with the difference in this received information. The management device 5 receives, from the RFID reader 2 via the network 7, the information sensed by the RFID reader 2 and indicating whether the openable article is opened, and notifies the terminal device 6 of the received sensed information.

As above-mentioned, a pharmaceutical needs to be taken by a patient on schedule as directed by a doctor to maximize the pharmaceutical benefit of the pharmaceutical. In view of this, a supervised administration system for pharmaceuticals will be described below as a specific example of a sense-of-opening system 200 according to an embodiment of the present invention. In cases where a plurality of kinds of pharmaceuticals are prescribed, the plurality of kinds of pharmaceuticals are currently dispensed in one medicine bag 190 for easier supervised administration, as depicted in FIG. 31A, wherein the medicine bag 190 has one dose of pharmaceuticals packaged in one package. As depicted in FIG. 31A, the administration situation can be grasped by reading information from the sense-of-opening label 166 using a reader such as the RFID reader 2, wherein the sense-of-opening label 166 is adhered over the incision portion 190*a* of the medicine bag 190.

Examples of supervised administration systems for pharmaceuticals include such a system as below-mentioned. For example, the RFID reader 2 in a supervised administration system regularly transmits electric waves to the wireless communication device 164 in the sense-of-opening label 166. In response to this, the wireless communication device 164 transmits, to the RFID reader 2, information indicating whether the conducting wire 163 of the sense-of-opening label 166 is cut (that is, whether the medicine bag 190 is opened). The RFID reader 2 reads and senses whether the medicine bag 190 is opened, in accordance with a difference in the information received from the wireless communication device 164. Furthermore, the RFID reader 2 transmits, to the management device 5, the sensed information on whether the medicine bag 190 is opened, and the management device 5 notifies the terminal device 6 of this sensed information. Examples of this management device 5 include data servers and the like. Examples of this terminal device 6 include PCs, mobile phones, smartphones, tablet types of PCs, and the like. In this regard, the management device 5 and the terminal device 6 may be combined in one device.

According to a supervised administration system in a specific example of the present invention, an opened medicine bag 190 is regarded as meaning that a pharmaceutical which was in the bag has been taken. An unopened medicine bag 190 is regarded as meaning that a pharmaceutical has not been administered from the medicine bag. A method of transmitting information from the RFID reader 2 to the management device 5 is not limited to any particular one, but may be carried out using a wireless communication line or a wire communication line for which an electric or optical signal is used. If the management device 5 is installed in a medical or care welfare institution such as a hospital, visiting care facility, visiting nursing facility, or pharmacy, medical personnel and care workers such as doctors, nurses, and pharmacists can use the terminal device 6 to monitor the administration situation of patients. In addition, the management device 5 may be installed in a patient' house, and in this case, the patient's family can use the terminal device 6 to monitor the administration situation of the patient, and can rapidly take action if the patient forgets to take a pharmaceutical.

As above-mentioned, information recorded in the memory circuit of the wireless communication device 164 together with information indicating whether the medicine bag 190 is opened can be transmitted to the RFID reader 2. Specific examples of information recorded in the memory circuit of the wireless communication device 164 include information on a pharmaceutical (the product name, the product number, the one-packaging date, the expiration date, and the like), information on the medicine bag (the unique ID and the like of each medicine bag), information on a patient (the patient ID, the clinical chart number, the name and treatment history of the patient's disease, and the like), information on medical staff (the hospital ID, the doctor ID, the nurse ID, the pharmacist ID, and the like), a patient's history of taking a pharmaceutical, an electronic certificate of a pharmaceutical, and the like. All these pieces of information do not need to be recorded in the memory circuit of the wireless communication device 164. If at least unique information such as ID numbers that identify the medicine bags 190 is individually recorded, other pieces of information can be managed on a data server. In cases where the unique information of the medicine bag 190 is recorded in the memory circuit of the wireless communication device 164, even a memory circuit having a small capacity can cope with such information. Thus, it is preferable that, in a supervised administration system employed with the sense-of-opening label 166 according to the present invention, information indicating whether the medicine bag 190 is opened and unique information of the medicine bag 190 are transmitted from the sense-of-opening label 166 to an external device.

A supervised administration system in the present invention can also be used in a medical institution, and the medicine bag 190 and the RFID reader 2 are installed, for example, on a pharmaceutical cabinet by the side of a bed in a ward. A patient takes a pharmaceutical from the medicine bag 190 at a predetermined time, and then, returns the medicine bag 190 to the pharmaceutical cabinet. On the other hand, the management device 5 and the terminal device 6 are installed, for example, in a nurse station, and thus, information transmitted from the RFID reader 2 enables medical staff to check the pharmaceutical-taking condition of the patient. In this regard, this management device 5 has information registered therein, the information including information on patients, information on prescribed pharmaceuticals, and information on doctors, nurses, and pharmacists in attendance. In addition, this management device 5 transmits a read-out direction to the RFID reader 2 in accordance with registered information on a time at which to take a pharmaceutical.

The management device 5 makes a comparison between the residual amount of the pharmaceutical (that is, the number of the unopened medicine bags 190) transmitted from the RFID reader 2 and the number of the medicine bags 190 that should properly remain. If there is a discrepancy between both the amounts, the management device 5 gives an alarm display or sound to send a notice of the fact to a terminal device 6 held by a medical staff member. This enables a nurse to give compliance instructions to a patient without being much later than a predetermined time at which the patient should take a pharmaceutical. While in a nurse station, a nurse can thus monitor information on whether a patient properly takes a pharmaceutical, and accordingly, the nurse's workload can be alleviated. In addition, an RFID reader 2 having an alarm function can notify a patient if she/he has wrongly taken a pharmaceutical, and it is hoped to maximize a therapeutic effect.

Furthermore, the above-mentioned supervised administration system can be used in a clinical trial for a new pharmaceutical which requires strict supervised administration, and thus, the system can prevent a patient from forgetting to take a pharmaceutical. This results in enabling the pharmaceutical benefit of a new pharmaceutical to be evaluated correctly.

Next, an example in which a supervised administration system in the present invention is used in a home will be described. This supervised administration system does not limit the installation place of the medicine bag 190 and the RFID reader 2 to anywhere. The medicine bag 190 and the RFID reader 2 may be installed at different places as long as information from the sense-of-opening label 166 adhered to the medicine bag 190 can be read by the RFID reader 2. However, in cases where UHF band RFID communication is used to read information from the sense-of-opening label 166 of the medicine bag 190, the medicine bag 190 and the RFID reader 2 are preferably installed (for example, within 5 m from each other) in the same room such as a bedroom or a dining room. In cases where HF band RFID communication is used to read information from the sense-of-opening label 166 of the medicine bag 190, the RFID 2 reader and the medicine bag 190 are preferably installed in proximity (for example, within 50 cm from each other). Examples of the installation position of the RFID reader 2 include the space under a table in a person's house. Placing pharmaceuticals above this RFID reader 2 makes it possible to constantly sense whether the medicine bag 190 is opened.

Figure 33:
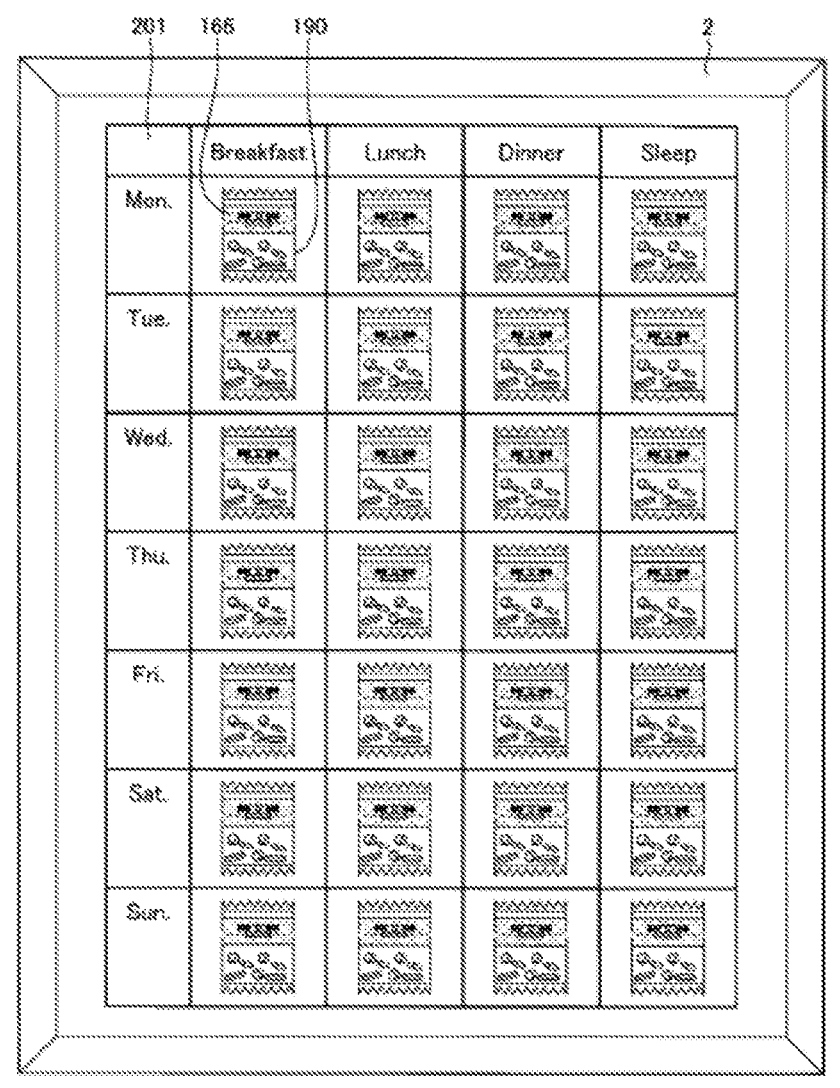

In one aspect, the RFID reader 2 may be integrally formed with a wall-hanging medication calendar. FIG. 33 is a view depicting a specific example of a reader of a sense-of-opening system according to an embodiment of the present invention. As depicted in FIG. 33, the RFID reader 2 has a device body having a wall-hanging structure, and has a medication calendar 201 on the front face of the device body. The medication calendar 201 has, for example, sections in the form of a matrix divided according to combination of the day of the week and the time of the day. Each of the sections of the medication calendar 201 has a medicine bag 190 attached thereto, as depicted in FIG. 33, wherein the medicine bag 190 has the sense-of-opening label 166 adhered to the openable portion. That is, a plurality of medicine bags 190 are sorted, on the medication calendar 201, according to combination of the day of the week and the time zone of the day (for example, combination of each of the days of the week including Monday to Sunday and each of the time zones of the day including breakfast, lunch, dinner, and bedtime). The RFID reader 2 thus reads information from the sense-of-opening label 166 of the medicine bag 190 set in each section of the medication calendar 201, and thereby makes it possible to constantly sense whether each of the medicine bags 190 is opened, wherein the medicine bags 190 are sorted on the medication calendar 201 according to the meal time of the day and the day of the week.

In addition, examples of the management device 5 communicably connected to the RFID reader 2 in the aspect illustrated in FIG. 33 include home PCs, smartphones, tablet types of PCs, and data servers installed in medical and care welfare institutions such as hospitals, visiting care facilities, visiting nursing facilities, and pharmacies. The management device 5 transmits a read-out direction to the RFID reader 2 in accordance with registered information on a time at which to take a pharmaceutical. In response to this, the RFID reader 2 reads, from the wireless communication device 164, information indicating whether the medicine bag 190 on the medication calendar 201 is opened, and transmits the read information (the sensed information on whether the medicine bag 190 is opened) to the management device 5. The management device 5 makes a comparison between information transmitted from the RFID reader 2 (information indicating the quantities of the opened medicine bags 190 and the unopened medicine bags 190) and the quantity that should properly remain in the medicine bags 190. If there is a discrepancy between both these amounts, the management device 5 gives an alarm display or sound to send a notice of the fact to a terminal device 6 held by a family member or a medical staff member. In this manner, a patient can be prompted to take a pharmaceutical. Without visually checking the residual amount in the medicine bag 190, a family member or a medical staff member can thus monitor information on whether a patient is properly taking a pharmaceutical. Because of this, a pharmacist can give compliance instructions to a patient, or propose prescription review to a doctor, if necessary. This results in enabling the load on a family member or a medical staff member to be alleviated as well as allowing the therapeutic effect to be maximized, in cases where a patient and her/his family live in different houses, in cases where a patient is reluctant to show the administration situation of a pharmaceutical to her/his family, and in cases where a patient is treated at home.

By the way, there are recently some reports that fake goods are appearing on the market, wherein the fake goods are fake food and beverages, fake pharmaceuticals, and fake cosmetics, which are different from original products, and packed in containers (openable articles) such as bottles and boxes used for genuine products. To cope with this problem, it is desired to be able to check whether a container of a product is unopened and then judge whether the product in the container is genuine (an authentic product). As illustrated in FIGS. 31A to 31I, a sense-of-opening label according to the present invention is attached to any kind of container of a product or integrally formed with such a container, thus making it possible to judge whether the container is unopened, that is, whether the product in the container is genuine. For example, if a sense-of-opening label according to the present invention is incorporated in a bottle label, distributors and consumers read the sense-of-opening label and check whether the bottle is unopened, and thus, can determine whether the product (for example, an alcohol beverage such as wine) in the bottle is genuine or fake. In addition, attaching a sense-of-opening label according to the present invention to a pharmaceutical container or a cosmetic box makes it possible to determine whether the pharmaceutical or the cosmetic product is genuine or fake. This results in making it possible to contribute to preventing these fake products from creating a health hazard.

INDUSTRIAL APPLICABILITY

As above-mentioned, the package, method of producing a package, reader, and cavity item management system according to the present invention are useful to enhance reliability in sensing whether a cavity item is taken out of a receiving cavity, and are suitable for producing a package, method of producing a package, reader, and cavity item management system which make it possible to sense the opening of a receiving cavity as a result of taking out a cavity item such as a pharmaceutical, even if the receiving cavity is an individually separated one. In particular, the package, method of producing a package, reader, and cavity item management system according to the present invention can very accurately sense the number of the pharmaceuticals taken of the ones received in a pharmaceutical package, and are useful for a package, method of producing a package, reader, and cavity item management system that can enhance reliability in sensing the number of pharmaceuticals taken. Furthermore, the sense-of-disconnection device, sense-of-opening label, and sense-of-opening system according to the present invention are useful for sense of opening of an openable article such as a package bag or a box, and can be employed for sense of opening of all kinds of products (commercial items) such as pharmaceuticals, foods (flavorings, confectionery, supplements, and the like), cosmetics, electronic components, transport boxes, CD cases, and postal envelopes.

REFERENCE SIGNS LIST

1 Cavity Item Management System
2 RFID Reader
3 Antenna Circuit Unit
4 Control Unit
5 Management Device
6 Terminal Device
7 Network
10, 10*a*, 10*b*, 10A Package
11 Sheet
11*a* Metal Foil
11*b*, 21, 81, 92, 102, 112 Substrate
12, 12*a* to 12*d* Antenna
13, 13*a* to 13*d* Connecting Line
14, 14*a* to 14*d* Circuit Unit
15, 15*a* to 15*d* Receiving Cavity
16, 16*a* to 16*d*, 16A to 16H, 16K, 16L Wireless Communication Device
17, 17*a* to 17*d* Cavity Item
18 Package Body
20 Thin Film Transistor
22 Gate Electrode
23 Gate Insulating Layer
24, 84, 95, 105, 108, 115 Semiconductor Layer
25 Source Electrode
26 Drain Electrode
80, 90*a* to 90*c*, 100*a* to 100*c*, 110*a* to 110*c*, 150*a* to 150*c* Word Line
91*a* to 91*c*, 101*a* to 101*c*, 111*a* to 111*c*, 151*a* to 151*c* Bit Line
82, 93, 103, 113 Third Electrode
83, 94, 104, 114 Insulating Layer
85, 96, 106, 116 First Electrode
86, 97, 107, 117 Second Electrode
118 First Insulating Layer
119 Second Insulating Layer
141, 141A to 141H, 141K to 141N Memory Unit
142 Power Generation Unit
143, 143A, 143B Communication Circuit
144 Demodulation Circuit
145, 145A, 145B Modulation Circuit
146 Control Circuit
800, 9001 to 9009, 10001 to 10009, 11001 to 11009, 15001 to 15009 Memory Element
801, 802, 901, 902, 1001, 1002, 1101, 1102, 1103, 1501, 1502 Peripheral Circuit
900, 1000, 1100, 1500 Memory Array
1201 Switch Circuit
1202, 1203 Resistance Element 1300, 13001, 13002 Flip Flop Circuit
160 Substrate
161, 161a to 161d Sense-of-disconnection Device
162 Sense-of-disconnection Device Sheet
163, 163a to 163d Conducting Wire
164, 164a to 164d Wireless Communication Device
165 Exfoliate Paper
166, 166a to 166d Sense-of-opening Label
167 Sticking Layer
168 Adhesion Layer
169 Surface Sheet
170a, 170b Waste Matrix
171 Cut-off Line
180, 180A Sense-of-opening Label Sheet
181a, 181b, 182a to 182h Sheet Portion
185 Covering Member
190 Medicine Bag
190a Incision
191 Wine Bottle
192 CD Case
193 Cosmetic Box
194 Envelope
195 Transport Box
196 Medicine Bottle
197 Confectionery Bag
200 Sense-of-opening System
201 Medication Calendar
F1 First Direction
F2 Second Direction

The invention claimed is:

1. A package, comprising:
a package body including a receiving cavity for receiving a cavity item;
a sheet sealing said receiving cavity;
a conducting wire formed on said sheet so as to pass above an opening portion of said receiving cavity, said opening portion being sealed; and
a wireless communication device formed on said sheet so as to be connected to said conducting wire, wherein said wireless communication device transmits a signal including information which differs between before and after said conducting wire together with said sheet is cut as a result of opening said receiving cavity,
wherein said wireless communication device has a memorizing method;
wherein said memorizing method has at least one memory element;
wherein said conducting wire is connected to said memory element;
wherein said information is read out of said memory element in such a manner that said information differs between before and after said conducting wire is cut; and
wherein said conducting wire comprises a bit line connected to at least one said memory element.

2. The package according to claim 1,
wherein said package body has a plurality of said receiving cavities;
wherein said conducting wire is formed on said sheet so as to correspond to each of said plurality of said receiving cavities; and
wherein at least one said wireless communication device is formed on said sheet.

3. The package according to claim 1,
wherein said package body has a plurality of said receiving cavities; and
wherein said conducting wires and said wireless communication devices are each formed on said sheet so as to correspond to each of said plurality of said receiving cavities.

4. The package according to claim 1,
wherein said wireless communication device has a modulation circuit;
wherein said conducting wire is connected to said modulation circuit; and
wherein said signal including information is modulated by said modulation circuit in such a manner that said information differs between before and after said conducting wire is cut.

5. The package according to claim 4,
wherein said modulation circuit comprises:
a switch circuit; and
a plurality of resistance elements connected to said switch circuit;
wherein said conducting wire is connected to at least one of said plurality of resistance elements.

6. The package according to claim 5,
wherein said switch circuit comprises a transistor having a semiconductor layer; and
wherein said semiconductor layer contains a carbon nanotube composite in which a conjugated polymer is adhered to at least a part of the surface of a carbon nanotube.

7. A package, comprising:
a package body including a receiving cavity for receiving a cavity item;
a sheet sealing said receiving cavity;
a conducting wire formed on said sheet so as to pass above an opening portion of said receiving cavity, said opening portion being sealed; and
a wireless communication device formed on said sheet so as to be connected to said conducting wire, wherein said wireless communication device transmits a signal including information which differs between before and after said conducting wire together with said sheet is cut as a result of opening said receiving cavity,
wherein said wireless communication device has a memorizing method;
wherein said memorizing method has a memory array formed by arranging a plurality of memory elements;
wherein said conducting wire is connected to at least one of said plurality of memory elements; and
wherein said information is read out of said memory array in such a manner that said information differs between before and after said conducting wire is cut.

8. The package according to claim 7, wherein said memory array comprises:
a plurality of first wires;
at least one second wire intersecting said plurality of first wires; and
said plurality of memory elements which are each provided so as to correspond to each of the intersections between said plurality of first wires and said at least one second wire and which each have: a first electrode and a second electrode which are spaced from each other; a third electrode connected to one of said at least one second wire; and an insulating layer electrically insulating said first electrode and said second electrode from said third electrode;
wherein one of said first electrode and said second electrode is connected to one of said plurality of first wires;

wherein at least one of said plurality of memory elements has a semiconductor layer in a region between said first electrode and said second electrode;

wherein said plurality of memory elements are composed of memory elements of two different kinds having different inter-electrode electrical characteristics of the first electrode and the second electrode; and wherein information recorded in said memory array is determined by an arrangement obtained by any combination of said memory elements of two kinds.

9. The package according to claim 8, wherein, of said memory elements of two kinds, the memory element(s) of one kind has/have said semiconductor layer, and the memory element(s) of the other kind does/do not have said semiconductor layer; and wherein said memory element(s) of one kind and said memory element(s) of the other kind each record information which differs between each other according to whether said memory elements of two kinds each have the semiconductor layer.

10. The package according to claim 8, wherein said semiconductor layer contains one or more selected from the group consisting of carbon nanotubes, graphene, and fullerene.

11. The package according to claim 8, wherein said semiconductor layer contains a carbon nanotube composite in which a conjugated polymer is adhered to at least a part of the surface of a carbon nanotube.

12. A method of producing a package including: a package body having at least one receiving cavity for receiving a cavity item; and a sheet sealing said at least one receiving cavity; said method comprising:

a functional portion formation step wherein a conductive wire and at least one wireless communication device are formed on a substrate constituting said sheet, wherein said conducting wire passes above an opening portion of said receiving cavity, said opening portion being sealed, and wherein said wireless communication device is connected to said conducting wire and transmits a signal including information which differs between before and after said conducting wire together with said sheet is cut as a result of opening said receiving cavity; and an adhering step wherein said sheet is adhered to said package body in such a manner that said receiving cavity of said package body is sealed by the adhered sheet, wherein said package body has said cavity item received in said receiving cavity, and wherein said sheet has at least one said conducting wire and said at least one wireless communication device formed on said substrate, wherein said wireless communication device has a memory array including, on said substrate, a plurality of first wires, at least one second wire intersecting said plurality of first wires, and a plurality of memory elements which are each provided to correspond to each of the intersections between said plurality of first wires and said at least one second wire;

wherein said plurality of memory elements each have: a first electrode and a second electrode which are spaced from each other; a third electrode connected to one of said at least one second wire; and an insulating layer electrically insulating said first electrode and said second electrode from said third electrode;

wherein, in said functional portion formation step, a coating layer is formed, by a coating method, in a region between said first electrode and said second electrode in at least one of said plurality of memory elements, and said memory arrays having recorded information which differs between/among said plurality of said receiving cavities are each produced for each of said plurality of said wireless communication devices; and wherein said coating method is one selected from the group consisting of an inkjet method, a dispenser method, and a spray method.

13. A sense-of-disconnection device, comprising:

a conducting wire formed on a substrate: and a wireless communication device formed on said substrate so as to be connected to said conducting wire, wherein said wireless communication device transmits a signal including information which differs between before and after said conducting wire is cut;

wherein said wireless communication device has a memorizing method;

wherein said memorizing method has a memory array formed by arranging a plurality of memory elements;

wherein said conducting wire is connected to at least one of said plurality of memory elements;

wherein said information is read out of said memory array in such a manner that said information differs between before and after said conducting wire is cut;

wherein said memory array comprises:

a plurality of first wires;

at least one second wire intersecting said plurality of first wires; and said plurality of memory elements which are each provided so as to correspond to each of the intersections between said plurality of first wires and said at least one second wire and which each have: a first electrode and a second electrode which are spaced from each other;

a third electrode connected to one of said at least one second wire; and an insulating layer electrically insulating said first electrode and said second electrode from said third electrode;

wherein one of said first electrode and said second electrode is connected to one of said plurality of first wires;

wherein at least one of said plurality of memory elements has a semiconductor layer in a region between said first electrode and said second electrode;

wherein said plurality of memory elements are composed of memory elements of two different kinds having different inter-electrode electrical characteristics of the first electrode and the second electrode; and wherein information recorded in said memory array is determined by an arrangement obtained by any combination of said memory elements of two kinds.

14. A sense-of-opening label, comprising:

a sense-of-disconnection device according to claim 13;

wherein said sense-of-disconnection device is configured to be attached to an openable article; and wherein said conducting wire together with said substrate is cut as a result of opening said openable article.

15. A package, comprising:

a package body including a receiving cavity for receiving a cavity item;

a sheet sealing said receiving cavity;

a conducting wire formed on said sheet so as to pass above an opening portion of said receiving cavity, said opening portion being sealed; and a wireless communication device formed on said sheet so as to be connected to said conducting wire, wherein said wireless communication device transmits a signal including information which differs between before and after said conducting wire together with said sheet is cut as a result of opening said receiving cavity, wherein said wireless communication device has a modulation circuit;

wherein said conducting wire is connected to said modulation circuit;

wherein said signal including information is modulated by said modulation circuit in such a manner that said information differs between before and after said conducting wire is cut; and wherein said modulation circuit comprises:
 a switch circuit; and
 a plurality of resistance elements connected to said switch circuit;

wherein said conducting wire is connected to at least one of said plurality of resistance elements.

* * * * *